(12) United States Patent
Landenbach et al.

(10) Patent No.: US 9,471,483 B2
(45) Date of Patent: Oct. 18, 2016

(54) ELECTRONIC APPARATUS HAVING NON-VOLATILE MEMORY AND METHOD FOR CONTROLLING THE SAME

(75) Inventors: Richard Landenbach, Erzhausen (DE); Marc Willam, Frankfurt am Main (DE); Hartmut Sturm, Germering (DE); Kai Dieffenbach, Egelsbach (DE)

(73) Assignee: FUJITSU SEMICONDUCTOR EUROPE GMBH, Langen (DE)

( * ) Notice: Subject to any disclaimer, the term of this patent is extended or adjusted under 35 U.S.C. 154(b) by 680 days.

(21) Appl. No.: 13/812,461

(22) PCT Filed: Jul. 26, 2011

(86) PCT No.: PCT/EP2011/062838
§ 371 (c)(1),
(2), (4) Date: May 3, 2013

(87) PCT Pub. No.: WO2012/013683
PCT Pub. Date: Feb. 2, 2012

(65) Prior Publication Data
US 2013/0219110 A1 Aug. 22, 2013

(30) Foreign Application Priority Data
Jul. 28, 2010 (EP) ..................................... 10171110

(51) Int. Cl.
*G06F 12/02* (2006.01)
*G11C 16/10* (2006.01)
(Continued)

(52) U.S. Cl.
CPC ......... *G06F 12/0246* (2013.01); *G11C 16/102* (2013.01); *G11C 16/105* (2013.01);
(Continued)

(58) Field of Classification Search
CPC ................. G06F 3/0608; G06F 3/064; G06F 2212/7207
See application file for complete search history.

(56) References Cited

U.S. PATENT DOCUMENTS 5,491,806 A * 2/1996 Horstmann et al. .......... 711/207
5,928,370 A * 7/1999 Asnaashari ..................... 714/48
(Continued)

FOREIGN PATENT DOCUMENTS

DE 41 43 072 A1 7/1992
DE 103 21 104 A1 11/2004
(Continued)

OTHER PUBLICATIONS

International Search Report, PCT/EP2011/062838, dated May 12, 2011.
(Continued)

*Primary Examiner* — Charles Rones
*Assistant Examiner* — Tian-Pong Chang
(74) *Attorney, Agent, or Firm* — Arent Fox LLP

(57) ABSTRACT

Electronic apparatus, comprising: non-volatile memory configured to be written to or read from in memory portions which are erased a sector at a time, each said sector comprising a plurality of said portions, and the memory having at least three said sectors each of which is adapted to be erased independently of the others; and control means operable to control erasing of the sectors, wherein: the control means is configured to store in a plurality of the sectors other than a target said sector erasure information concerning an erasure procedure, the erasure procedure involving erasing the target sector, so that such information in the sectors may be inspected to establish a suitable recovery procedure following an interruption event.

29 Claims, 26 Drawing Sheets

(51) Int. Cl.
*G11C 16/14* (2006.01)
*G11C 16/16* (2006.01)
*G06F 3/06* (2006.01)

(52) U.S. Cl.
CPC ............. *G11C 16/14* (2013.01); *G11C 16/16* (2013.01); *G06F 3/064* (2013.01); *G06F 3/0608* (2013.01); *G06F 2212/7207* (2013.01)

(56) References Cited

U.S. PATENT DOCUMENTS

| | | | |
|---|---|---|---|
| 7,058,755 | B2 | 6/2006 | Nallapa |
| 7,406,558 | B2 | 7/2008 | Przybylek |
| 8,819,375 | B1* | 8/2014 | Pruett .................... G06F 13/28 707/693 |
| 2002/0085433 | A1* | 7/2002 | Tomori et al. ................ 365/200 |
| 2002/0188814 | A1* | 12/2002 | Saito et al. .................. 711/159 |
| 2005/0055496 | A1 | 3/2005 | Nallapa |
| 2005/0078528 | A1* | 4/2005 | Tsang et al. ............. 365/185.29 |
| 2005/0144362 | A1 | 6/2005 | Lin et al. |
| 2007/0016721 | A1 | 1/2007 | Gay |
| 2007/0143528 | A1 | 6/2007 | Przybylek |
| 2009/0198902 | A1 | 8/2009 | Khmelnitsky et al. |
| 2009/0313453 | A1 | 12/2009 | Stefanus et al. |
| 2010/0005270 | A1* | 1/2010 | Jiang ............................ 711/206 |
| 2011/0161560 | A1* | 6/2011 | Hutchison et al. ........... 711/103 |
| 2011/0161562 | A1* | 6/2011 | Chang ................. G06F 11/1004 711/103 |

FOREIGN PATENT DOCUMENTS

| | | |
|---|---|---|
| EP | 1 702 339 B1 | 9/2006 |
| WO | 2004/001605 A1 | 12/2003 |
| WO | WO 2004/064072 A3 | 7/2004 |
| WO | WO 2005/024842 A1 | 3/2005 |
| WO | WO 2005/055244 A1 | 6/2005 |

OTHER PUBLICATIONS

Jun. 3, 2015 Office Action issued in Chinese Patent Application No. 201180046649.1.

May 27, 2015 Office Action issued in European Patent Application No. 11748605.0.

* cited by examiner

| | PAGE ID | VALID? | AVAILABLE? | SECTOR | PAGE SLOT |
|---|---|---|---|---|---|
| | 1 | YES | YES | 1 | 30 |
| PAGE RANGE (62) | ⋮ | ⋮ | ⋮ | ⋮ | ⋮ |
| | 100 | NO | YES | 3 | 2 |

ELECTRONIC APPARATUS HAVING NON-VOLATILE MEMORY AND METHOD FOR CONTROLLING THE SAME

CROSS-REFERENCED TO RELATED APPLICATION

This application is a National Stage entry of International Application PCT/EP2011/062838, filed Jul. 26, 2011, which claims priority to European Patent Application No. 10171110.9, filed Jul. 28, 2010, the disclosure of the prior application(s) are hereby incorporated in their entirety by reference.

The present invention relates to electronic apparatuses, for example to computing apparatuses such as microcontrollers. Such apparatuses may be susceptible to interruption events such as power-off events.

Microcontrollers are typically embedded in other systems, such as automobiles, telephones, appliances, machinery, robots, and peripherals for computer systems, to provide local control. As such, a microcontroller may be considered to be a self-contained system, and typically has a processor, memory and peripherals. The functionality of a programmed microcontroller may of course be achieved equivalently with hardware, not having a processor executing code. Programmable microcontrollers are often preferred in view of their versatility.

While some embedded systems are very sophisticated, many have minimal requirements for memory and program length, with no operating system, and low software complexity. Typical input and output devices include switches, relays, solenoids, LEDs, small or custom LCD displays, RF (radio frequency) devices, and sensors (e.g. for sensing temperature, humidity, or light level).

Embedded systems usually have no keyboard, screen, disks, printers, or other recognizable I/O devices of a personal computer, and may lack human-interaction devices of any kind. The present invention may be employed in such embedded systems as well as in systems having human-interaction devices.

It will be appreciated that microcontrollers are just one type of computing apparatus, advantageous in embedded applications. The present invention may extend to other types of electronic apparatus, such as microprocessors, as typically used in personal computers, or to other more general-purpose electronic apparatuses.

As is well known, microcontrollers are a type of small electronic apparatus typically provided on a single integrated circuit. Both volatile and non-volatile memories may be provided. Program memory in the form of flash memory (e.g. NOR flash memory) is often included on chip, as well as some RAM (random access memory). It will be appreciated that both volatile and non-volatile memory may be provided off-chip as well as, or instead of, on-chip memory, and the present disclosure will be interpreted accordingly.

Microcontrollers may be predominantly digital devices, or may for example be mixed-signal devices, integrating analogue components needed to control non-digital electronic systems. Computing apparatuses, such as microcontrollers, may for example comprise DAC (digital-to-analogue converter) and/or ADC (analogue-to-digital converter) components.

In many microcontroller systems, there is a need to store run-time data in non-volatile memory. This data can comprise a large number of data blocks of different sizes, which are changed (created, updated, deleted) with different frequency at different times. A random-access EEPROM (electrically-erasable programmable read-only memory) is perhaps well-suited for this need.

However, microcontrollers typically contain flash memory instead of random-access EEPROM, since it is cheaper at comparable memory size and easier to integrate.

Flash memory is a non-volatile computer storage technology that can be electrically erased and reprogrammed. It is often used in memory cards, USB flash drives, and solid-state drives for general storage and transfer of data between computers and other digital products. Since flash memory is non-volatile, no power is needed to maintain stored information. In addition, flash memory offers fast read-access times and good kinetic shock resistance.

Flash memory is a specific type of EEPROM. Although technically a type of EEPROM, the term "EEPROM" is generally used to refer specifically to non-flash EEPROM which is erasable in very small portions or blocks, typically bytes.

Like all EEPROM, flash memory can be written to in relatively small portions of data, called pages (these pages are usually of word size for the particular memory, and should not be confused with the virtual pages described later herein). Unlike random-accessible EEPROM, the pages cannot be erased independently, but have to be erased as sectors consisting of a large number of pages. For a direct mapping to blocks of non-volatile data these sectors are usually of too large a size and of insufficient count.

Efforts have been made to emulate the ability of random-accessible EEPROM in flash memory, by storing multiple blocks multiple times to few large sectors. The resultant flash memory system may be referred to as a virtual EEPROM memory.

In order to erase a flash sector, it has been realised that a copy of the contents of the virtual EEPROM corresponding to that flash sector needs to be stored in some other memory. If the contents of the virtual EEPROM are to be safe against sudden power off during erase, for example a momentary disconnection from power supply rails, at least one copy of them needs to be stored to flash memory at all times.

Therefore it has been determined that at least two flash sectors are needed, so that one sector can be erased while the data is stored to one or more other sectors. It has been determined that EEPROM emulation may be carried out using either two identical sectors, or two identical sets of sectors that are used/erased in alternating order.

Since the contents of the virtual EEPROM are stored to one or more of several sectors, it has been determined that the emulation system needs to know on which sector the most recent copy of the particular data is stored. This information cannot be stored on the virtual memory, since it is needed prior to the first read attempt to the virtual memory. Means for this purpose include flags or magic-words on the sectors that identify the state of the sector that contains the flags. As another option, sectors may be identified by an increasing index.

There are different ways to distribute data. For example, all virtual data of the emulation may be stored to exactly one sector at a time, or it may be distributed across more than one sector.

It has been determined that the allocation of physical memory on a sector to virtual memory may be achieved by two different methods. The first is a static relation, i.e. a specific range of virtual memory is stored in a dedicated range of physical memory or a specific range of physical memory is dedicated to a specific subset of virtual memory. The second is a dynamic relation with the use of association tables. This method allocates physical memory to virtual memory during run time and stores the relation in a table. In this case, the physical memory can be occupied by any virtual memory. The physical location of each individual association within the table may also be dynamic.

It has been determined that dynamic allocation may be combined with static allocation by storing all virtual data in a block of static allocated memory and then adding small changes in a dynamically allocated list.

In order to stay safe against sudden power off during write or erase, for example due to disconnection from a voltage source, it has been determined that the following sequence is useful: (1) mark that the operation was started; (2) perform the operation; and (3) then mark that the operation has finished. If an operation is found as started but not finished during read out, it can be considered to have failed because of sudden power off or some other interruption event. The affected data may then be ignored.

A block of virtual data that is stored to a dynamically allocated range of physical memory may be looked up from an association table. Since the position of each association within an association table may not be known a priori, the table may need to be scanned for the valid entries. This may be done beginning from the latest entry towards the earliest entry to find the latest entry that fits the association.

Erroneous data on non-volatile memory has far more drastic consequences than errors in volatile data. This is because the data is unlikely to be recovered by a reset of the controller, for example by a watchdog (e.g. hardware that must be triggered periodically to prevent a reset). Therefore, non-volatile data is usually protected from minor bit errors by redundancy codes.

Unfortunately, redundancy codes are insufficient to detect whether erasing or writing to flash memory was interrupted by a sudden power off or other similar interruption event, since the affected bits would be in an unpredictable state. This may be done by flags stored to a memory cell indicating the state of some other memory cell.

Erasing a flash sector takes a long time and leaves a large range of memory in an unpredictable state if interrupted by a power off. Hence the risk of reading corrupted data from a flash sector that was incompletely erased is high.

It is desirable to solve the above problems, and to provide improved electronic apparatuses. It is desirable to provide electronic apparatuses with reduced susceptibility to errors due to interruption events. It is desirable to protect non-volatile data against such corruption.

It is desirable to improve safety against power off or safety against interruption by power off. There are two main error cases that can affect the virtual data in case a flash write or erase operation is interrupted by a power off, namely data loss and data corruption.

Both of these error cases can be moderated by returning the data to the previous legal value—a value that was not lost or corrupted. Therefore, it is desirable to detect data loss or data corruption. It is also desirable to maintain one legal value until corresponding new data becomes legal.

Put another way, it is desirable for data loss or data corruption that was caused by incompletely performed flash write or flash erase operations to be deterministically detected and for the incomplete or corrupted data to be ignored. It is also desirable for the previous legal value of any data to be preserved in flash memory until the new value is completely written, and for the newest and only the newest legal value to be considered to be the current "virtual" data.

(A1) According to a first aspect of the present invention, there is provided electronic apparatus, comprising: non-volatile memory configured to be written to or read from in memory portions which are erased a sector at a time, each said sector comprising a plurality of said portions, and the memory having at least three said sectors each of which is adapted to be erased independently of the others; and control means operable to control erasing of the sectors, wherein: the control means is configured to store in a plurality of the sectors other than a target said sector erasure information concerning an erasure procedure, the erasure procedure involving erasing the target sector, so that such information in the sectors may be inspected to establish a suitable recovery procedure following an interruption event.

Such an interruption event, for example a power-off, may occur during the erasure procedure. The present electronic apparatus advantageously enables such an interruption event to be recovered from in a robust manner.

The memory portions may be small memory portions, for example bits, bytes, words, pages. The non-volatile memory may be configured such that it may only be erased a sector at a time, each sector erasure effectively being a single action.

The electronic apparatus may for example be computing apparatus having a processor, or may be hardware not having a processor. The apparatus may be part of a micro-controller, or may be a microcontroller. For example, the control means may be part of a microcontroller and the memory may be external memory to the microcontroller. The apparatus may include other parts of a microcontroller, for example input/output ports and peripherals.

The memory may be written to one memory portion at a time. The memory may for example be flash memory, for example NOR flash memory.

The plurality of sectors may constitute a majority of the sectors, for example to enable a majority decision to be made. The plurality of sectors may constitute all of the sectors other than the target sector.

The memory may have at least four sectors.

The control means may be operable, for the erasure procedure, to store the erasure information in all of the sectors. For example, such erasure information may be stored in all of the sectors when preparing to erase the target sector, and erasure information may be stored in all of the sectors other than the target sector, following erasure of the target sector, to indicate that the target sector has been erased.

The control means may be operable, for the erasure procedure, to store the erasure information to the sectors concerned in a given order. The same order may be adopted for each erasure procedure, for example so that information need not be stored on an erasure-procedure basis to identify the order employed.

The control means may be operable, for the erasure procedure, to store the same erasure information in the sectors concerned. Advantageously, this may enable the erasure information in the different sectors to be easily compared, and for differences (useful for deducing that different recovery procedures are required) to be detected.

The erasure information may itself identify the target sector, or some other information may identify the target sector. The erasure information may (also) indicate a status of the erasure procedure. The erasure information may identify the target sector and/or a status of the erasure procedure. For example, the erasure information in each sector concerned may identify whether the erasure procedure has been started and whether it has been finished. Discrepancies between erasure information in different sectors may therefore enable the states of the sectors (and thus suitable recovery procedures) to be deduced. The erasure information may be stored in an area of the memory reserved for such erasure information. The erasure information may be information other than or additional to data stored in data pages.

The control means may be operable to store such erasure information before carrying out the erasing, that erasure information indicating that the erasing is yet to be carried out. Such information may usefully enable it to be determined that an erasure procedure has been started (at least partly).

Similarly, the control means may be operable to store such erasure information after carrying out the erasing, that erasure information indicating that the erasing has been carried out. Such information may usefully enable it to be determined that an erasure procedure has been finished (at least partly).

The control means may be operable, following the erasing, to update the erasure information stored in sectors other than the target sector before carrying out said erasing to indicate that the erasing has been carried out. That is, the erasure information may be changed.

The control means may be configured, in storing such erasure information before carrying out the erasing, to identify the target sector through storage of an n-bit targeting pattern of information in a specific area of each of the sectors concerned, those areas being associated with the target sector.

The control means may be configured, in storing such erasure information before carrying out the erasing, to identify a particular sector as being a sector other than the target sector through storage of an n-bit non-targeting pattern of information in a specific area of each of the sectors concerned, those areas being associated with the particular sector.

The control means may be configured, in storing such erasure information before carrying out the erasing, to indicate that the target sector has not yet been erased through storage of an n-bit unfinished pattern of information in a specific area of each of the sectors concerned, those areas being for indicating whether or not the erasing has been carried out.

The control means may be configured, in storing such erasure information after carrying out the erasing, to indicate that the target sector has been erased through storage of an n-bit finished pattern of information in a specific area of each of the sectors concerned, those areas being for indicating whether or not the erasing has been carried out.

The value of n may be equal to 1, or it may be greater than 1. The value of n may be greater than or equal to $2m+1$, where m is a positive integer (natural number).

The bits of the targeting pattern may all have the same logic value, for simplicity in implementation. The bits of the non-targeting pattern may also all have the same logic value, for example the opposite value to those of the targeting pattern, again for simplicity in implementation. Similar considerations may apply to the finished and unfinished patterns. The finished and targeting patterns may be the same as one another. The unfinished and non-targeting patterns may be the same as one another. Of course, more complicated patterns may be adopted.

Where n is greater than 1, and optionally greater than or equal to $2m+1$, where m is a positive integer (natural number), the control means may be configured to treat such an n-bit pattern read from the memory as being a targeting pattern if a majority of the bits concerned match the targeting pattern, or as being a non-targeting pattern if a majority of those bits match the non-targeting pattern, or as being an unfinished pattern if a majority of those bits match the unfinished pattern, or as being a finished pattern if a majority of those bits match the finished pattern. Such a majority decision may advantageously allow the apparatus to cope with corruption of the bit values. For example, where n is greater than or equal to $2m+1$, the apparatus may be able to cope with corruption of m bits per pattern.

The value n may be same value for each said pattern, for simplicity of implementation. The value n may be different from pattern to pattern, or one pattern may have a different value of n from another, leading to a more complicated implementation. Such complicated implementations are envisaged.

The storing discussed above may comprise writing to the memory. Such storing may comprise changing a value already present in the memory, or leaving a value already stored in the memory unchanged (perhaps by re-writing that value), as appropriate given the pattern to be stored.

The control means may be operable to cause the target sector to be completely erased during the erasure procedure.

For certain types of memory, the erasing may involve writing all of the bits of the target sector to a written state before erasing them (the all of the bits) to an erased state.

The erasure procedure may comprise targeting a sector for erasure, storing such erasure information identifying the target sector, erasing the target sector, and (then) storing (in sectors other than the target sector) such erasure information indicating that the erasing has been carried out. The erasure procedure may be preceded by cleaning up the target sector, which may involve copying needed data to another sector, for example the oldest sector with sufficient space. If such data is stored in pages, the copying may be done page by page.

The control means may be operable to access the erasure information stored in the sectors following an interruption event, and to establish a suitable recovery procedure following the interruption event in dependence upon that accessed information.

For example, the control means may be configured to abort the erasure procedure following an interruption event if the accessed information indicates that two or more of the sectors are the target sector.

For example, the control means may be operable, in dependence upon the access, to determine that no recovery procedure is required when none of the sectors stores erasure information identifying a particular sector as the target sector for erasing. This may indicate that the interruption occurred before or after a complete erasure procedure.

As another example, the control means may be operable, in dependence upon the access, to determine that part or all of the erasure procedure is to be repeated as the recovery procedure when the accessed erasure information of at least one of the sectors identifies a particular sector as the target sector for erasing and at least two of the sectors do not store erasure information identifying a particular sector as the target sector for erasing. This may indicate that the interruption occurred before writing of all desired erasure information, pre or post erasing, was completed.

In this regard, the control means may be operable to determine that at least the erasing of the erasure procedure is to be repeated as the recovery procedure when an access of the target sector reveals that it is not in a fully erased state. This may indicate that the interruption occurred before writing of all desired erasure information, before the actual erasing.

Similarly, the control means may be operable to determine that the erasure information stored in the sectors is to be updated as the recovery procedure to indicate that the erasing has been carried out when an access of the target sector reveals that it is in a fully erased state. This may indicate that the interruption occurred before writing of all desired erasure information, after the actual erasing.

As another example, the control means may be operable, in dependence upon the access, to determine that at least the erasing of the erasure procedure is to be repeated as the recovery procedure when the accessed erasure information of at least said plurality of the sectors (other than the target sector) identifies a particular sector as the target sector for erasing. This may indicate that the writing of all desired erasure information (before the actual erasing) was completed, but that the actual erasing was interrupted.

The control means may be operable, when writing desired data to one of the sectors as part of a write procedure, to mark that sector to indicate that the write procedure has begun, to write the desired data to that sector, and then to mark that sector to indicate that the write procedure has been finished. This may enable the status of write procedures to be determined following an interruption event.

The electronic apparatus may be part of or even be a microcontroller.

According to a second aspect of the present invention, there is provided an automobile (or an industrial robot, or machinery) comprising electronic apparatus according to the aforementioned first aspect of the present invention, the apparatus being configured to control a system of the automobile.

According to a third aspect of the present invention, there is provided a method of controlling electronic apparatus, the apparatus comprising non-volatile memory configured to be written to or read from in memory portions which are erased a sector at a time, each said sector comprising a plurality of said portions, and the memory having at least three said sectors each of which is adapted to be erased independently of the others, the method comprising: storing in a plurality of the sectors other than a target said sector erasure information concerning an erasure procedure, the erasure procedure involving erasing the target sector, so that such information in the sectors may be inspected to establish a suitable recovery procedure following an interruption event.

According to a fourth aspect of the present invention, there is provided a program which when executed on a processor of electronic apparatus controls the apparatus according to a control method, the apparatus comprising non-volatile memory configured to be written to or read from in memory portions which are erased a sector at a time, each said sector comprising a plurality of said portions, and the memory having at least three said sectors each of which is adapted to be erased independently of the others, the method comprising: storing in a plurality of the sectors other than a target said sector erasure information concerning an erasure procedure, the erasure procedure involving erasing the target sector, so that such information in the sectors may be inspected to establish a suitable recovery procedure following an interruption event.

(B1) According to a fifth aspect of the present invention, there is provided electronic apparatus, comprising: memory configured to be written to or read from in memory portions which are erased a sector at a time, the or each said sector comprising a plurality of said portions, each said sector having a plurality of page slots made up of one or more of said portions, and each page slot being for storing a page of data; and control means operable to monitor the or each said sector and to store, (on the fly) in dependence upon such monitoring, the next page of data for storage to the next available page slot.

This form of dynamic writing may render the memory flexible and efficient.

The phrase "on the fly" may be considered to mean "dynamically" or "during operation" or "on demand", or "extemporaneously" or "as the next page of data for storage becomes available" or "without prior arrangement". Thus, "on the fly in dependence upon such monitoring" could mean "based on the current usage/availability of the page slots".

The memory portions may be small memory portions, for example bits, bytes, words, pages. The memory may be configured such that it may only be erased a sector at a time, each sector erasure effectively being a single action.

The electronic apparatus may for example be computing apparatus having a processor, or may be hardware not having a processor. The apparatus may be part of a microcontroller, or may be a microcontroller. For example, the control means may be part of a microcontroller and the memory may be external memory to the microcontroller. The apparatus may include other parts of a microcontroller, for example input/output ports and peripherals.

The memory may be written to one memory portion at a time. The memory may for example be non-volatile memory, such as flash memory (for example NOR flash memory).

The memory may be arranged to have a plurality of said sectors (two, three, or more), although it may also have only one sector.

The control means may be operable to monitor the statuses of data pages stored in the page slots. Such statuses could comprise whether the data pages stored in the page slots are valid or invalid.

In cases where the memory comprises a plurality of the sectors, the control means may be operable to monitor the ages of the sectors, the age of a particular sector being equal to the number of times the other sector or sectors have been erased since the particular sector was last erased.

The control means may be operable to store an identification table (which may more generally be referred to as a data structure) in each of the sectors, each identification table including an erasure-information entry per erasure procedure erasing another said sector, and the control means may be operable to determine the ages of the sectors based upon the number of entries in their respective identification tables. This may be a simple and efficient way of tracking the ages of the sectors, since the entries may have more than one purpose (for example, for detailing the statuses of erasure procedures, and for determining the ages of sectors).

The control means may be operable on the fly to write data pages to the sectors and to target a sector for an erasure procedure when one or more given (e.g. predetermined) conditions are met.

One given condition for targeting a particular sector may be that its identification table has a shortage of free entries. A shortage of free entries may exist when the number of free entries is less than or equal to the number of other said sectors that are older than the particular sector.

Another given condition for targeting a particular sector may be that the memory has a shortage of free page slots and the particular sector has less than a given number of needed data pages stored therein. For example, the particular sector may have less needed data pages than the number of free page slots.

Another given condition for targeting a particular sector may be that the memory has a shortage of free page slots and the particular sector has the least number of needed data pages stored therein.

The control means may be operable, if more than one said sector meets a given condition, to target the oldest one of those sectors for an erasure procedure.

The control means may be operable before each erasure procedure to copy any needed data pages from the target sector concerned to another sector. This may ensure that all needed pages (which may be valid or invalid) remain stored in the memory.

The control means may be operable to store new data pages to the oldest said sector which has sufficient free capacity. The control means may be operable to store new data pages to the oldest page slot within than sector, on a page by page basis.

For the or each said sector, the control means may be operable to cause successive data pages for storage in the sector concerned to be stored in its page slots in a given order. The order may be from oldest page slot to newest, which may effectively mean from one end of the sector to the other in order.

The control means may be operable to store a data structure (e.g. a look-up table) outside of said memory detailing data pages stored in the or each sector, and to employ the data structure when determining to which page slot the next page of data for storage is to be stored. The data structure may for example be stored in volatile memory such as RAM, which may be external RAM.

A look-up table may be a suitable such data structure. Hash tables and hash maps, and skip lists, are examples of data structures which may also be suitable. Optionally, the data structure may have no or low redundancy in the information it stores. The data structure may be organised (e.g. ordered) by page-identification code (or by page property), such codes identifying the data pages.

The control means may be operable to store an association table (which also may more generally be referred to as a data structure) in the or each sector, the or each association table detailing pages stored in its sector.

The control means may be operable to employ the association table or tables when determining to which page slot the next page of data for storage is to be stored.

The or each association table may detail which pages of data are stored in which page slots of its sector.

The control means may be operable to update the association table concerned as new data pages are stored.

The or each association table may comprise an entry per occupied page slot, the or each entry corresponding to a particular page slot and identifying the data page stored in that page slot.

The control means may be operable to add a new entry for each newly-stored data page to the association table concerned to form a list of entries or to extend an existing list of entries. Thus a table (or other data structure) may be updated by appending a new entry to the end of a list of previous entries, without needing to alter any preceding information.

The data pages may be identified by page-identification codes, which may be numbers.

The electronic apparatus may comprise a hardware unit operable to evaluate the or each association table and to indicate, for one or more the page slots, at least one of:
 (a) whether or not the page slot is free;
 (b) whether the page slot has been completely written with a corresponding page of data;
 (c) whether the page slot contains an invalid page of data and should be ignored;
 (d) an identification code for the page of data stored in the page slot;
 (e) whether the identification code for the page of data stored in the page slot is within a given range of page identification codes; and
 (f) whether the page slot contains a valid page of data.

Such hardware support may speed up evaluation of the association tables, and allow supporting software to be simpler. For example, due to such hardware, the supporting software may have fewer instructions, for example involving fewer masking, shifting, and/or comparing operations. Fewer bus transactions may also be required. Such hardware may result in a significant speed-up in table evaluation.

The control means may be operable to take into account the number of needed pages stored in the or each sector when determining to which page slot the next page of data for storage is to be stored.

The electronic apparatus may be part of or even be a microcontroller.

According to a sixth aspect of the present invention, there is provided an automobile (or an industrial robot, or machinery) comprising electronic apparatus according to the aforementioned fifth aspect of the present invention, the apparatus being configured to control a system of the automobile.

According to a seventh aspect of the present invention, there is provided a method of controlling electronic apparatus, the electronic apparatus comprising memory configured to be written to or read from in memory portions which are erased a sector at a time, the or each said sector comprising a plurality of said portions, each said sector having a plurality of page slots made up of one or more of said portions, and each page slot being for storing a page of data, the method comprising: monitoring the or each said sector; and storing, on the fly in dependence upon such monitoring, the next page of data for storage to the next available page slot.

According to an eighth aspect of the present invention, there is provided a program which when executed on a processor of electronic apparatus controls the apparatus according to a control method, the electronic apparatus comprising memory configured to be written to or read from in memory portions which are erased a sector at a time, the or each said sector comprising a plurality of said portions, each said sector having a plurality of page slots made up of one or more of said portions, and each page slot being for storing a page of data, the method comprising: monitoring the or each said sector; and storing, on the fly in dependence upon such monitoring, the next page of data for storage to the next available page slot.

(C1) According to a ninth aspect of the present invention, there is provided electronic apparatus, comprising: first memory; second memory being non-volatile memory configured to be written to or read from in memory portions which are erased a sector at a time, the or each said sector comprising a plurality of said portions and being for storing a plurality of pages of data; and control means operable to store a data structure (e.g. a look-up table) in the first memory detailing data pages stored in the or each sector, the data structure being organised based on a property of the data pages.

Such a data structure may enable the second memory to be accessed efficiently during run-time, by making use of the first memory. The data structure for example may be indexed based on a property of the data pages, making it easily accessible, whereas the corresponding pages may be stored anywhere in the second memory, in an order not relating to a property of the data pages. The data structure may save the need to scan the second memory for pages, except for when initialising the look-up table.

The property may be a page-identification code. That is, the pages of data may each be identified by a corresponding page-identification code, and the data structure may be organised by page-identification code. The codes may be individual to single pages, or to groups of pages.

The property may be a page-type code. That is, the pages of data may each have a type identified by a corresponding page-type code, and the data structure may be organised by page-type code.

The data structure may be organised based on one property at one time and organised based on a different property at another time.

The electronic apparatus may for example be computing apparatus having a processor, or may be hardware not having a processor. The apparatus may be part of a microcontroller, or may be a microcontroller. For example, the control means may be part of a microcontroller and the memory may be external memory to the microcontroller. The apparatus may include other parts of a microcontroller, for example input/output ports and peripherals.

The first memory may be random-access memory, such that each entry of the look-up table is accessible and modifiable independently of the other table entries. The first memory may be volatile memory, and may be RAM. The memory portions may be small memory portions, for example bits, bytes, words, pages. The second memory may be configured such that it may only be erased a sector at a time, each sector erasure effectively being a single action.

The second memory may be written to one memory portion at a time. The second memory may for example be flash memory (for example NOR flash memory). The second memory may be arranged to have a plurality of said sectors (two, three, or more), although it may also have only one sector.

The look-up table may detail or include information of the locations of the data pages stored in the or each sector, and may detail or include information of the statuses of data pages stored in the or each sector.

The data pages may be identified by page-identification code, and entries in the look-up table corresponding to said data pages may be ordered (e.g. indexed) by page-identification code.

The control means may be operable to store successive data pages for storage in page slots of the sector or sectors in a given order so that the order in which pages are arranged in the sector or sectors is dependent on (corresponds to, follows, depends only on) the order in which those pages were stored. This ordering may be very different from the way in which the data structure is organised, and thus the data structure may be a more efficient resource for accessing a desired data page than by scanning the sector or sectors.

The control means may be operable to store the data structure in respect of pages having page-identification codes within a predefined range, that range being smaller than a range covering all possible data pages. Of course, the control means may be operable to store the data structure in respect of all possible pages.

The control means may be operable to store the data structure in respect of pages currently stored in the sector or sectors as well as in respect of pages previously stored in the sector or sectors.

The control means may be operable to control accesses to the or each sector based on the data structure.

The control means may be operable to generate the data structure during an initialization phase and, following the initialization phase, to update the contents of the data structure (on the fly) to mirror changes in the or each sector. This may enable the sector or sectors to be scanned only once on start-up (i.e. during the initialization phase), with the data structure then being kept up-to-date, so that during run-time it is not necessary to scan the second memory to locate a desired page.

The control means may be operable to store an association table in the or each said sector, the or each said association table detailing pages stored in its sector, and wherein the control means is operable to employ the or each association table to generate contents of the data structure during the initialization phase. The control means may be operable to update the contents of the or each association table on the fly to mirror changes in the or each corresponding sector.

The control means may be operable, following an interruption event, to employ the or each association table in a further initialization phase to store a new data structure.

The electronic apparatus may comprise a hardware unit operable to evaluate the or each association table and to indicate, for one or more the page slots, at least one of:
  (a) whether or not the page slot is free;
  (b) whether the page slot has been completely written with a corresponding page of data;
  (c) whether the page slot contains an invalid page of data and should be ignored;
  (d) an identification code for the page of data stored in the page slot;
  (e) whether the identification code for the page of data stored in the page slot is within a given range of page identification codes; and
  (f) whether the page slot contains a valid page of data.

Such hardware support may speed up evaluation of the association tables, and allow supporting software to be simpler. For example, due to such hardware, the supporting software may have fewer instructions, for example involving fewer masking, shifting, and/or comparing operations. Fewer bus transactions may also be required. Such hardware may result in a significant speed-up in table evaluation.

The or each sector may have a plurality of page slots, each page slot being for storing a said page of data.

The data structure may be a look-up table. The association and identification tables may also be more generally referred to as data structures. Hash tables and hash maps, and skip lists, are examples of data structures which may also be suitable. Optionally, the data structure may have no or low redundancy in the information it stores. The data structure may be organised (e.g. ordered) by page-identification code, such codes identifying the data pages.

The page-identification codes may be page-identification numbers.

The electronic apparatus may be part of or even be a microcontroller.

According to a tenth aspect of the present invention, there is provided an automobile (or an industrial robot, or machinery) comprising electronic apparatus according to the aforementioned ninth aspect of the present invention, the apparatus being configured to control a system of the automobile.

According to an eleventh aspect of the present invention, there is provided a method of controlling electronic apparatus, the electronic apparatus comprising first memory, and comprising second memory being non-volatile memory configured to be written to or read from in memory portions which are erased a sector at a time, the or each said sector comprising a plurality of said portions and being for storing a plurality of pages of data, the method comprising: storing a data structure in the first memory including information of data pages stored in the or each sector, the data structure being organised based on a property of the data pages.

According to a twelfth aspect of the present invention, there is provided a program which when executed on a processor of electronic apparatus controls the apparatus according to a control method, the electronic apparatus comprising first memory, and comprising second memory being non-volatile memory configured to be written to or read from in memory portions which are erased a sector at a time, the or each said sector comprising a plurality of said portions and being for storing a plurality of pages of data, the method comprising: storing a data structure in the first memory including information of data pages stored in the or each sector, the data structure being organised based on a property of the data pages.

According to further aspects of the present invention, there are provided electronic apparatuses, methods and programs combining one or more of the afore-mentioned aspects. Features of electronic-apparatus aspects apply to method and program aspects.

Reference will now be made, by way of example only, to the accompanying drawings, of which:

FIG. 8 is a schematic representation of a look-up table which may be stored in the RAM of the FIG. 1 apparatus;

FIG. 16 is a schematic diagram relating to the erasing of a sector of the FIG. 13 apparatus, and also considers an abort procedure;

Aspects of the present invention will now be explained, by way of a common embodiment.

As will become apparent, the present apparatus enables blocks of virtual memory to be loaded and stored to physical flash memory (a form of EEPROM emulation) by full dynamic allocation. The method is efficient, scalable and safe against sudden power off.

Figure 1:
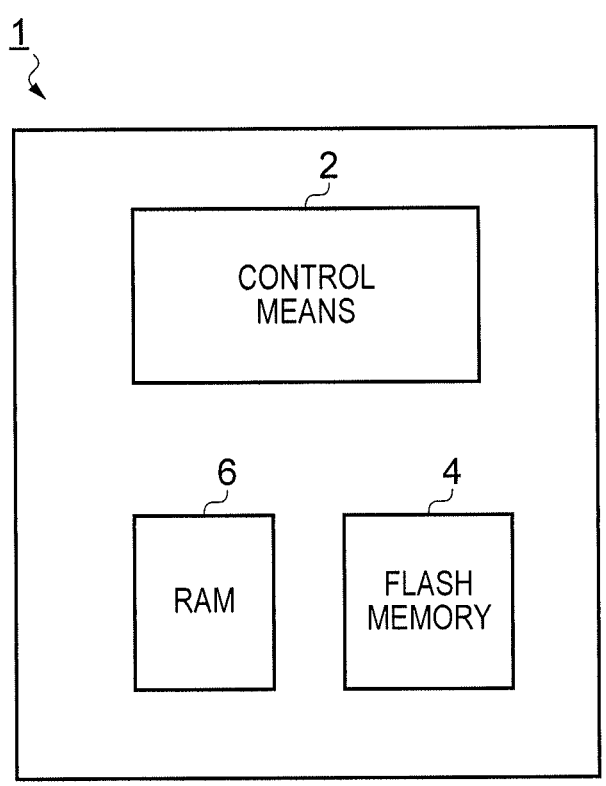
FIG. 1 is a schematic diagram of electronic apparatus embodying the present invention.

FIG. 1 is a schematic diagram of electronic apparatus (e.g. computing apparatus) 1 embodying the present invention. Electronic apparatus 1 comprises control means 2, flash memory 4 and RAM 6.

Electronic apparatus 1 could, for example, be a microcontroller. Flash memory 4 is a specific type of memory currently available, however in other embodiments it may be replaced by non-volatile memory configured to be written to or read from in small memory portions but which must be erased a sector at a time, each sector comprising a plurality of the portions. RAM 6 is a type of memory currently available, however in other embodiments volatile or non-volatile memory may be employed, and any memory, in which stored table entries are accessible and modifiable independently of other table entries, could be employed.

FIG. 1 is simplified for ease of understanding. For example, other components could be provided in addition to those shown. Moreover, connections between the control means 2 and the flash memory 4 and RAM 6, for data and control signals, have not been shown again for simplicity. Further, flash memory 4 and RAM 6 need not be provided on the same chip as control means 2, since they may be external memories.

In this regard, electronic apparatus 1 could represent the combination of a microcontroller with external memories.

Control means 2 may be implemented as a processor, and electronic apparatus 1 could be configured to operate under control of software executed by control means 2. References to software made herein may be interpreted in this context. The present invention could equally be embodied with control means 2 being implemented in hardware, i.e. without requiring software to be executed on a processor.

In the present embodiment, the flash memory is arranged to have at least three sectors, although other embodiments may have a different (for example, larger or smaller) number of sectors. As will become apparent, the apparatus 1 is configured to use the flash sectors for data storage, and to protect the integrity of the data against sudden power off during a sector erasure procedure.

Also in the present embodiment, data is stored to the sectors on the fly. The flash memory is used to emulate EEPROM, such that it serves as a virtual EEPROM. References are therefore made herein to "virtual" memory, and "virtual" addresses, and it will be understood that the virtual memory, with virtual addresses, is implemented physically by storing pages of data to the sectors.

Figure 2:
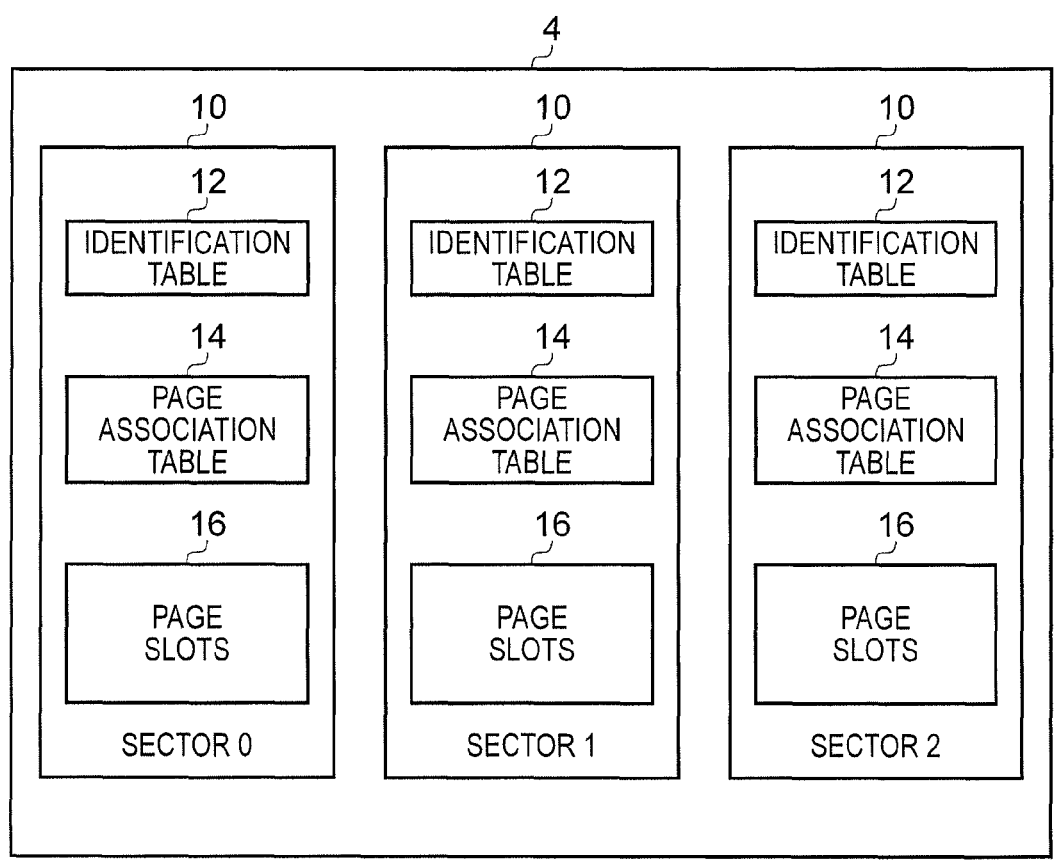
FIG. 2 is a schematic diagram of flash memory of the FIG. 1 apparatus.

FIG. 2 is a schematic diagram of the flash memory 4. Flash memory 4 is configured to have three sectors 10, labelled for convenience as "Sector 0", "Sector 1" and "Sector 2". Flash memory 4 could also be configured to have more than three sectors, or, in some aspects disclosed herein, less than three sectors (for example, one or two sectors).

Each sector 10 is organised to have three main regions, namely an identification table 12, a page association table 14, and an area of page slots 16. The size of the regions 12, 14 and 16 relative to one another will vary from embodiment to embodiment, and this relationship is not represented in FIG. 2. For example, region 16 for storing page slots may be many times larger than the size of regions 12 and 14. The purpose of these regions will become apparent later.

In the present embodiment, the same amount of memory is provided in each sector, such that all of the sectors are of the same size. In other embodiments, the sectors could be of different sizes. Preferably, each type of region is of the same size in each sector.

Also in the present embodiment, it is possible to read from or write to a sector while another sector is being erased, e.g. by temporarily suspending the erasure procedure. In other embodiments, however, it may not be possible to read and write during an erasure procedure.

In the present embodiment the sectors are equivalent to each other, and as such they are handled equally. For example, in the present embodiment there is no special functionality a priori dedicated to a particular sector. The sectors are "cleaned up" (this process will be discussed in more detail later) and erased in an order that is calculated during run-time, i.e. on the fly, depending on the amount of legal (i.e. needed) data contained in the sectors; the order is independent of the virtual addresses of stored data and of any value known a priori.

The identification tables 12 in each sector 10 hold information about current and previous erasure procedures, for example indicating the statuses of such procedures. In this way, the identification tables 12 also hold information about the "age" of the contained or stored data. For example, the "age" of a particular sector 10 may be considered to be equivalent to the number of times other sectors have been erased since the particular sector has been erased. In the present embodiment, new data is written to the oldest sector that has sufficient free memory, and within that sector to the first free page slot (which will be the oldest free page slot). That is, in the present embodiment, new data is written to the next sector, starting from old towards new (e.g. next newer), that has sufficient free memory, and within that sector to the first free page.

Also in the present embodiment, when the remaining free flash memory decreases under a configured or given (e.g. predetermined) amount (for example, below an amount that is more than at least 1 full sector), the sector with the least current data is chosen for clean-up. The sector chosen for clean-up and erasure will be referred to as the "target" sector. During clean-up all legal (i.e. needed) data is copied from the target sector to the oldest sector that has sufficient free memory. In the present embodiment, copying needed pages from the target sector to another sector ("clean up") is done page by page, so that some pages may end up on one sector until that sector is filled up and the rest of the pages in another (the next newer) sector.

Preferably, more than one complete sector's amount of memory should be maintained as free memory. If the amount of free memory reduced to less than that of one complete sector, the free memory could potentially be smaller than the amount of free memory needed to clean up a sector. If the amount of free memory reduced to that of one complete sector, the free memory could potentially be the same as the amount of free memory needed to clean up a sector, leaving no free memory and leading to an endless loop of cleaning up one sector after the next. By monitoring the amount of space needed to clean up sectors, it may be possible to have a changing minimum amount of free memory that can be reached before clean up and erasure.

As previously explained, when erasing of a flash sector is interrupted by a sudden power-off, the contained data is unpredictable. In the present embodiment, the bits have to be written to a "written state" before erasing them to an "erased state", in order to avoid over erasing. The present embodiment is configured to be deterministically safe against sudden power off, rather than to merely be robust in a way that it is very unlikely that an incompletely erased sector is misidentified as not being erased.

For example, it could be considered that reading from only one sector that was possibly interrupted while erasing, provides data with 100% of its bits unpredictable. Hence, it is very difficult to determine whether a sector was interrupted during erasure by evaluating the contents of that sector only, even if sophisticated protection by way of flagging or magic words is implemented.

Further, when reading from two sectors of which either the first or the second was possibly interrupted while erasing, the revealed data has 50% of its bits unpredictable. Again, it is very difficult to determine whether one of two sectors was interrupted during erasure by evaluating the contents of those two sectors only, even if sophisticated protection by way of flagging or magic words is implemented.

When reading from three or more sectors, of which just one was possibly interrupted while erasing, the revealed data has <34% of its bits unpredictable. Hence it becomes possible to determine which one of three or more sectors was interrupted during erasure by evaluating the contents of those three or more sectors.

The following methodology, which may be implemented as an algorithm (i.e. a method), is intended to never identify a sector as valid that is incompletely erased.

The present embodiment makes use of the identification tables 12 to store information about a target sector (the subject of an erasure procedure) in the other sectors. The detection of the current erase state, for example after an interruption event, can then be made by looking for agreement (e.g. correlation) between the information in the various sectors, for example by majority decision.

The identification tables 12 are essentially made up of entries, each of which relates to a particular erasure procedure. When a sector 10 is erased, all of the entries in its identification table 12 are cleared, and an entry is made in that table for each subsequent erasure procedure. That is, one entry is appended to the list of entries in each identification table 12 (other than the one in the target sector) when a new erasure procedure is started. Since the list cannot be erased without erasing the other contents of the sector concerned, only the last entry made is considered valid.

FIG. 3 is a schematic diagram useful for understanding entries in an identification table 12 according to the present embodiment. Each of FIGS. 3(a), 3(b), 3(c), and 3(d) is representative of a single such entry.

Figure 3A:
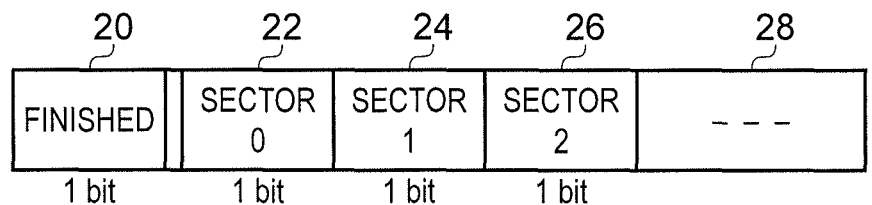
FIG. 3 is a schematic diagram useful for understanding entries in an identification table of the FIG. 2 flash memory.
Figure 3B:
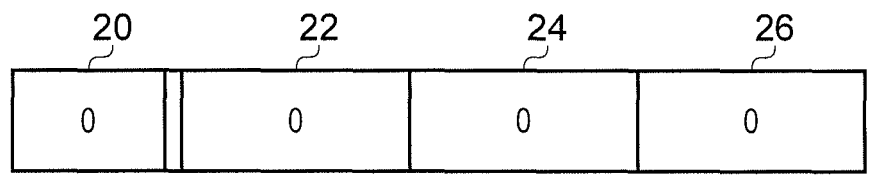
Figure 3C:
Figure 3D:
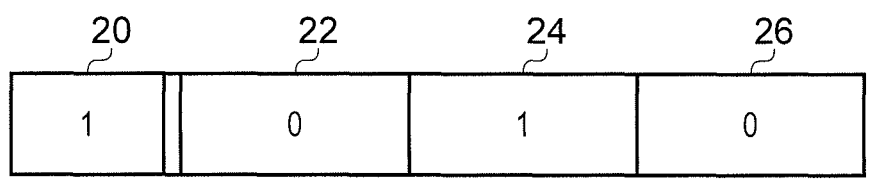

FIG. 3(a) is useful for understanding the component parts of each entry. Each entry is made up of an erased finish flag 20, which is 1-bit wide in the present embodiment, and a 1-bit item 22, 24, 26, 28 per available sector that identifies the sector that is the subject of the erasure procedure concerned (target sector). In FIG. 3(a), items 22, 24 and 26 are provided for "Sector 0", "Sector 1" and "Sector 2", in line with FIG. 2, and item 28 is only shown to make it clear that the entry could be extended to have items for further sectors 10, if more than three sectors 10 are provided. In FIGS. 3(b), 3(c), and 3(d), only items 22, 24 and 26 are shown, for consistency with FIG. 2.

As mentioned above, when a sector 10 is erased, all of the entries in its identification table 12 are cleared. This could be represented by all of the bits being false, as opposed to true.

Of course, "true" and "false" denote logical states, and the mapping of these to physical values (high/low or 1/0) depends on the hardware implementation of the flash memory 4. An example flash memory may have physical logic high in its erased state, and physical logic low in its written state. It may be possible in such a flash memory to write a bit from "erased" to "written", from "written" to "written", or from "erased" to "erased", but it may not be possible to write a bit from "written" to "erased" (such a transition may only be achieved by erasing). For consistency, in FIG. 3(b) and in the other Figures, false is represented by erased value "0" and true is represented by written value "1", however this is simply to assist understanding of the present invention.

Accordingly, FIG. 3(b) represents the state when an entry is clear and not yet used (since the previous erasure). FIG. 3(c) represents the state when "Sector 1" has been targeted for erasure, "Sector 1" thus being the target sector. Note that the finished flag is false, representing that the erasure procedure is not yet complete. FIG. 3(d) represents the state when "Sector 1", the target sector, has been erased; note that the finished flag is true.

In the present embodiment, when a sector 10 (the target sector) is to be erased a new entry is appended to the identification tables 12 of all the other sectors 10. An empty (unused) entry in the table has erased flash value "0" in this example. Hence, erasing and resetting the table is done by a single flash erase operation.

Each of these new entries, at the time of targeting a sector 10 for erasure, is made by writing the one bit that identifies the target sector. This action both marks a table entry as in use and identifies the target sector. As only one bit is required, the encoding of the target sector is "atomic". That is, if writing one bit is interrupted by a power-off, the flash cell concerned will enter a state where the bit is either written or not written. There is no intermediate state.

Figure 4A:
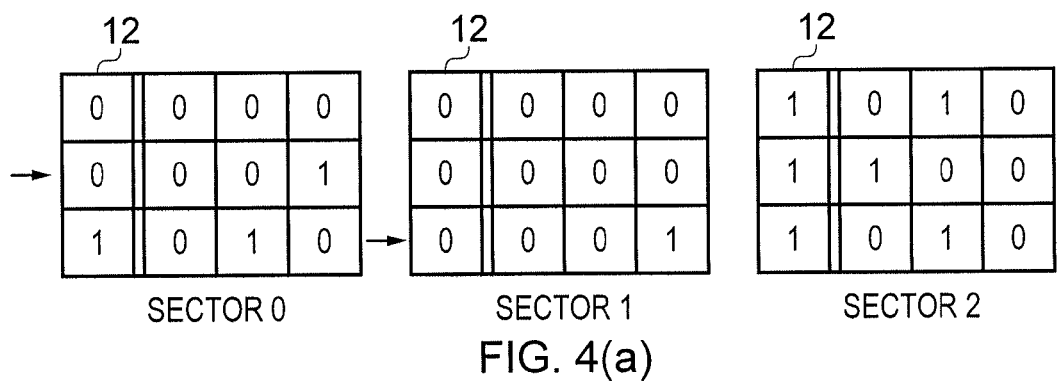
FIG. 4 is a schematic diagram relating to the erasing of a sector of the FIG. 1 apparatus.
Figure 4B:
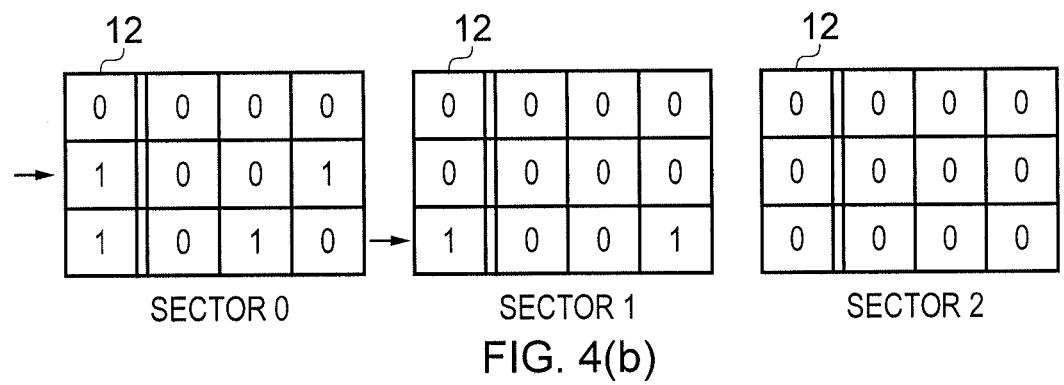

FIG. 4 is a schematic diagram showing an example for erasing a sector 10, in this case for erasing "Sector 2". In each of FIGS. 4(a) and 4(b), the identification tables 12 for the three sectors concerned are shown. It will be appreciated that the tables shown may be only representative of the top most (i.e. the last) entry spaces of the identification tables 12, and may in reality have many more entries.

In FIG. 4(a), the last (top most) entries made in the tables of "Sector 0" and "Sector 1" are indicated on the left-hand side of the tables with arrows. These entries are the valid entries and are the newest entries in those tables which are not fully false (i.e. unused) and which have a false finished flag (i.e. the erasing is to be carried out). Index 2 in these entries is written to, indicating that "Sector 2" is the target sector.

It can be seen that all of the entries are finished (finish bit true) in the identification table 12 for "Sector 2", i.e. the target sector. "Sector 2" is therefore, comparing the identification tables 12 in FIG. 4(a), the "oldest" sector 10.

FIG. 4(b) is similar to FIG. 4(a), for ease of comparison; the same entry spaces are shown after the erasure procedure has been finished. Note that the entries indicated by arrows (as above) in the identification tables 12 for "Sector 0" and "Sector 1" now have a true finished flag. Additionally, note that the identification table 12 for "Sector 2" has been cleared during the erasure procedure, since it is part of "Sector 2".

A feature of FIG. 4(b) is that it represents a valid state before the next erase attempt, i.e. it effectively indicates that the erasure procedure in respect of "Sector 2" was successful.

An aspect of the present invention relates to the detection of an incomplete erasure procedure, due to an interruption event, and recovery procedures. This aspect will be considered further in relation to the present embodiment.

Figure 5:
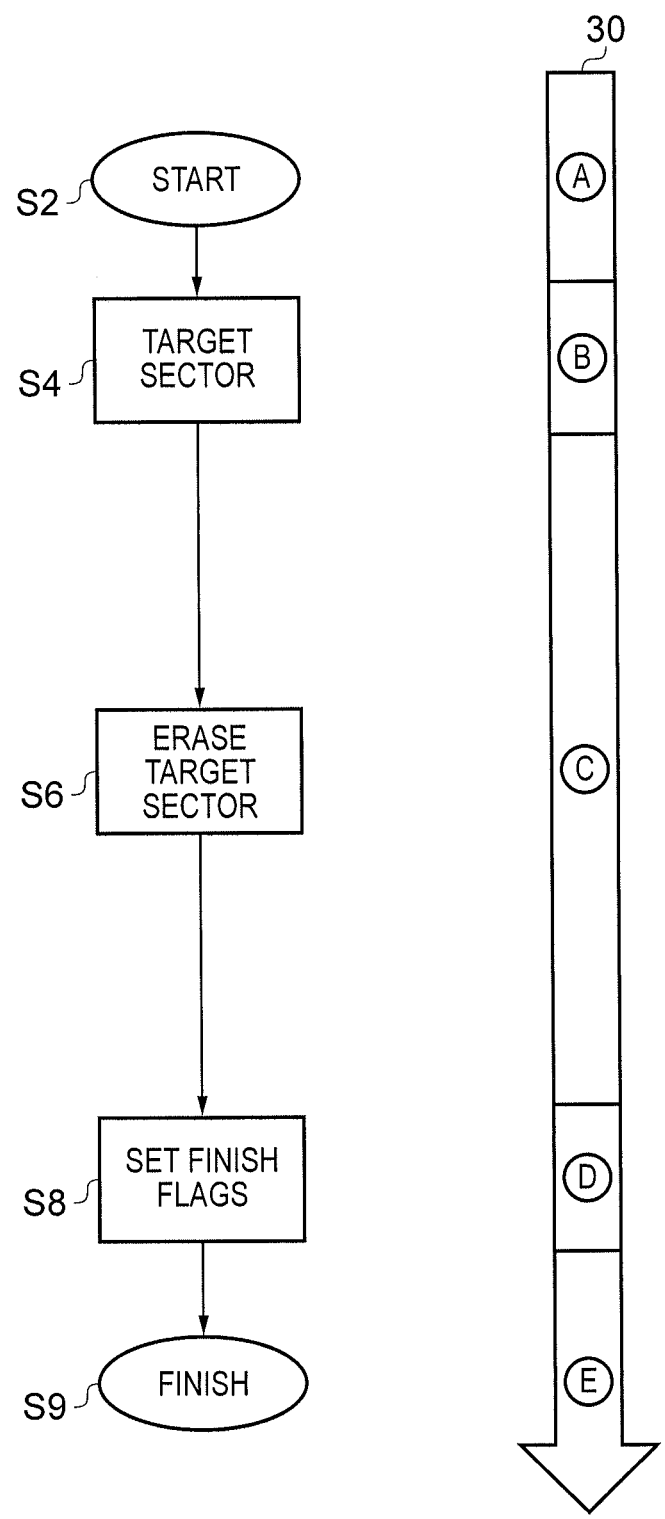
FIG. 5 is a flowchart representing an erasure procedure.

FIG. 5 is a flowchart representing an erasure procedure in accordance with the present embodiment.

The procedure starts at step S2, and at step S4 a sector for erasure is targeted. It will be appreciated that before steps S2 and S4 are executed, the target sector may be cleaned up if necessary, during which all legal data (i.e. needed data) is copied from the target sector to the oldest sector that has sufficient free memory. Of course, if no needed data is stored on the target sector, then no clean up need be carried out.

In the present embodiment, any required clean up is carried out before steps S2 and S4, i.e. before identifying the target sector in the identification tables 12 of the other sectors. This is because clean up and erase steps should be distinguished if the sequence was interrupted. If clean up was interrupted, the sector should be cleaned further (reading necessary). If erase was interrupted, the contents of the sector should be considered unpredictable (reading forbidden).

A sector may be cleaned up before it is identified (by marking identification tables) as being a target sector. If clean up is interrupted and another sector is chosen for clean up next time, then no data is lost. This is because clean up is a sequence of writing the same "needed" data (copying) from one sector to the oldest sector with sufficient space, page by page (which is similar to a writing action). In case of interruption, perhaps a few page slots may be wasted.

Part of step S4 involves writing to the next entry space in the identification tables 12 in each of the sectors other than the target sector, to identify the target sector as being targeted. FIG. 4(a), discussed above, is an example of state of the identification tables at the conclusion of step S4.

At step S6, the target sector is then erased, following which all bits of the target sector will be false (i.e. have erased value "0").

At step S8, the finished flags are set in the identification tables 12 of the sectors other than the target sector, to indicate that the target sector has been erased. FIG. 4(b), discussed above, is an example of state of the identification tables at the conclusion of step S8.

The procedure then ends at step S9, pending future such procedures.

The erasure procedure represented by FIG. 5 may unfortunately be interrupted, for example by a sudden power-off event, at any time. This is indicated by the arrow 30 in FIG. 5. In particular, the interruptions may be grouped generally into Groups A, B, C, D and E, as indicated.

After the erasure procedure of FIG. 5 has been interrupted, a read out from the flash memory 4 can enable the following states and their causes to be identified, by examining the last entries of the identification tables 12.

Groups A and E—No Sector is Targeted for Erase

In the case of Group A, the first write attempt to the first identification table 12 was interrupted, and writing failed for the one bit that identifies the target sector. In the case of Group E, the last write attempt to the last table was interrupted and writing succeeded for the one bit that identifies the target sector.

These two cases can be treated as if no erasure procedure was interrupted, because the sectors are in the same state as if no erasure procedure was ongoing. That is, the sectors will be in the same state as if the erasure procedure had never started or had finished without interruption.

Groups B and D—One or More Sectors Target the Same Sector for Erasure and 2 or More Sectors do not Target any Sector In the case of Group B, some but not all table entries in the identification tables 12 that were intended to be set to identify a target sector (step S4) were successfully written, and the interruption occurred before completion of all intended entries to the tables. In the case of Group D, some but not all table entries that were intended to be set to indicate that the erasing (step S6) had been finished were successfully written, and the interruption occurred before completion of all intended entries to the tables.

In these two cases, preparation of the identification tables 12 was interrupted. Erasing of the target sector 10 was either not started (Group B) or it was completed (Group D). In both cases the target sector can be safely read. Reading any page slot of the page slots region 16 identified by the page association table 14 of the target sector will reveal either an empty or used state. The relationship between the page association tables 14 and page slots in the page slots region 16 will be discussed in more detail later herein.

A sector that was prepared for erasure (i.e. was cleaned up) will not contain free page slots and a sector that was recently erased will not contain used page slots in this embodiment, as discussed later herein. Thus, Group B interruptions can be distinguished from Group D interruptions.

In this embodiment, in the case of Group B interruptions, the erasure procedure should be partly repeated (from step S4 onwards—it will be appreciated that S4 will have been partly carried out before interruption and so will need to be completed. Thus, S4 needs to be repeated only for those sectors that do not yet target the target sector). In the case of Group D interruptions, finished flags of all entries to the identification tables that identify a target sector should be set to true. No other sector should be erased in the meantime.

Group C—Erasing of the Target Sector was Interrupted

In this case, at least all but one of the sectors target the same sector for erase, and the targeted sector targets no sector, some other sector, or itself for erasure.

In the case of Group C, the target sector can be identified by looking for agreement between the last entries in the identification tables 12, for example by majority decision. In this embodiment, part of the erasure procedure (from S6 onwards) for that target sector should be repeated before another sector can be erased. In the meantime, reading from the target sector should be disallowed, because its contents may be corrupted. All other sectors can be read.

As described above, it will be appreciated that an interruption of any of the countermeasures described above in relation to Groups A to E will be an interruption which leads to a situation that falls into one of those Groups.

Note also that interruption of an erasure procedure will never lead to the consuming of more than one entry space in any of the identification tables 12, i.e. each erasure procedure will consume exactly one entry space in the identification tables 12 of every non-targeted sector, independently of the number of interruptions. For example, if S4 was interrupted, the last entries in each sector's identification table 12 will be either "in use" (targeting the target sector) or finished (not yet targeting). Those sector tables that are already targeting will be skipped in the repeating procedure of S4.

Another aspect of the present invention relates to the storage of data in the sectors. This aspect will now be considered further in relation to the present embodiment.

Unlike in hardware EEPROM, the emulated memory of this embodiment is not organized as a continuous range of fixed-size data words. Instead it is organized as a discontinuous range of virtual pages (each virtual page may occupy a plurality of physical pages of the flash memory). The virtual pages ("pages", for simplicity) are addressed by a unique index (a page ID), and, in this embodiment, have the same size. The page size may be scaled to an arbitrary value, for example by static configuration of supporting software. A mapping of virtual blocks of arbitrary size to an integer number of pages may be done by known means, in a higher layer.

In the present embodiment, each sector contains (i.e. is organised into) a set of page slots, for example as defined by supporting software, which can store one virtual page each. A page slot in this embodiment comprises one entry in the page association table 14 of the sector concerned, and a block of memory that is big enough to store the virtual data of that page.

Figure 6:
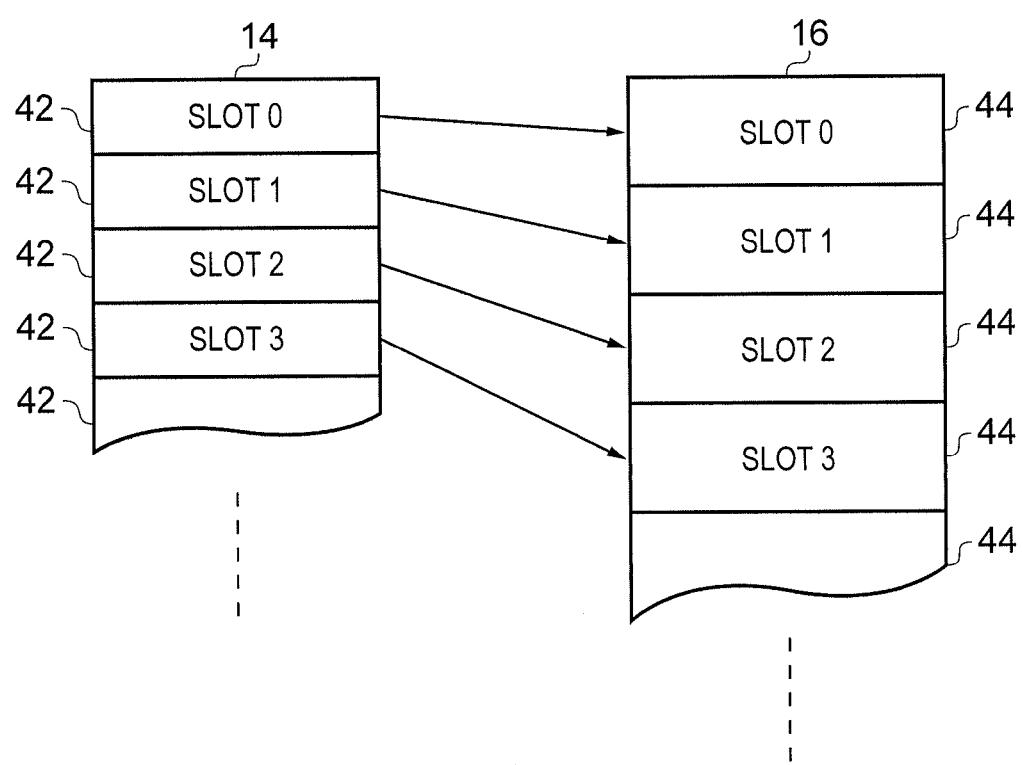
FIG. 6 is a schematic diagram representing the relationship between entries in a page association table and page slots in a corresponding page slots region.

FIG. 6 is a schematic diagram representing the relationship between entries 42 in a page association table 14 and page slots 44 in the corresponding page slots region 16. In this embodiment, the relationship is static so that a particular entry 42 in a page association table 14 corresponds to a particular predetermined page slot 44 in the corresponding page slots region 16.

Each entry 42 in a page association table 14 denotes the state of the corresponding page slot 44.

The state may be "free", meaning that the page slot contains no data and that a page may be written to that page slot 44.

The state may be "allocated", meaning that the page slot contains no data, but that starting a new write attempt to the page slot is forbidden. This state may occur if writing to the slot is interrupted by an interruption event, such as a power off.

The state may be "valid", in which case the entry will carry a page ID identifying the stored page. This state may mean that the corresponding page slot 44 contains data for the page identified by the page ID. Writing to the page slot in this state is forbidden.

The state may be "invalid", again in which case the entry will carry a page ID. This state means that the page with the page ID was deleted, or updated, and writing to this page slot is forbidden. Effectively, this state means that the page was deleted, and may be reached by writing the page to a "free" page slot or by updating a "valid" page.

FIG. 7 is a schematic diagram useful for understanding entries in an association table 14 according to the present embodiment. Each of FIGS. 7(a) to 7(g) is representative of a single such entry.

Figure 7A:
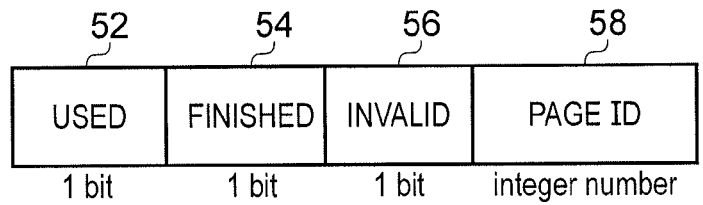
FIG. 7 is a schematic diagram useful for understanding entries in an association table of the FIG. 2 flash memory.

FIG. 7(a) is useful for understanding the component parts of each entry. Each entry is made up of a used flag 52, a finished flag 54, an invalid flag 56, each of which is 1-bit wide in the present embodiment, and a page ID 58.

The used flag 52 is a 1-bit flag indicating whether or not the page slot is free, with an erased state (false) in this embodiment indicating that the page slot is free. The invalid flag 56 is a 1-bit flag indicating whether the page slot (i.e. whether the data for a page identified by a page ID) is valid or invalid, with an erased state (false) in this embodiment indicating that the page slot is valid. The finished flag: 54 is a 1-bit flag indicating whether the page slot is allocated or not, with an erased state (false) in this embodiment indicating that the page slot is allocated. The page ID 58 is an integer number being an index that uniquely identifies the virtual page that is stored in the page slot 44.

In the present embodiment, a modified (or new) page is always written to the first free page slot 44, with a corresponding entry into the relevant part of the page association table 14 concerned. Thus, the ID of the page is stored to the relevant entry 42 in the page association table 14, and the virtual data is stored to the page slots region 16 in the corresponding page slot 44.

For each page, only the last (most recent) occurrence in a page slot 44 (i.e. in the newest page slot 44 of those for that page) that is either valid or invalid represents the current state and content of that page. Older versions of a page (i.e. in an older page slot 44) are implicitly ignored. Hence it is advantageously not needed to invalidate old page slots if the same page is valid or invalid in a newer slot.

A page that is not referenced in any page slot is considered non-existent in the virtual memory. A read attempt may lead to an error or will return default values, depending on the error notification paradigm adopted (for example by the supporting software).

An invalid state of a page slot denotes that the page concerned was virtually erased, i.e. the page was reverted to a non-existent state. An invalidated page may be excluded from copy when the sector needs to be erased, hence it can reduce memory consumption in the future.

The fact that pages can be added or removed during runtime, without the need to reconfigure the software makes this method dynamically scalable.

Figure 7B:
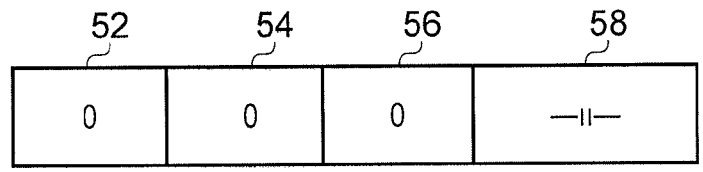

Accordingly, FIG. 7(b) represents the state when an entry is clear and not yet used (since the previous erasure of the sector), since all of the values are "0". That is, the entry is "free". As the width of the page ID 58 section may vary from embodiment to embodiment, the "0" value is indicated generally in FIG. 7(b).

Figure 7C:
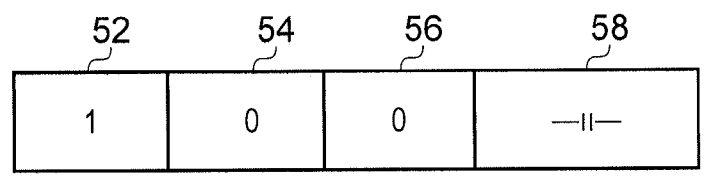

FIG. 7(c) represents the state when an entry is no longer free, since the used flag 52 has a value "1". That is, the entry is "allocated".

Figure 7D:
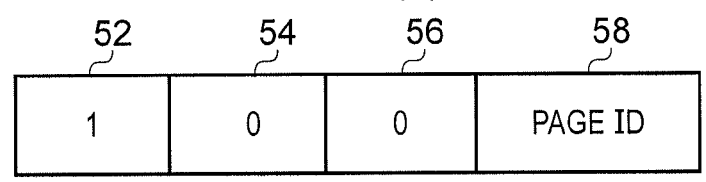

In FIG. 7(d), the page ID 58 section has been populated with a page ID, indicating the page that is intended to be stored in the page slot 44 concerned.

Figure 7E:
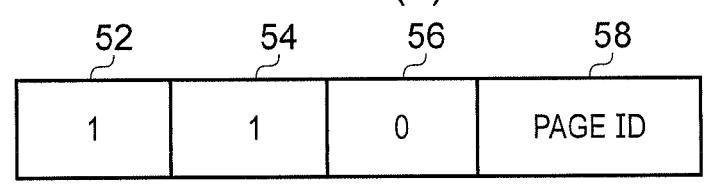

FIG. 7(e) represents the state when the entry is "valid", since the used flag 52 has a value "1", the page ID 58 section has been populated with a page ID, and the finished flag 54 has a value "1". The finished flag 54 indicates that the corresponding page slot 44 has been successfully populated with the data of the page identified in the page ID 58 section. Since the invalid flag 56 has the value "0", the entry is still valid.

Figure 7F:
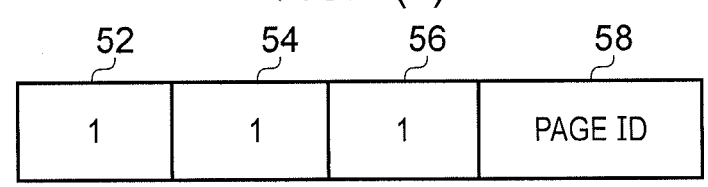

FIG. 7(f) represents the state when the entry has become "invalid", since the invalid flag 56 now has the value "1", the other parts of the entry being unchanged.

Figure 7G:
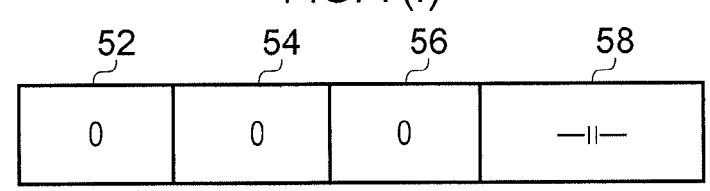
Figure 9A:
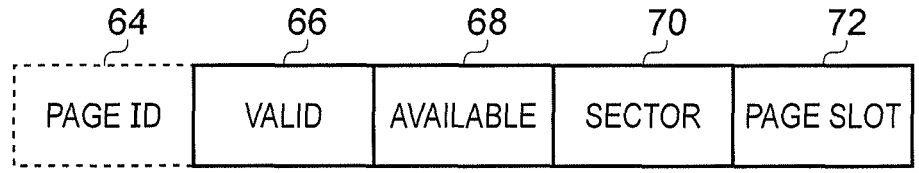
FIG. 9 is a schematic diagram useful for understanding entries in a look-up table.
Figure 9B:
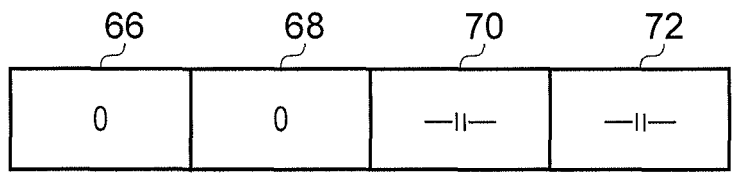
Figure 9C:
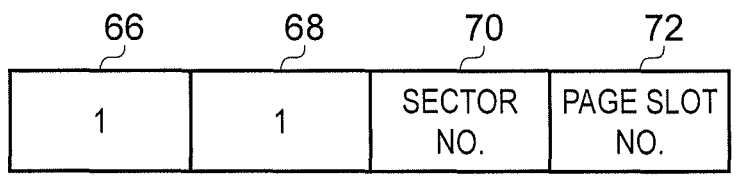
Figure 9D:
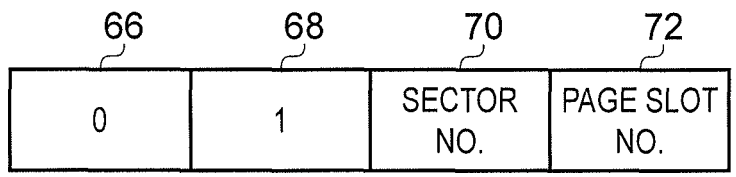
Figure 9E:
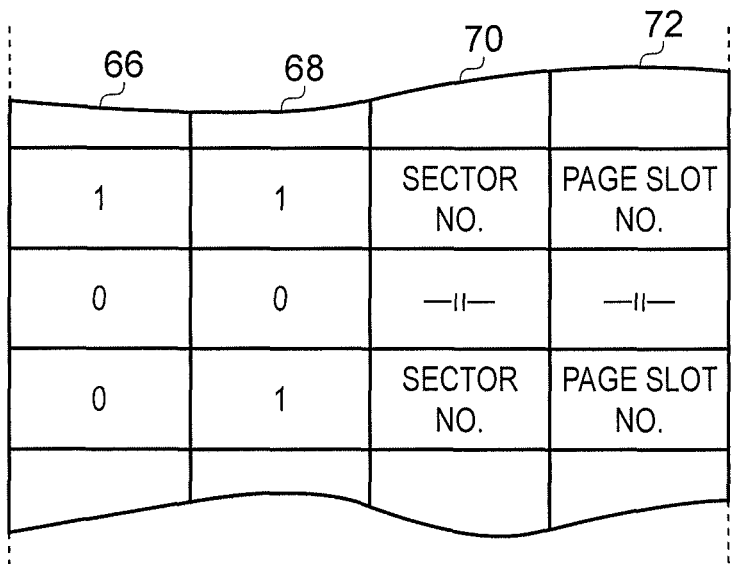

FIG. 7(g) represents the state when the entry has been cleared following erasure of the sector, since all of the values are "0" once more. FIG. 7(g) is accordingly the same as FIG. 7(b).

In the present embodiment, as with other parts of a sector 10, erasing and resetting the page association table 14 and page slots region 16 is done by a single flash erase operation.

The procedure by way of which data is stored in the sectors in this embodiment will now be considered.

When a page is to be written to a sector the following sequence is executed. The first free page slot 44 is allocated by writing a "1" to the used flag 52 in the corresponding entry 42 of the corresponding page association table 14. The page ID is then written to the same entry 42 in the page association table 14 in a second write access. Then, the content of the virtual page is written to the page slot 44 in the page slots region 16. The page slot 44 is finally indicated as being "valid" by writing a "1" to the finished flag 44.

When a page is to be invalidated on a sector the following sequence is executed. The page slot 44 that already contains the page is indicated as being "invalid" by writing a "1" to the invalid flag 56 in the corresponding entry 42 in the page association table 14. In this embodiment, this is done by rewriting however it will be appreciated that in other embodiments (for example where rewriting is not possible due to hardware restrictions) the same effect could be achieved by writing to a new entry 42 in the page association table 14. For example, a new entry could be provided with the page ID of the page to be invalidated, and the invalid flag 56 given the value "1" during the writing process. In this case, invalidating may be considered to be equivalent to writing with respect to the execution sequence and detection of an incomplete write (making use of the finished flag 54, as discussed above).

As with the other procedures described herein, it is possible that the data storage procedures could be interrupted by an interruption event such as a power off.

Such interruption could result in the page slot 44, and corresponding entry 42, being left in one of a number of different states.

The page slot 44 could be "free", i.e. with nothing written to it, if the interruption occurred before the used flag 52 could be written to. In this case, following interruption, the page slot 44 may be safely considered free and reused, since the page slot 44 will not have been written to yet.

The page slot 44 could be "allocated", i.e. with the used flag 52 written to and the finished flag 56 not written to, if the interruption occurred after the writing of the used flag 52 but before the writing of the finished flag 56. In this case, some but not all bits of the page slot 44 may have been written to. The page slot may neither be reused nor read. The page slot 44 should be ignored.

The page slot 44 could be "finished" (valid or invalid), i.e. with the finished flag 56 written to, if the interruption occurred after the writing of the finished flag 56. In this case, all of the bits were written that were intended by the storage procedure. The page slot 44 may be read without data corruption; i.e. it may be safely considered "valid" or "invalid".

Thus each of these states may be detected and dealt with. It will be appreciated that the present invention provides a degree of robustness against interruption. The writing of a page slot 44 is safe against interruption by power off.

For example, the procedures detailed above (which may be embodied as an algorithm) will never identify a page (stored in a page slot 44) as valid that is incompletely written. Further, such an algorithm will never identify an outdated version of a page as the current version, because in the present embodiment the implicit invalidation of all older versions is indicated by the same bit that indicates the validity of the newer data.

It will be appreciated that consecutive interruption of the write procedures could potentially fill up all entries 42 of the page association tables 14 with allocated page slots 44. As a consequence, the virtual memory might enter a state where it is impossible to write further data. The present embodiment is configured to safely detect this state so that it remains safe against power off. This may be done by counting the remaining free pages slots, and by disallowing a significant change in this number. This could make writing become impossible, but with the benefit of keeping already-written data safe. As another example, as a preventative countermeasure the minimum number of free page slots before erasure (discussed further below) may be adjusted.

The procedure or algorithm adopted in the present embodiment for data lookup, i.e. for reading data from the virtual memory comprising all of the sectors, will now be considered.

During initialization, the states of the sectors are detected, and this need only be done at the initialization stage. After initialization, it is known which sectors contain valid data and of which age they are. The valid sectors are sorted by their "age", oldest first. As mentioned above, the "age" of the sectors may be assessed by examining the identification tables 12, the older sectors having longer lists in their identification tables 12.

To find the latest (i.e. newest) version of a page, the page association tables 14 of the valid sectors 10 are evaluated. In the present embodiment, this is not repeated for every page one-by-one, but done for a range of pages at once. The size of this range is scalable by software configuration, and could for example comprise all possible pages.

The software employs a buffer in the RAM 6 that is big enough to contain a table that associates the following items to each virtual page in range: (1) validity (is the page valid or invalid?); (2) availability (is a page slot reserved for, i.e. used by, this page?); (3) sector index (on which sector is the page stored?); and (4) page slot index (in which page slot is the page stored within the sector concerned?).

Figure 8:
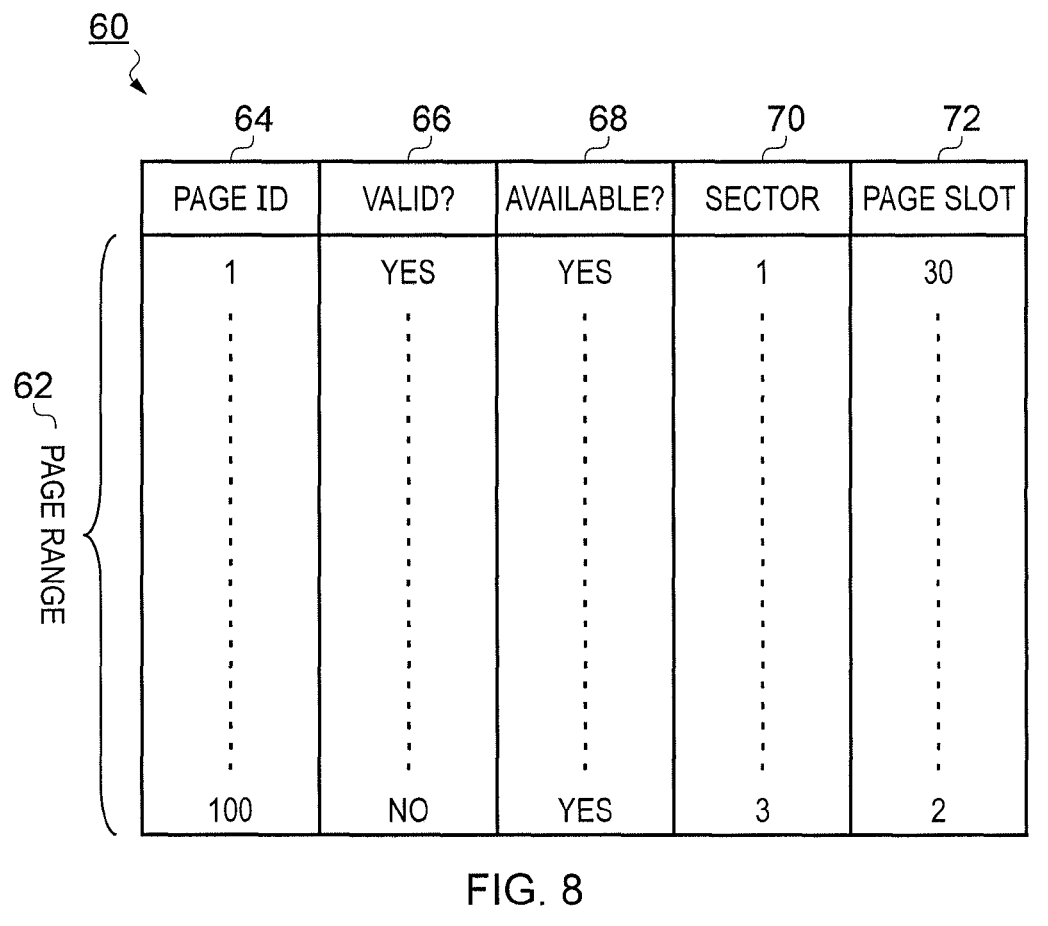

This table in RAM 6 may be referred to as a look-up table. FIG. 8 is a schematic representation of a look-up table 60 which may be stored in the RAM 6.

Look-up table 60 is configured to store entries in respect of pages in page range 62, in this case for pages 1 to 100. In FIG. 8, only the first and last entries are shown for simplicity; it will be appreciated that all of the entries may be populated.

Look-up table 60 is in the form of a table, each row of the table being an entry corresponding to a page with its page ID as indicated in the first column 64. The other columns are employed to indicate whether the pages are valid 66 and available 68, and on which sector 70 and in which page slot 72 they are stored.

The page ID corresponding to each entry in the look-up table 60 may be given by the table offset (index of the first item, i.e. entry) and the position (index) within the table 60. In this way, column 64 may be effectively redundant and not be realised in an actual embodiment. That is, the location and size of the look-up table 60 within the RAM 6 may be known, e.g. predefined, and stored in software or other hardware, so that the entry for a particular page may be accessed by way of indexes/offsets, without there needing to be a page ID column 64 as such.

FIG. 9 is a schematic diagram useful for understanding entries in a look-up table 60 according to the present embodiment. Each of FIGS. 9(*a*) to 9(*d*) is representative of a single such entry.

FIG. 9(*a*) is useful for understanding the component parts of each entry. Each entry is made up of a valid record 66, an available record 68, a sector record 70 and a page slot record 72. Of course, each entry may explicitly also have a page ID record 64 or implicitly have such a record by virtue of its position in the look-up table 60 as in the present embodiment. Thus, page ID record 64 in FIG. 9(*a*) is shown as being optional (dashed lines) in FIG. 9(*a*) and is omitted from FIGS. 9(*b*) to 9(*e*).

The valid record 66, which may be a 1-bit record, indicates whether or not the page is valid in a page slot 44 (with associated association table entry 42) as identified with records 70 and 72, with a written state (true) in this embodiment indicating that the page is valid.

The available record 68, which may be a 1-bit record, indicates whether or not the page is available in a page slot 44 (with associated association table entry 42) as identified with records 70 and 72, with a written state (true) in this embodiment indicating that the page is available.

The sector record 70, which may be an integer number, indicates on which of the valid sectors 10 the page concerned is stored. Similarly, the page slot record 72, which may also be an integer number, indicates in which page slot 44 of the identified sector 10 the page concerned is stored.

In the present embodiment, each entry in the look-up table 60 is effectively pre-assigned to a particular page. As the status of a page changes, after the initialization phase as will be discussed below, its entry in the look-up table 60 may be changed accordingly. Changes may occur for example as a result of write, copy and erase actions.

Accordingly, FIG. 9(*b*) represents the state when an entry is clear and not yet updated, since all of the values are "0". That is, the page concerned does not exist in the virtual memory physically provided by the sectors 10. As the width of the sector record 70 and page slot record 72 may vary from embodiment to embodiment, the "0" values are indicated generally in FIG. 9(*b*).

FIG. 9(*c*) represents the state when a page is valid and available in the virtual memory, its physical location being indicated with the sector record 70 and page slot record 72 in that entry. In FIG. 9(*c*), the sector record 70 has been populated with a sector number or index, indicating that the page is physically stored in that sector 10. Similarly, the page slot record 72 has been populated with a page slot number or index, indicating that the page is physically stored in that page slot 44 of the sector 10 concerned.

FIG. 9(*d*) is similar to FIG. 9(*c*), in that it represents the state when a page is available in the virtual memory, its physical location being indicated with the sector record 70 and page slot record 72 in that entry. However, in FIG. 9(*d*) the page is indicated as being invalid.

FIG. 9(*e*) represents an excerpt from look-up table 60, in which three consecutive entries are shown, relating to three consecutively numbered pages.

Figure 10:
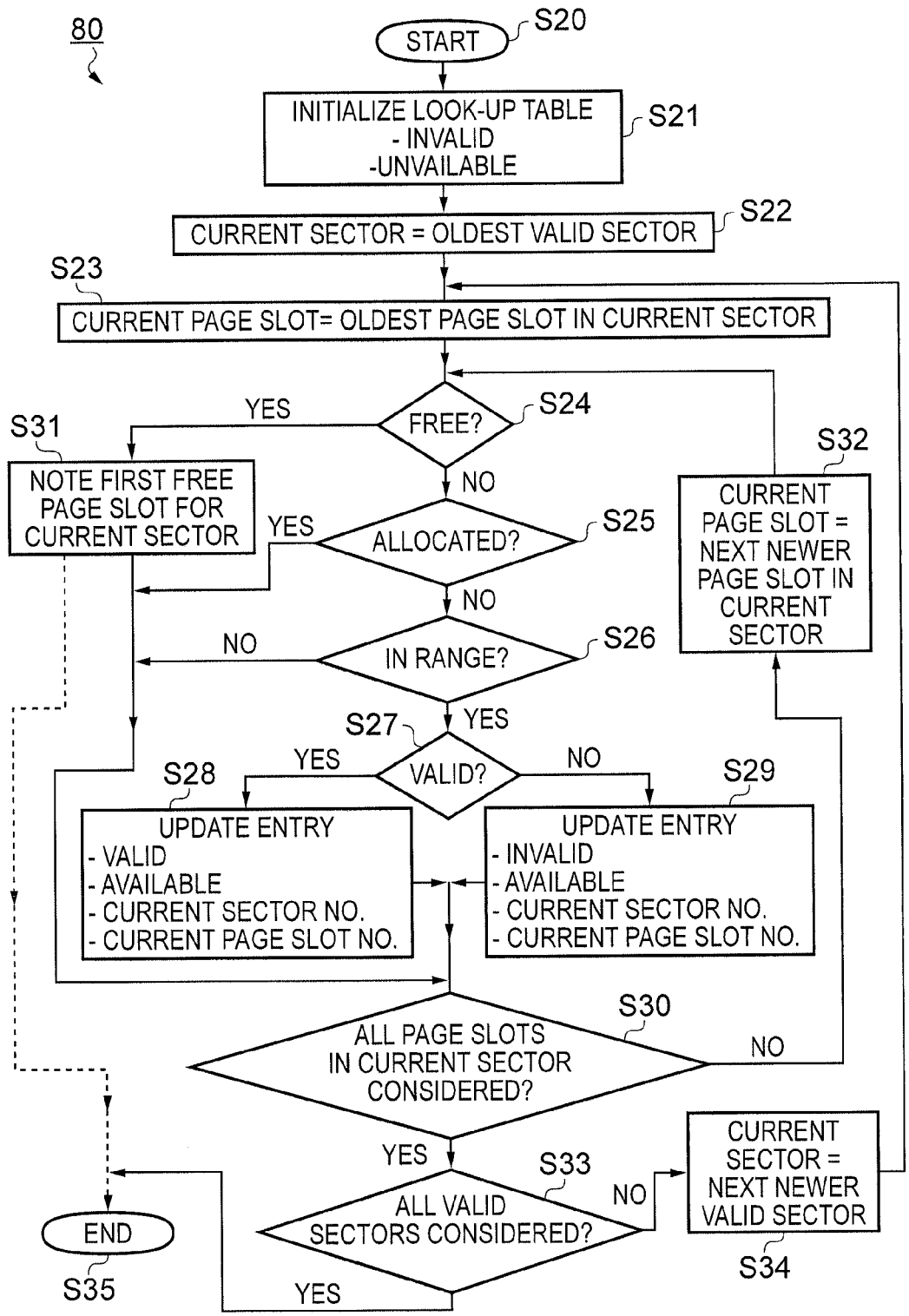
FIG. 10 is a flow diagram depicting a method for populating a look-up table.

The procedure by way of which information is written to the look-up table 60 during the initialization phase will now be considered in connection with FIG. 10.

In general terms, the association tables 14 of the valid sectors 10 are evaluated/scanned to populate the look-up table 60 during the initialization phase. Firstly, the table 60 itself is initialized by marking all entries to show that the pages concerned are invalid and not available. Then, the "oldest" valid sector 10, the first in the sorted list, is selected as the current sector.

The page association table 14 of the current sector 10 is then traversed beginning from the entry 42 corresponding to the oldest page slot 44 (i.e. that first written to) towards the entry 42 corresponding to the newest page slot 44. In the present embodiment this traversing may stop for the current sector 10 at the first free page slot 44, since page slots are written to in order, however in other embodiments the entire page association table 14 may be traversed.

If the current page slot is valid and the page ID is in range, the entry corresponding to that page in the look-up table 60 is updated to show that the page is valid, available, located on the current sector, and located in the current page slot. Similarly, if the current page slot is invalid and the page ID is in range, the entry corresponding to that page in the look-up table 60 is updated to show that the page is invalid, available, located on the current sector, and located in the current page slot.

If the current page slot is indicated as being "allocated", it is skipped. If the current page slot is indicated as being "free", its position is stored as being the first free page slot and the evaluation of that association table 14 is terminated. In this embodiment, since pages are written to page slots in an order, from oldest sector to newest, scanning of the association tables 14 may be terminated when the first free page slot is found, since all further page slots will be free.

If all of the valid sectors have not yet been considered, then the next valid sector (next in the sorted list) is selected as the current sector 10 and its association table 14 is traversed as above. The procedure continues until all of the valid sectors 10 have been considered.

FIG. 10 is a flow diagram depicting a method 80 for populating the look-up table 60 during the initialization phase. Method 80 comprises steps S20 to S35.

Method 60 starts at step S20 and proceeds to step S21. In step S21 the table 60 is initialized to a standard state by marking all of the entries to show that the pages concerned are invalid and unavailable. The method then proceeds to step S22.

In step S22 the oldest valid sector, based on the sorted list as mentioned above, is selected as being the current sector 10. The method then proceeds to step S23.

In step S23, the oldest page slot 44 in the current sector is selected as being the current page slot 44, and its entry 42 in the corresponding page association table 14 examined. The method then proceeds to step S24.

If, in step S24, it is determined that the current page slot 44 is not "free" (S24; NO), the method proceeds to step S25. If, in step S25, it is determined that the current page slot 44 is not "allocated" (S25; NO), the method proceeds to step S26. If, in step S26, it is determined that the page stored in the current page slot 44 is in range (S26; YES), i.e. if its page ID is in the range handled by the look-up table 60, the method proceeds to step S27.

In step S27, it is determined from the entry 42 relating to the current page slot 44 whether the page stored is "valid" or "invalid". If it is determined that the page is "valid" (S27; YES), the method proceeds to step S28 in which the entry for that page in the look-up table 60 is updated to show that the page is valid, available, located on the current sector 10 and located in the current page slot 44 of that sector 10. If, on the other hand, it is determined that the page is "invalid" (S27; NO), the method proceeds to step S29 in which the entry for that page in the look-up table 60 is updated to show that the page is invalid, available, located on the current sector 10 and located in the current page slot 44 of that sector 10. Following step S28 or S29, the method proceeds to step S30.

If, in step S24, it is determined that the current page slot 44 is "free" (S24; YES), the method proceeds to step S31, in which the current page slot is noted as being the first "free" page slot in the current sector 10, and the method then proceeds to step S30. As mentioned above, since pages are written to page slots in an order in this embodiment, from oldest sector to newest, scanning of the association tables 14 may be terminated when the first free page slot is found, since all further page slots will be free. Thus, the method may proceed (as shown in dashed form in FIG. 10) from step S31 directly to step S35 where the method ends. It will be appreciated that the progression from step S31 to S30 in FIG. 10 can ensure that all sectors are scanned.

If, in step S25, it is determined that the current page slot 44 is "allocated" (S25; YES), the method proceeds to step S30. If, in step S26, it is determined that the page stored in the current page slot 44 is not in range (S26; NO), i.e. if its page ID is not in the range handled by the look-up table 60, the method proceeds to step S30.

In step S30, it is determined whether the current page slot 44 is the final page slot 44 to be considered in the current sector 10. This could involve checking whether the current page slot 44 is the first free page slot in that sector, or whether the traversing has reached the final page slot 44 in that sector. If it is determined that the current page slot 44 is not the final page slot 44 (S30; NO), the method proceeds to step S32 in which the current page slot is set to be the next newer page slot (a page slot that is one newer than the previous current page slot), and then back to step S24 so that the new current page slot may be considered. If, on the other hand, it is determined that the current page slot 44 is the final page slot 44 (S30; YES), the method proceeds to step S33.

In step S33, it is determined whether the current sector 10 is the final valid sector 10 to be considered. This could involve checking that there is no newer sector 10 in the sorted list than the current sector, or for example checking that all of the valid sectors 10 have been considered. If it is determined that the current sector 10 is not the final sector (S33; NO), the method proceeds to step S34 in which the current sector is set to be the next newer valid sector (a valid sector that is one newer than the previous current sector), and then back to step S23 so that the new current sector may be considered. If, on the other hand, it is determined that the current sector 10 is the final sector 10 (S33; YES), the method proceeds to step S35, where it ends.

Following the initialization phase, future write or copy attempts to the sectors are tracked by way of updating the look-up table 60, so that the look-up table continues to provide an up-to-date record of the contents of the sectors and therefore of the virtual memory.

If, for example, more than one look-up table 60 is provided, the above methodology may of course be carried out per look-up table 60.

It will be appreciated that the above methodology is efficient. Once a page is referenced in the look-up table 60, its state and its storage position in the flash memory 4 can be easily looked-up from the table 60, i.e. without there being a need to traverse the page association tables 14. Preferably, the storage range of the RAM look-up table 60 is sufficient to reference all pages. In this case, the page association tables 14 need only be traversed once during the initialization phase, which leads to time and thus performance efficiencies.

The clean-up and erasure of sectors 10, to gain new free flash memory while preserving all virtual data, will now be considered in more detail.

This procedure involves the following stages: (1) deciding which sector 10 to clean-up and erase (i.e. selecting a target sector 10); (2) cleaning-up the target sector 10, i.e. copying all needed valid and invalid pages to another sector; and (3) erasing the target sector to make it available for storage of new data. These stages will be considered in turn, in conjunction with FIG. 11.

Figure 11:
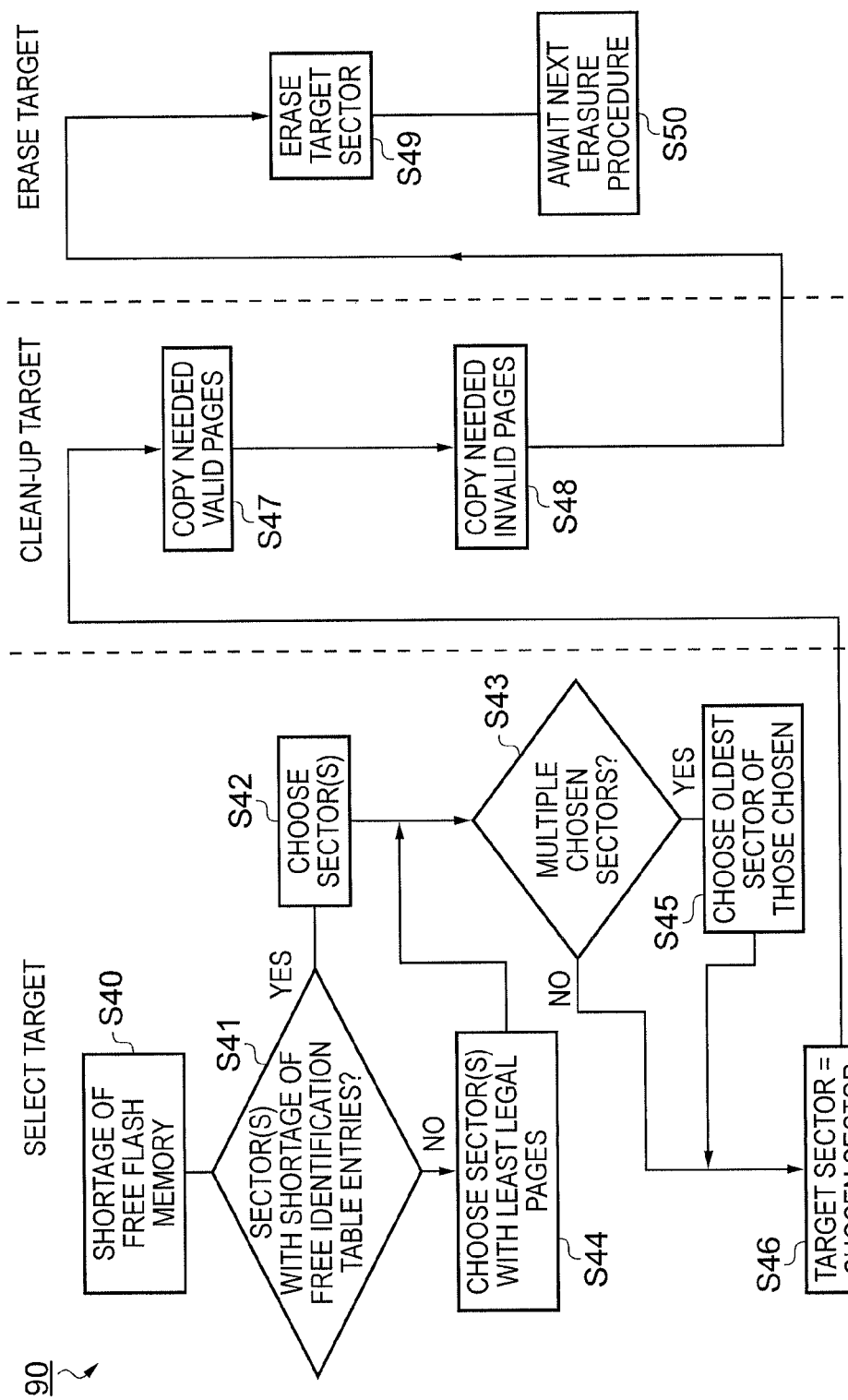
FIG. 11 is a flow diagram depicting a method for the clean-up and erasure of a target sector.

FIG. 11 is a flow diagram depicting a method 90 for the clean-up and erasure of a target sector. Method 90 comprises steps S40 to S50. Steps S40 to S46 relate to stage (1), steps S47 and S48 relate to stage (2), and step S49 relates to stage (3).

It will be recalled that erasure procedures according to the present invention are carried out when there is a shortage of free capacity in the flash memory 4. Such a shortage could be a shortage of space in one or more of the identification tables 12, or for example a shortage of space in one of more of the page association tables 14 and page slots regions 16.

Method 90 starts at step S40, in which there is a shortage of free flash memory 4. The level of free flash memory 4 which is considered to represent a shortage may be predefined, for example in software or hardware, or adjusted on the fly (for example to maximise performance). The method then proceeds to step S41.

Step S41 represents a first consideration (criterion) in relation to selecting a target sector 10. If a sector 10 runs short on free entries in its identification table 12 (S41; YES), it is chosen as being a potential target sector 10 and the method proceeds to step S42. If multiple such sectors have this condition, then they are all chosen in step S42. A sector 10 may be considered to have run short on such free entries when the number of free entries is equal to or smaller than the number of sectors 10 that are older than that sector. The method then proceeds to step S43.

If no valid sector 10 has run short on free entries in its identification table 12 (S41; NO), the method proceeds to step S44 in which a sector 10 that contains the least number of legal (i.e. needed) pages that need to be copied is chosen. Again, if multiple such sectors have this condition, then they are all chosen in step S44. The method then proceeds to step S43.

Legal pages that need to be copied may be considered to be: (a) all pages that are "valid" inside the virtual memory (the latest, i.e. newest, page slot for that page is valid) and the latest page slot for that page is located on the sector concerned; and (b) all pages that are "invalid" inside the virtual memory (the latest, i.e. newest, page slot for that page is invalid), the latest page slot for that page is located on the sector concerned and the sector concerned is not the oldest of all sectors.

In this connection, it will be appreciated that if an older sector contains a valid page slot for the same page, the old state of the page would be considered to be the current version again if the new invalid version was removed, leading to data corruption, hence the step of checking that the sector concerned is not the oldest of all sectors.

In step S43, it is determined whether multiple sectors have been chosen. If multiple sectors have been chosen (S43; YES), the method proceeds to step S46 via step S45, in which the oldest one of them is considered to be the chosen one, and the others are ignored. If, however, only a single sector has been chosen (S43; NO), the method proceeds directly to step S46.

In step S46, the single chosen sector 10 is considered to be the target sector. The method then proceeds to step S47.

In step S47, those valid pages that are stored in the sector and that need to be retained (legal pages) are copied to the next free page slots in the virtual memory, i.e. in another sector 10. It will be recalled that in the present embodiment new data is written to the oldest sector 10 that has sufficient free memory. Accordingly, in step S47 all pages that are valid inside the virtual memory (the latest page slot for that page is valid), and for which the latest page slot for that page is located on the target sector, are copied to the next free pages slots. The method then proceeds to step S48.

In step S48, those invalid pages that are stored in the sector and that need to be retained (legal pages) are copied to the next free page slots in the virtual memory, i.e. in another sector 10. Accordingly, in step S48 all pages that are invalid inside the virtual memory (the latest page slot for that page is invalid), and for which the latest page slot for that page is located on the target sector, where the target sector is not the oldest of all sectors, are copied to the next free pages slots. The reason for the step of checking that the sector concerned is not the oldest of all sectors has been explained above.

The target sector and page slots may be accessed and assessed making use of the page association tables 14 and/or the look-up table 60 as detailed above. It will be appreciated that in copying pages from the target sector to another sector all of the pages stored therein become implicitly invalid (since newer versions are then stored elsewhere). Steps S47 and S48 may, in an unusual case, also comprise marking any free page slots 44 as being invalid, so as to arrive at a situation where the target sector has no free page slots.

Following step S48, the method proceeds to step S49, in which the target sector is erased. Effectively, in this step the oldest sector that does not contain any of the following items is erased: (1) free page slots (to prevent empty sectors from being re-erased); (2) pages that are valid inside the virtual memory (the latest page slot for that page is valid) and the latest page slot for that page is located on the target sector; and (3) pages that are invalid inside the virtual memory (the latest page slot for that page is invalid), the latest page slot for that page is located on the target sector and the target sector is not the oldest of all sectors. The reason for the step of checking that the sector concerned is not the oldest of all sectors has been explained above.

Erasing is performed by a flash erase operation erasing the whole sector concerned, as part of the procedure detailed above in relation to FIG. 5. The sector that was erased last becomes the newest sector, since its identification table 12 will have been emptied. The page association table 14 of an erased sector will also have been emptied.

In the present embodiment, for efficiency, the erasing of step S49 is started as soon as possible, i.e. as soon as there is a sector 10 (the target sector) which does not contain items (1) to (3) discussed above in respect of step S49.

Since read and write access is possible during erase for flash memory 4, the maximum latency for data access can be much smaller than the time needed for erase. The maximum latency for read access is independent of the time needed for erase, since no additional data is stored.

The efficiency of the methodology presented herein with respect to the amount of memory that need be copied during clean-up compared to the amount of memory that makes up the virtual memory, will now be considered.

In the present embodiment, physical memory allocation is dynamic, so that the amount of memory that makes up the virtual memory is not known a priori. With this in mind, the size of the virtual memory at a particular time may be defined as being the sum of all virtual pages that have been written to at least once. That is, all of the virtual memory that has been accessed up to that time.

Some of the pages may have been invalidated in the meantime, but may still consume physical page slots. For these pages there may be a legal physical page marked as invalid, which hides (by being newer) an older version of the same virtual page (an illegal physical page). In that case, the "legal" invalid page should be copied during clean up to prevent the old "illegal" version being considered "legal" again. If it is known that the legal page does not hide an illegal version of the same page (i.e. because the legal page is located on the oldest sector) then the invalid page does not need to be copied at clean up.

Hence, there are a number of pages that need to be stored at all times and this number is equal to or greater than the number of physically-stored valid pages, and it is equal to or smaller than the number of physically-stored pages that make up the virtual memory. These pages are expected to be distributed across n−1 sectors (where n is the number of sectors) following clean up (one sector is expected to be the target sector, so it is empty of needed pages at that time).

As previously discussed, in the present embodiment an algorithm chooses the sector with least data to be copied as the target sector, and this data is not more than 1/(n−1) of all of the memory mentioned above.

There may be the case that a lot of virtual memory was invalidated during runtime compared to a relatively small amount of valid data at that time. In that case, the virtual memory is very large (maybe even larger than the physical memory when considered over time) so that it is an unhelpful reference for considering efficiency. It can be shown that there is a limit to the number of pages (valid and invalidated) that need to be stored at a particular time.

There are two cases, as follows. In the following, n is the number of sectors, m is the maximum number of page slots per sector and v is the number of valid pages.
Case1: v<=m In the worst case, all valid pages are stored to the oldest sector and the n−2 remaining sectors contain v−1 invalidated pages each. Note that invalidated pages on the oldest sector are not copied at clean up, so that they can be ignored. Also note that whenever one of the remaining n−2 sectors reaches the number of valid pages on the oldest sector, the oldest sector will be cleaned up by definition and the contained pages will move to the oldest sector with sufficient space. Hence, one of the sectors that contains invalid pages becomes the oldest sector and will be cleaned up next time, resulting in no invalid pages to be copied, then the next oldest and so on, until all of the formerly invalidated pages are removed.

In Case1, there are a maximum of (n−2)*(v−1) invalidated pages. The sum of legal pages is hence (n−2)*(v−1)+v=(n−1)*(v−1)+1.
Case2: v>=m In the worst case, all pages of the oldest sector contain valid pages (m pages) and the remaining n−2 sectors contain m−1 legal pages each, which contain the remaining valid pages and invalidated pages.

This means that in Case2 there are a maximum of (n−2)*(m−1)−(v−m) invalidated pages. The sum of legal pages is (n−2)*(m−1)+m=(n−1)*(m−1)+1.

The integer number of pages that need to be copied during clean up is hence less than or equal to min(v−1, m−1). It is not limited by the size of the virtual memory. This is a benefit in efficiency compared to static or hybrid-allocating methods with only two sectors, which have to copy all virtual memory.

In a case where there is more valid virtual memory than fits on one sector, the presented methodology is more efficient than systems that use only two sectors, even if the overall sum of flash memory is the same. This is because in the present apparatus the number of pages that need to be copied is limited by the number of pages that fit in one sector.

The maximum latency for write access is linear with respect to $$\frac{t_{ce}}{f}$$

if the data rate is limited to $$\leq \frac{f}{t_{ce}}$$

pages and f is limited to $$\leq m - \frac{t}{n-1},$$

where: $t_{ce}$ is the maximum time needed for clean-up and erase one sector; f is the number of free page slots that are available at the moment erasing is started; n is the number of sectors available; m is the number of page slots per sector; and t is the total number of pages in the virtual memory, i.e t<=min(v−1, m−1).

It will be appreciated that the present embodiment has advantages in terms of scalability. The limit of free page slots that triggers clean-up (and as a consequence erase) can be configured by software. This limit is preferably at least the number of page slots per sector.

FIG. 12 is a schematic diagram representing an example sequence of writing data pages to three sectors 10, labelled "Sector 0", "Sector 1" and "Sector 2".

Each of FIGS. 12(a) to 12(e) shows the page slots region 16 (having page slots 44) for each of the three sectors 10. For simplicity, it is assumed that each page slots region 16 has only four page slots 44, however it will be appreciated that in a practical embodiment it would have many more. Each of the page slots 44 shown is either filled with the label "F", indicating that it is "free", or is given a number label indicating the number of the page that it is storing. Also, in each of FIGS. 12(a) to 12(e), the age of the sector concerned is indicated under its page slots region 16. For example, in FIG. 12(a), Sectors 0, 1, and 2 have ages 2, 1 and 0, respectively, indicating that Sector 0 is the oldest sector and that Sector 2 is the youngest.

Figure 12A:
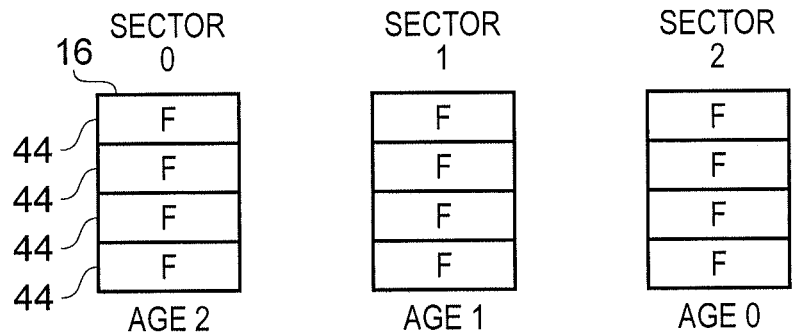
FIG. 12 is a schematic diagram representing an example sequence of writing data pages to three sectors.

FIG. 12(a) represents an initial state, in which all of the page slots 44 across the sectors are "free". Sectors 0, 1, and 2 have ages 2, 1 and 0, respectively.

Figure 12B:
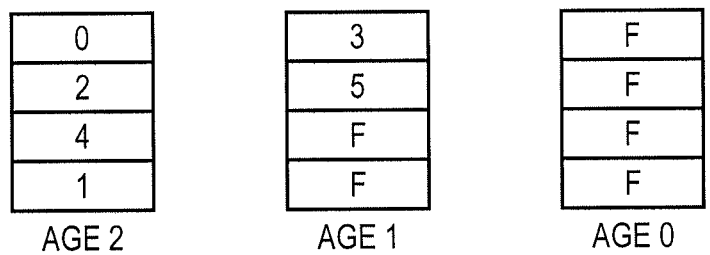

Virtual pages 0, 2, 4, 1, 3 and 5 are then written to the flash memory 4 in that order, page by page, and so they can be seen in FIG. 12(b) having occupied Sector 0 (the oldest sector with sufficient space at the time of writing pages 0, 2, 4, and 1) and part of Sector 1 (the oldest sector with sufficient space at the time of writing pages 3 and 5). The writing started with the oldest page slot (uppermost) in the oldest sector and progressed page slot by page slot towards the newest page slot (lowermost) in the newest sector.

Figure 12C:
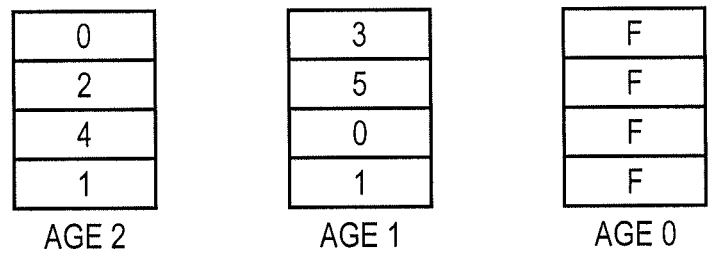
Figure 12D:
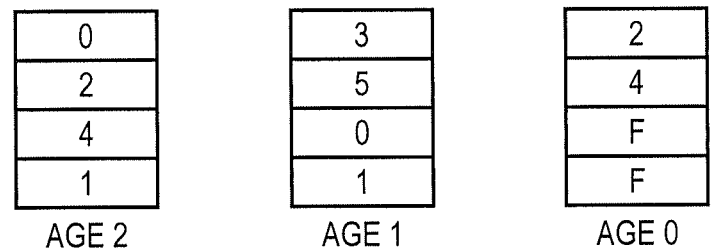

Virtual pages 0 and 1 are then re-written to the flash memory 4 in that order, and so they can be seen in FIG. 12(c) having taken up the final two page slots 44 in Sector 1. That is, they have been written to the oldest sector with sufficient space, page by page.

At this point, the limit of free pages slots (at least one whole sector) is reached, and Sector 0 (the oldest sector) is cleaned up. Since virtual pages 0 and 1 are valid in Sector 1 (and thus implicitly invalid in Sector 0), and since Sector 0 is the oldest sector, it is only necessary to copy virtual pages 2 and 4 (the valid pages) from Sector 0 during the clean up. These two pages can be seen in FIG. 12(d) having been written to the oldest sector with sufficient space, which in this case is Sector 2. The first two page slots 44 in Sector 2 have thus been occupied.

Figure 12E:
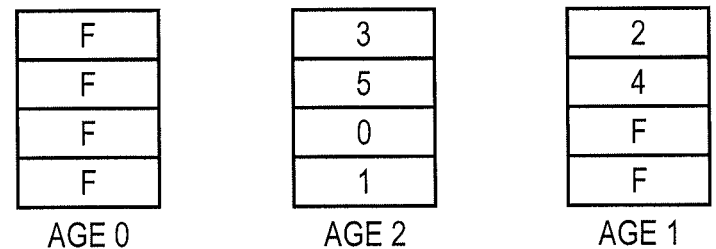

Now that Sector 0 does not contain legal (i.e. needed) data, it can be erased. The state following erasure is shown in FIG. 12(e). The page slots 44 in Sector 0 are now "free" once more. Moreover, Sector 0 has age 0 since it has just been erased, and the ages of Sectors 1 and 2 have increased by 1 because of the erasure operation.

Future writing would start from the first free page slot in Sector 2 (it being the oldest sector with sufficient space), and it will appreciate that writing, clean up and erasure could continue in this way.

A modification to the above-described embodiments will now be presented, to aid in a better understanding of the present invention.

In order to appreciate differences between the present modification and the above-described embodiments, reference is made back to the identification tables 12 and in particular to the "atomic" writing explained in connection with FIG. 3, i.e. writing a single bit at a time. Considering FIG. 3 briefly again, each new entry, at the time of targeting a sector 10 for erasure, is made by writing the one bit that identifies the target sector. This action both marks a table entry as in use and identifies the target sector. As only one bit is required, the encoding of the target sector is "atomic". That is, if writing one bit is interrupted by a power-off, the flash cell concerned will enter a state where the bit is either written or not written. There is no intermediate state.

The present modification considers the prospect of corruption occurring in the writing/storing of values in the flash memory. Flash memory, although generally stable in the short term, is typically unstable to a degree over considerable time (e.g. months or years) or deteriorates in performance due to certain environmental conditions (e.g. temperature extremes). The effects of ageing or exposure to different environmental conditions (extremes of temperature, pressure, humidity, vibration, etc.) can therefore cause memory corruption.

With this in mind, the present modification considers the situation in which redundancy codes are to be written together with the flag (each of the items 20, 22, 24, 26, and 28 per entry, as shown in FIG. 3, being such a flag), to deal with the effects of corruption. Therefore, the present modification considers the use of multi-bit such flags (i.e. the flags have built-in redundancy).

The present modification considers the combination of robustness against interruption by a power off (or other interruption event) with protection against minor bit errors by redundancy codes. The modification also describes how to combine several redundancy codes into one data word to make the data word re-writeable for the purpose of protecting itself and other memory against interruption by power off, while being protected against, for example, 1 or 2 bit errors.

It is noted that error correcting and detecting codes (e.g. Hamming code with additional parity) have been previously considered for correcting 1 bit error and/or detecting 2 bit errors from a data word with additional redundancy bits.

As with the earlier embodiments, the present modification concerns the loading and storing of blocks of virtual memory to physical flash memory (known as EEPROM emulation) by full dynamic allocation. The method is safe against sudden power off and it can reliably detect bit errors during write sequence, and can detect and/or correct bit errors when not interrupted by sudden power off.

Rather than repeat substantial portions of the earlier disclosure, the following description will focus mainly on differences between the present modification and the earlier embodiments, for reasons of brevity.

The apparatus and flash memory architecture detailed above in connection with FIGS. 1 and 2 may be considered to apply to the present modification. However, in the present modification at least four sectors are provided, and the entries in the identification tables in the present modification are different from those depicted in FIG. 3.

Figure 13:
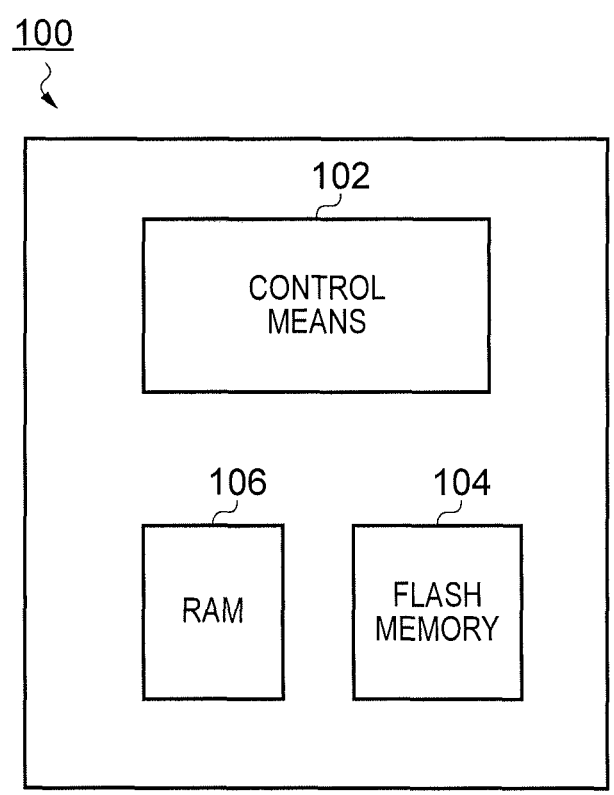
FIG. 13 is a schematic diagram of further electronic apparatus embodying the present invention.

FIG. 13 is a schematic diagram of electronic apparatus (e.g. computing apparatus) 100 embodying the present modification. Electronic apparatus 100 comprises control means 102, flash memory 104 and RAM 106. These elements may be compared with the corresponding elements in FIG. 1 and further description is therefore omitted.

As above, in the present embodiment the flash memory is arranged to have at least four sectors, although other embodiments may have a different (for example, larger or smaller) number of sectors. Data is stored to the sectors on the fly (e.g. dynamically).

Figure 14:
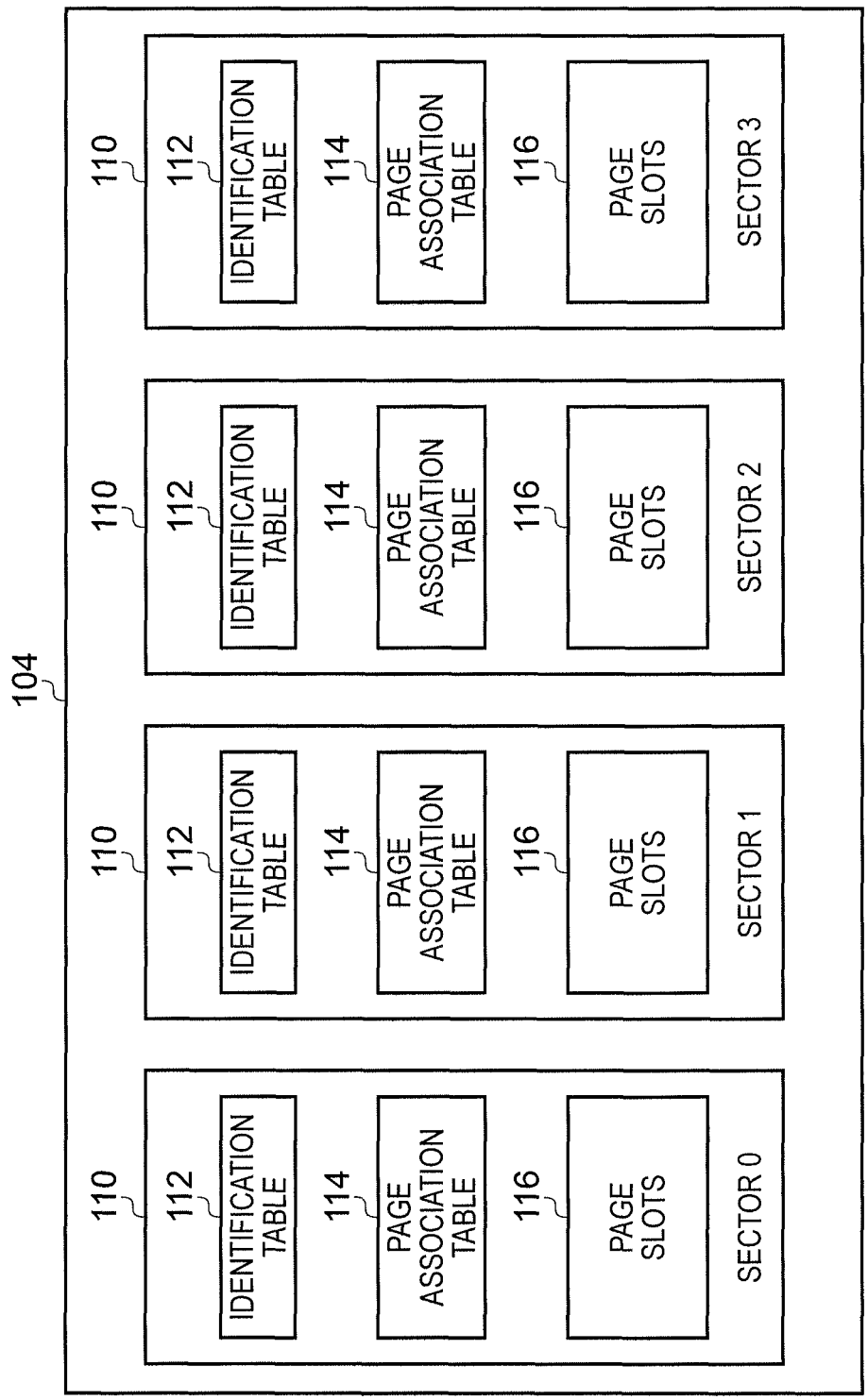
FIG. 14 is a schematic diagram of flash memory of the FIG. 13 apparatus.

FIG. 14 is a schematic diagram of the flash memory 104. Flash memory 104 is configured to have four sectors 110, labelled for convenience as "Sector 0", "Sector 1", "Sector 2" and "Sector 3". Flash memory 4 could also be configured to have more than four sectors, or, in some aspects disclosed herein, less than four sectors (for example, one or two or three sectors).

Each sector 110 is organised to have three main regions, namely an identification table 112, a page association table 114, and an area of page slots 116. This arrangement of elements may be compared to that in FIG. 2, and further description is therefore omitted. The description already provided in relation to FIG. 2 applies mutatis mutandis to FIG. 14.

The following methodology, which may be implemented as an algorithm (i.e. a method), is intended to never identify a sector as valid that is incompletely erased.

The present embodiment makes use of the identification tables 112 to store information about a target sector (the subject of an erasure procedure) in the other sectors. The detection of the current erase state, for example after an interruption event, can then be made by looking for agreement (e.g. correlation) between the information in the various sectors, for example by majority decision, as described earlier.

The identification tables 112 are essentially made up of entries (which may be referred to as slots), each of which relates to a particular erasure procedure. When a sector 110 is erased, all of the entries in its identification table 112 are cleared, and an entry is made in that table for each subsequent erasure procedure. That is, one entry is appended to the list of entries in each identification table 112 (including the one in the target sector) when a new erasure procedure is started. Since the list cannot be erased without erasing the other contents of the sector concerned, only the last entry made is considered valid.

This methodology may be considered to be an enhanced methodology which, as well as protecting data against sudden power off during erasing of a sector, is safe against bit errors in the used table entries.

In the present embodiment, as before, the sector identification tables hold information about the "age" of the contained data. The "age" of a particular sector is equivalent to the number of times other sectors have been erased since the particular sector has been erased.

In the present embodiment, at least until it has been determined that no interruption has occurred, or until recovery action has been taken following interruption, no redundancy-code processing is employed. Where available, error correcting codes may be disabled. Put another way, redundancy-coding techniques (such as hardware ECC, discussed in relation to FIG. 18 below) may be employed once it has been determined that writing/erasing has been successful using the methodology described herein, or once recovery techniques following interruption as described herein have been employed.

Additionally, re-writing is possible, i.e. bits that are in written state already, are writeable to written state again (without intermediate erase) without causing an error.

Further, a natural number m is assumed, and the flags in the sector identification tables are assumed to have n bits each, where n=2m+1. It is also assumed that all flags in the sector identification tables have m or fewer bits at any time that are corrupted due to causes other than an incomplete write.

Naturally, n could be larger than 2m+1, and for example an even number; the equation n=2m+1 represents the maximum size of m relative to n, where the majority decision techniques considered herein may be employed. The equations provided herein will therefore be interpreted accordingly.

Also in the present embodiment, at least 4 sectors are provided. Additionally, the sectors are given an order which is static throughout each erase procedure (e.g. hard-wired physical addresses). These criteria are arrived at considering that the flash memory typically stores information in an array of memory cells made from floating-gate transistors. On interruption, it is possible that such cells could be in a floating state having not been fully written to for example, i.e. with a stored charge level which is around the dividing level between true and false. In that instance, the stored value could be seen to toggle over time in an unhelpful and unpredictable manner.

Having at least 4 sectors, and writing to them in a given order, is useful for example for the following reason. It is possible, in a particular erasing procedure, to have the first sector targeting correctly the target sector for that procedure as well as another sector (due to a residual floating state following an interrupted previous such procedure), one of the second to fourth sectors (the target sector) in an erased state following erasing, with a least the two other sectors targeting the target sector. In this situation, the first sector's values cannot be trusted, but a successful recovery can be carried out, because of the two sectors in agreement, following an interruption of the particular erasing procedure.

FIG. 15 is a schematic diagram useful for understanding entries (slots) in an identification table 112 according to the present modification. Each of FIGS. 15(a), 15(b), 15(c), and 15(d) is representative of a single such entry.

As described earlier, each entry in the sector identification table identifies an erase operation. One entry is appended to the list when a new erase operation is started. Since the list cannot be erased without erasing the other contents of the sector as well, only the last entry is valid.

Figure 15A:
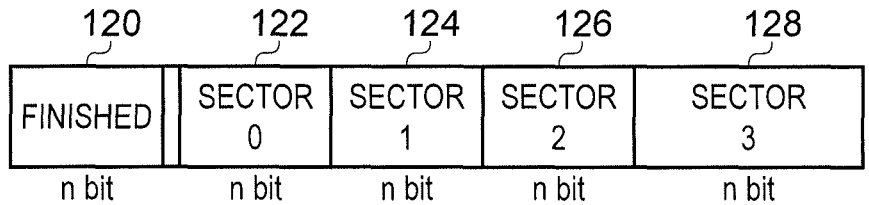
FIG. 15 is a schematic diagram useful for understanding entries in an identification table of the FIG. 14 flash memory.

FIG. 15(a) is useful for understanding the component parts of each entry. Each entry is made up of an erased finish flag 120, which is n-bits wide in the present embodiment, and an n-bit flag 122, 124, 126, 128 per available sector that identifies the sector that is the subject of the erasure procedure concerned (target sector). In FIG. 15(a), items 122, 124, 126 and 128 are provided for "Sector 0", "Sector 1", "Sector 2" and "Sector 3", in line with FIG. 14 (and further flags could be provided for further sectors 110, if more than four sectors 10 are provided).

For simplicity in implementation, each of the flags in FIG. 15(a) is n-bits wide, i.e. they are of the same size. The flags could be of different sizes (e.g. n could be different per flag), which would lead to a more complicated implementation. The flags could also be adjoined with or stored along with other bits, having some other purpose.

As mentioned above, when a sector is erased, all of the entries in its identification table are cleared. This could be represented by all of the bits being false, as opposed to true.

Of course, "true" and "false" denote logical states, and the mapping of these to physical values (high/low or 1/0) depends on the hardware implementation of the flash memory 4. Whereas in FIG. 3(b), and in other earlier Figures, false is represented by erased value "0" and true is represented by written value "1", from here onwards the words "true" and "false" are used themselves.

Figure 15B:
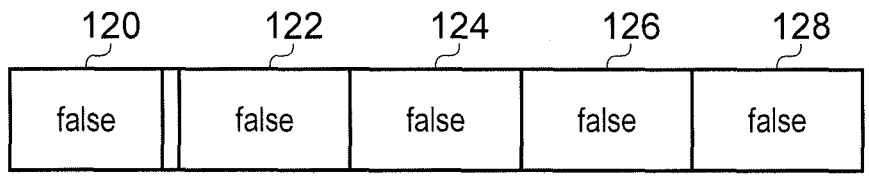
Figure 15C:
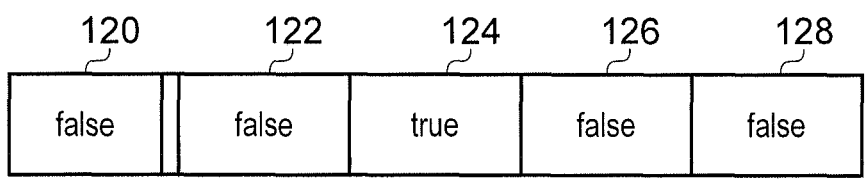
Figure 15D:
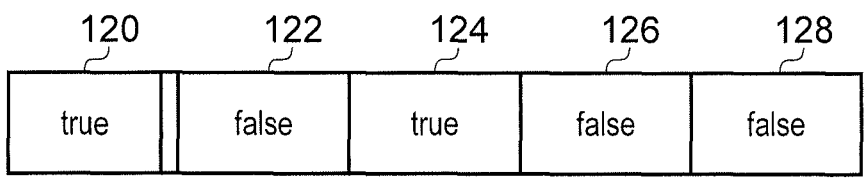

Accordingly, FIG. 15(b) represents the state when an entry is clear and not yet used (since the previous erasure). FIG. 15(c) represents the state when "Sector 1" has been targeted for erasure, "Sector 1" thus being the target sector. Note that the finished flag is false, representing that the erasure procedure is not yet complete. FIG. 15(d) represents the state when "Sector 1", the target sector, has been erased; note that the finished flag is true.

Each of the flags (n bit) is redundancy coded by majority. That is, the flag is interpreted as true when more than $$\frac{n}{2}$$

(i.e. half) of its bits are true and the flag is interpreted as false when more than $$\frac{n}{2}$$

(i.e. half) of its bits are false. Hence each flag tolerates up to $$\left\lfloor \frac{n-1}{2} \right\rfloor$$

corrupted bits. The lower Gaussian-brackets ($\lfloor \ \rfloor$) indicate the floor function. Also, as above, it is assumed that n=2m+1.

The flash erased state denotes an empty and not yet used element (entry) in the table (all flags false). The last (the valid) entry is the first available table entry (the oldest entry in the order of writing entries) that is not finished. A table entry is considered finished when the finished flag is true and not finished when the finished flag is false.

As mentioned above, updates of the sector identification tables 112 are done in a fixed order, e.g. beginning at the sector with least physical address. For the simplification of further description, this order will be assumed to be "Sector 0", "Sector 1", "Sector 2" and then "Sector 3". Since some of the bits of each flag might be in a written state (true) before update of the flag, perhaps due to corruption, update may be done by re-writing.

The erase procedure adopted in the present embodiment will now be described, and it will be appreciated that it shares significant similarities with the erase procedure described earlier.

When a sector is to be erased, a new entry is appended to the tables of all sectors. Each of these new entries is made by writing the n bits (i.e. to true) that identify the target sector. An empty (unused) item or entry in the table has an erased flash value. Hence erasing and resetting the table is done by a single flash erase operation.

Figures 16A, 16B, 16C:
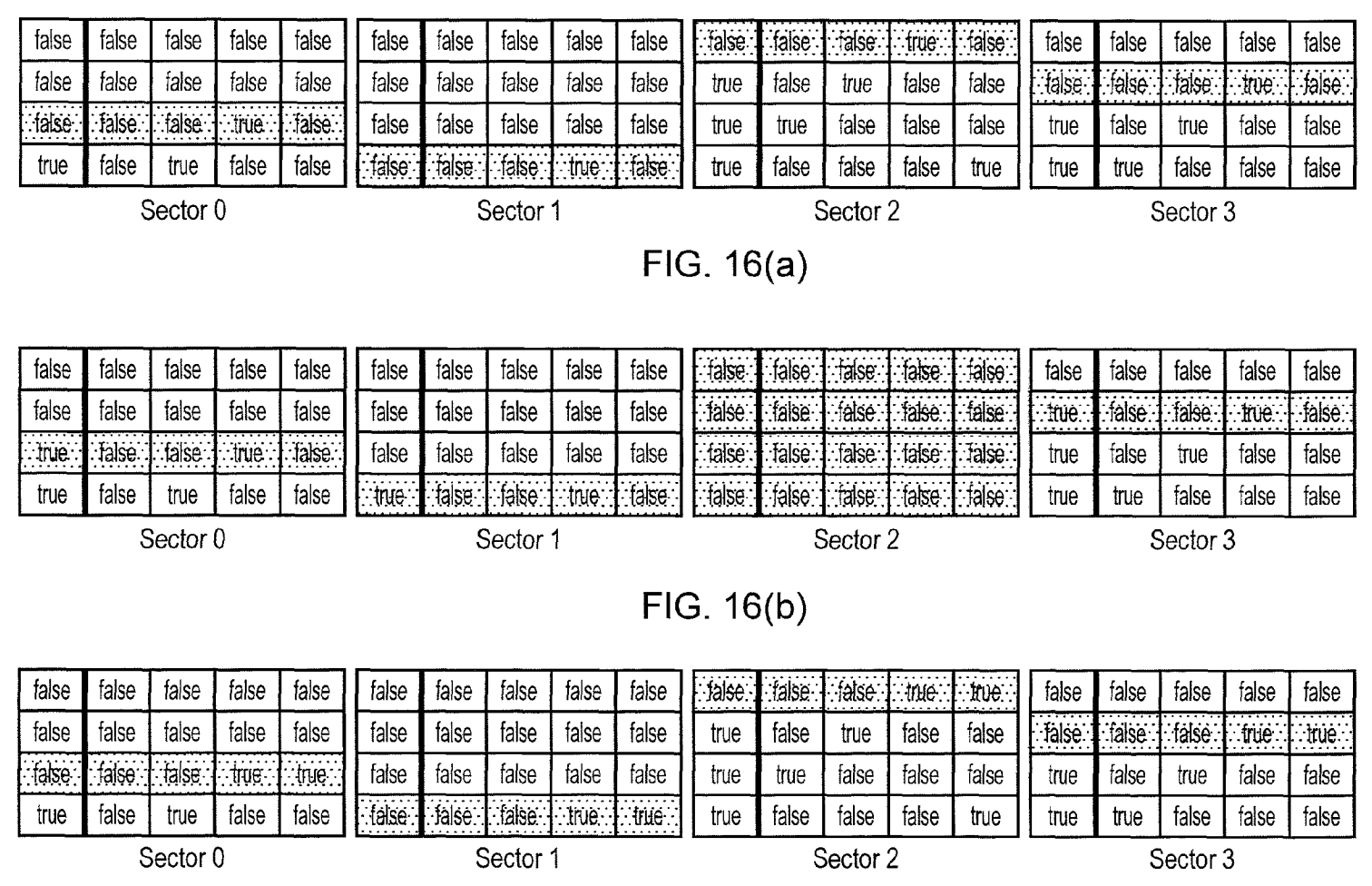

FIG. 16(a) shows an example for erasing a sector. Sector 2 is about to be erased. The last (top most) entries in the tables of all sectors are set to index 2, to indicate that Sector 2 is the target sector. Those last entries are shown emboldened, for ease of identification, and are the first entries reading from the bottom to the top that are not finished (finished flag false). All higher (later) entries have all flags showing as false.

After erasing is finished, the finished flags are set (i.e. to true) of those sectors that have an entry that targets a sector. Note that the identification table of the target sector, Sector 2 in this case, is implicitly cleared during erase and thus does not need to be set to finished.

FIG. 16(b) shows the tables of the example above after erasing was finished. It also shows a valid state before the next erase attempt. The table of the target sector, i.e. Sector 2, is shown emboldened in FIG. 16(b), and all of its flags are false. For the other sectors, the entries that were emboldened in 16(a) are shown with finished flags true in FIG. 16(b). Sector 2 has been erased.

The present embodiment also adopts an abort (or aborting) procedure, referred to also herein as an invalidation procedure. There are cases (identification of such cases will be described later) when the preparation phase of the erase procedure is to be aborted. This is done in the present embodiment in a similar manner to that of the erase procedure, except that marking equivalent to the marking of a target sector is done for several flags (i.e. indicating that more than one sector is the target sector) and that erasing of a physical flash sector is skipped (i.e. not carried out).

Marking in the case of the abort procedure is thus done by writing more than one sector flag to true in each of the table entries. It is irrelevant which of the flags are chosen—preferably the same flags are marked in each table entry. Since the abort procedure described here relies on marking flags (setting them to true), it is to be carried out during the phase of marking the target sector, and potentially only during that phase.

FIG. 16(c) shows an example for aborting an erase preparation: The last (top most) entries in the tables of all sectors are set to index 2 and 3, effectively indicate that Sectors 2 and 3 are the target sector and therefore instead that an abort is required. Those last entries are shown emboldened, for ease of identification, and are the first entries reading from the bottom to the top that are not finished (finished flag false). All higher (later) entries have all flags showing as false.

After marking of all sectors for abort, the finished flags are written (finish flag true) to all the entries that have been marked in the previous step. This is done in the same way as described in the erasure procedure above, but no sector is erased.

The detection of incomplete erase in the present embodiment will now be considered in detail.

As an aside, it is noted that the last (the valid) entry is the first table entry (i.e. the oldest entry or the first arrived at when reading from the bottom in FIG. 16 upwards) that is neither empty nor finished (finished flag false indicates not finished).

The various values which may be found per slot will now be considered, starting with the situation in which the erasure procedure was not interrupted.

When the erase procedure was not interrupted by a power off (i.e. the erase procedure was executed successfully), all slots of the identification tables that were not yet written to since they have been erased are in empty state (this includes all slots of a newly erased sector, and all slots which have not yet been used of the other sectors). This is because:

1. All flags false, because the number of bits that are true per flag is $$\leq m = \frac{n-1}{2}.$$

When the erase procedure was not interrupted by a power off (i.e. the erase procedure was executed successfully), all completely written entries of the identification tables are in a finished state. This is because:

1. The finished flags are true, because the number of bits that are true per flag is $$\geq n - m = \frac{n+1}{2}.$$

2. The flags indicating the target sector are true, because the number of bits that are true per flag is $$\geq n - m = \frac{n+1}{2}.$$

3. The flags indicating sectors other than the target sector are false, because the number of bits that are false per flag is $$\geq n - m = \frac{n+1}{2}.$$

The situation in which the erasure procedure was interrupted will now be considered. The following 16 cases, divided into 4 groups and labelled from 1a to 4c, are identified.

When the erase procedure described above is interrupted by a power off, a read out from flash may show the following cases and their reasons for each entry of the identification tables that was to be written to:

1. The table entry appears empty. All flags are false.
    a. The write attempt to the table slot was not started at all, because the interruption appeared before writing to the respective slot was started (other slots on other sectors may have been written to before).

$$\leq m = \frac{n-1}{2}$$

of all bits in all nags are true because of corruption.
    b. Some but not all bits of the target sector flag have been written in an interrupted attempt to mark a target sector. The number of bits that have been written to true plus the number of bits that were corrupted from false to true minus the number of bits corrupted from true to false is $$< \frac{n}{2}.$$

All other flags have $$\leq m = \frac{n-1}{2}$$

bits true because of corruption.
c. The table slot was erased, because the sector has been fully or partially erased. The number of bits that are true because of corruption is $$\leq m = \frac{n-1}{2}$$

d. The slot was not changed, because some slot that resides previous in the same list was changed to finished. The number of bits that are true because of corruption is $$\leq m = \frac{n-1}{2}.$$

2. The table entry targets one sector, but the finished flag appears false.
   a. Some but not all bits of the target sector flag have been written in an interrupted attempt to mark a target sector. The number of bits that have been written to true plus the number of bits that were corrupted from false to true minus the number of bits corrupted from true to false is $$> \frac{n}{2}.$$

All other flags have $$\leq m = \frac{n-1}{2}$$

bits true because of corruption.
   b. The table slot was partially erased, because erasing of the sector has been interrupted. One sector flag shows $$> \frac{n}{2}$$

true bits, all other flags show $$< \frac{n}{2}$$

bits true. This may include corrupted bits.
   c. All bits of the target sector flag have been written, because marking of a target sector was completed for the respective slot. Writing of the finished flag has not been started. The number of bits in the target sector flag that are true is $$> \frac{n}{2},$$

even with worst case corruption. All other flags have $$\leq m = \frac{n-1}{2}$$

bits true because of corruption.
   d. Some but not all bits of the finished flag have been written in an interrupted attempt to mark a target sector. The number of bits that have been written to true plus the number of bits that were corrupted from false to true minus the number of bits corrupted from true to false is $$< \frac{n}{2}.$$

The number of bits in the target sector flags that are true is $$> \frac{n}{2},$$

even with worst case corruption. All other flags have $$\leq m = \frac{n-1}{2}$$

bits true because of corruption. Note that corruption might have happened after the flag was written so that the finished flag appeared true without corruption and turned to false later on.
3. The table entry targets more than one sector.
   a. The table slot was partially erased, because erasing of the sector has been interrupted. Some sector flags show $$> \frac{n}{2}$$

true bits, other flags may show $$< \frac{n}{2}$$

bits true. This may include corrupted bits.
   b. The table entry was partially written with $$< \frac{n}{2}$$

bits of one of its sector flags set to written state, because of interruption during writing of the flag. Then another sector was targeted and the appropriate sector flag was written. This write attempt might have also been interrupted leaving $$< \frac{n}{2}$$

bits of one of its sector flags set to written state and so on. The last attempt to mark the table entry might have succeeded, resulting in $$> \frac{n}{2}$$

bits of the appropriate sector flag written to true. During or after the last write attempt some bits have turned to corrupted state in a way that one or more of the partially written flags turned from false to true, resulting in more than one sector being targeted by the table entry.

c. The table entry was partially written with $$< \frac{n}{2}$$

bits of one of its sector flags set to written state, because of interruption during writing of the flag. Then another sector was targeted and the appropriate sector flag was written. This write attempt might have also been interrupted leaving $$< \frac{n}{2}$$

bits of one of its sector flags set to written state and so on. The last attempt to mark the table entry has succeeded, resulting in $$> \frac{n}{2}$$

bits of the appropriate sector flag written to true. During or after the last write attempt some bits have turned to corrupted state in a way that one or more of the partially written flags turned from false to true, resulting in more than one sector being targeted by the table entry. Finally an attempt to write the finished flag was interrupted, resulting in some but not all bits of the finished flag written. The number of bits that have been written to true plus the number of bits that were corrupted from false to true minus the number of bits corrupted from true to false is $$< \frac{n}{2}.$$

d. The table entry was forcibly invalidated by writing several flags. All bits of the target sector flags have been written, because marking of the invalid state was completed for the respective slot. Writing of the finished flag has not been started. The number of bits in the target sector flags that are true is $$> \frac{n}{2},$$

even with worst case corruption. All other flags have $$\leq m = \frac{n-1}{2}$$

bits true because of corruption.

e. The table entry was forcibly invalidated by writing several flags. All bits of the target sector flags have been written, because marking of the invalid state was completed for the respective slot. The number of bits in the target sector flags that are true is $$> \frac{n}{2},$$

even with worst case corruption. All other flags have $$\leq m = \frac{n-1}{2}$$

bits true because of corruption. Finally an attempt to write the finished flag was interrupted, resulting in some but not all bits of the finished flag written. The number of bits that have been written to true plus the number of bits that were corrupted from false to true minus the number of bits corrupted from true to false is $$< \frac{n}{2}.$$

4. The finished flag appears true.
   a. Some but not all bits of the finished flag have been written in an interrupted attempt to finish the table entry. The number of bits that have been written to true plus the number of bits that were corrupted from false to true minus the number of bits corrupted from true to false is $$> \frac{n}{2}.$$

b. All bits of the finished flag have been written. The number of bits in the target sector flag that are true is $$> \frac{n}{2},$$

even with worst case corruption. The number of bits in the finished flag that are true is $$> \frac{n}{2},$$

even with worst case corruption.
c. The table slot was partially erased, because erasing of the sector has been interrupted. The finished flag shows $$> \frac{n}{2}$$

true bits. This may include corrupted bits.

It is noted that case 1.*d*. does not differ from the non-interrupted case. Cases 1.*c*., 2.*b*., 3.*a*., 4.*c*. can appear only once (one) at a time, because the condition is partial erase and the effects are disjunctive. Cases 3.*b*. and 3.*c*. can appear only on the sector that is the first to be updated in the fixed order.

Now that possible values per slot or entry have been considered, possible values over all valid entries will be considered. That is, possible values across the valid entries of all sectors will be considered.

When the erase procedure described above is interrupted by a power off, a read out from flash can show the following states and their causes in the last entries of the identification tables.

Illustrations of possible combinations of the above cases (labelled 1*a* to 4*c*) for each of the states (labelled 1A to 9A) detailed below are provided in FIG. 17, and referred to individually as each such state is explained below. In each combination, a row of boxes is provided representing the last (valid) entries of corresponding sectors, the left-most box thus representing the last entry for Sector 0, the next box to the right representing the last entry for Sector 1, the next box to the right representing the last entry for Sector 2, and so on. Each such box is labelled as to its case.

Figure 17A:
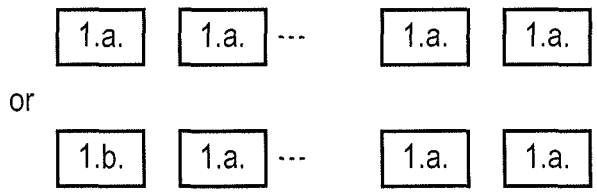
FIG. 17 illustrates possible combinations of entries in the identification tables of the sectors which may be encountered following an interruption.
Figure 17B:
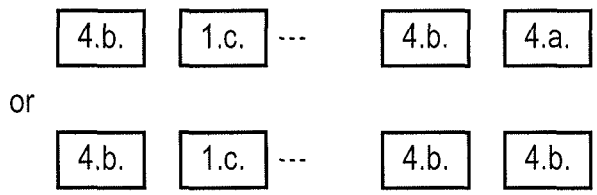
Figure 17C:
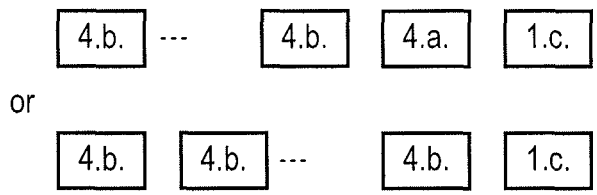
Figure 17D:
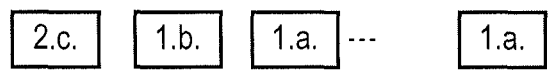
Figure 17E:
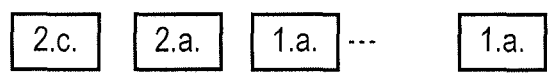
Figure 17F:
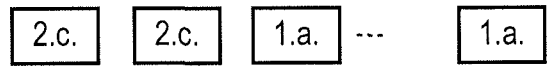
Figure 17G:
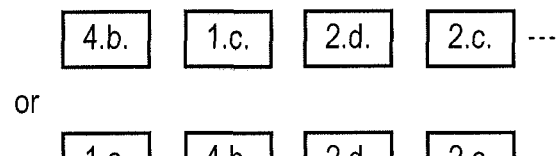
Figure 17H:
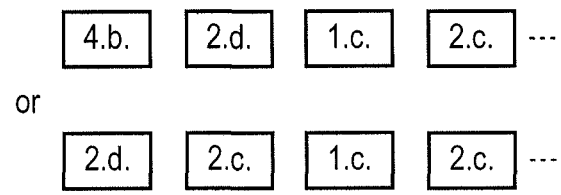
Figure 17I:
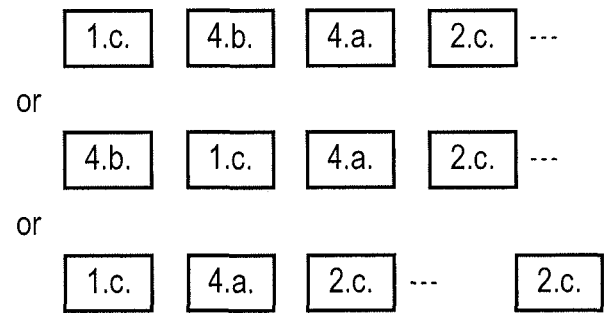
Figure 17J:
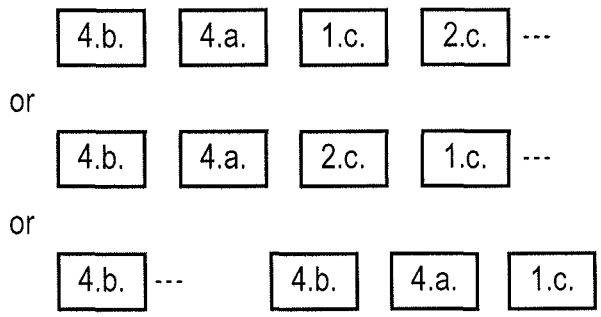
Figure 17K:
Figure 17L:
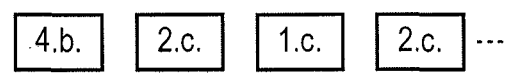
Figure 17M:
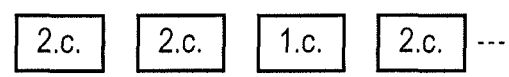
Figure 17N:
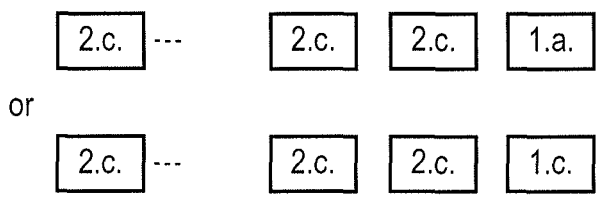
Figure 17O:
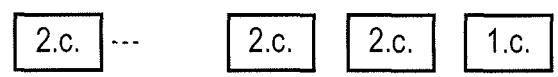
Figure 17P:
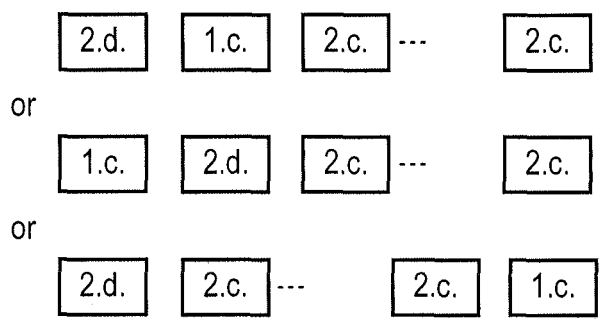
Figure 17Q:
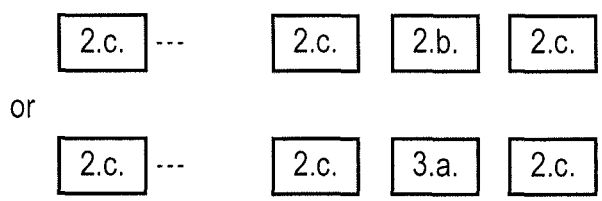
Figure 17R:
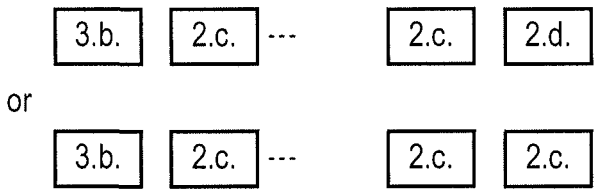
Figure 17S:
Figure 17T:
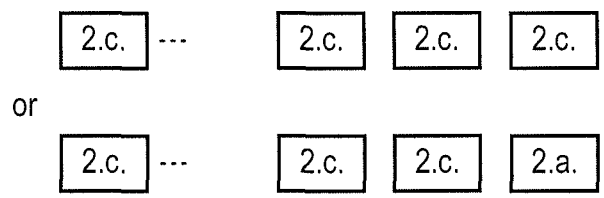
Figure 17U:
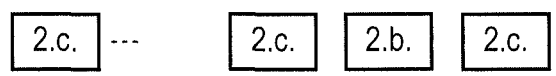
Figure 17V:
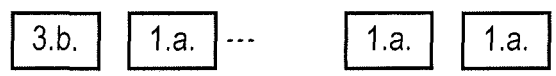
Figure 17W:
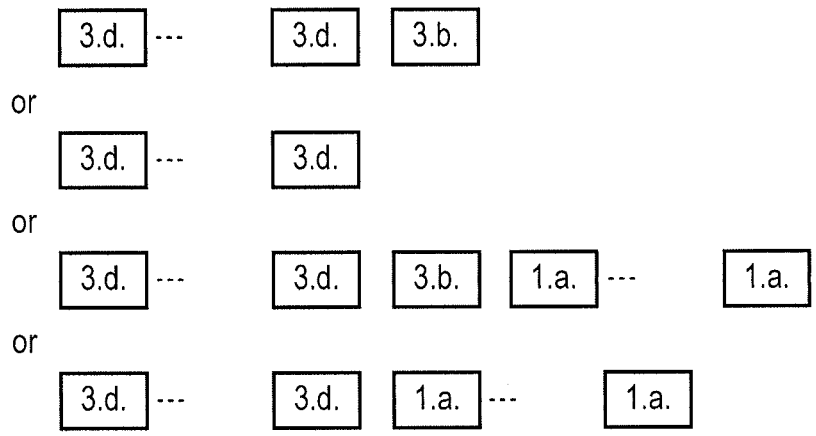
Figure 17X:
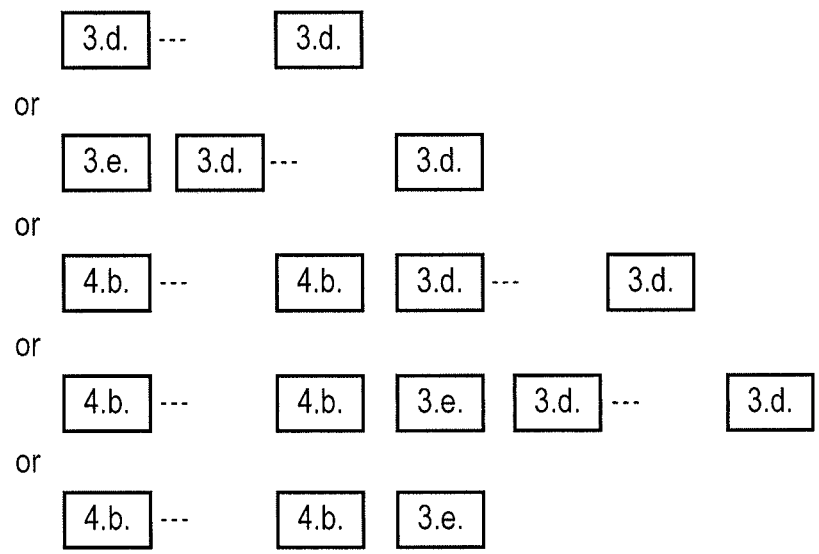
Figure 17Y:
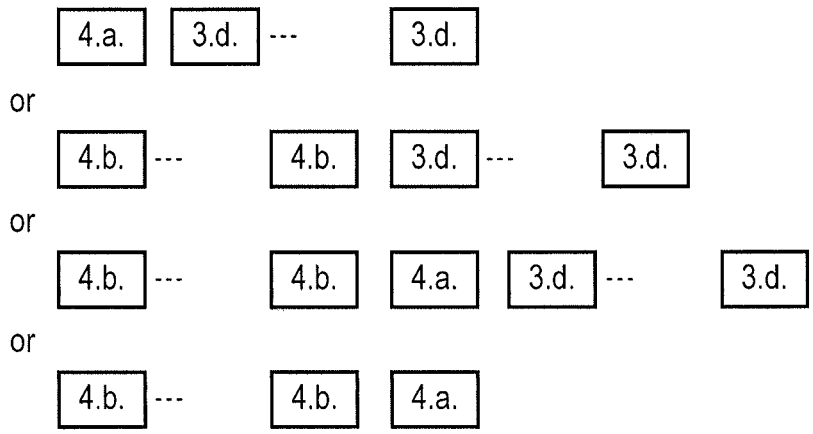
Figure 17Z:
Figure 17:
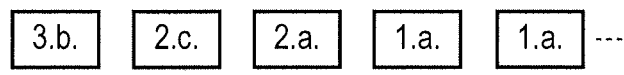
Figure 17:
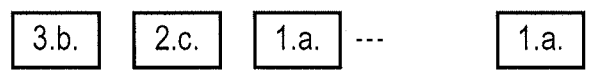
Figure 17:
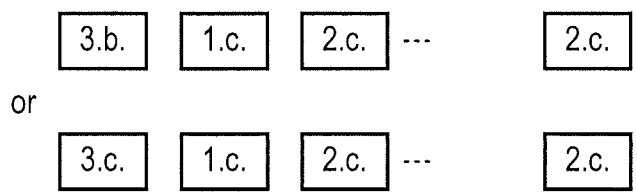
Figure 17:
Figure 17:
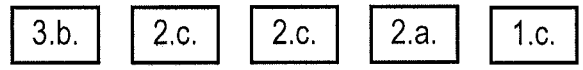
Figure 17:
Figure 17:
Figure 17:
Figure 17:
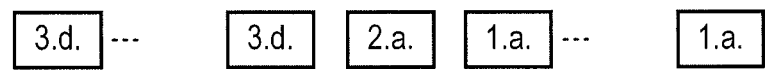
Figure 17:
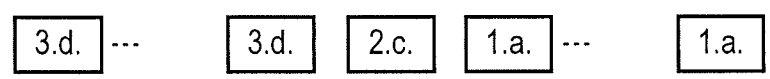
Figure 17:
Figure 17:

In some of FIGS. 17(*a*) to 17(*zg*), more than one row is presented, and each such row represents a different individual combination (for this reason, the word "or" is provided between each row). The columns in such Figures are not intended to indicate slots appearing above/below one another in the same sector.

The states are as follows.
1. No sector is targeted for erase
   A. The first write attempt to the first table was interrupted and no or some but not all bits of the sector flag were written and the number of true bits in that flag is $$< \frac{n}{2}.$$

This may include corrupted bits. The first sector contains a last entry of case 1.*a*. or 1.*b*. and all other sectors contain last entries of case 1.*a*. See FIG. 17(*a*).
   B. The last write attempt to the last table was interrupted and some or all bits of the finished flag were written and the number of true bits in that flag is $$> \frac{n}{2}.$$

This may include corrupted bits. There are the following scenarios:
      i. The last sector contains a last entry of case 4.*a*. or 4.*b*., there is one prior sector that contains a last entry of case 1.*c*. and all other sectors contain last entries of case 4.*b*. See FIG. 17(*b*).
      ii. The last entry is of case 1.*c*. and the last but one entry is of case 4.*a*. or 4.*b*. and all other sectors contain last entries of case 4.*b*. See FIG. 17(*c*).
2. One or more sectors target the same sector for erase and 2 or more sectors do not target any sector, no sector targets more than one sector
   A. Some but not all table entries that were intended to be set to a target sector were successfully written, interruption occurred before completion of all intended entries to the tables. There are the following scenarios:
      i. There is one sector that contains a last entry of case 1.*b*., all prior sectors (at least one) contain a last entry of case 2.*c*. and all succeeding sectors (at least one) contain a last entry of case 1.*a*. See FIG. 17(*d*).
      ii. There is one sector that contains a last entry of case 2.*a*., all prior sectors (if any) contain a last entry of case 2.*c*. and all succeeding sectors (at least two) contain a last entry of case 1.*a*. See FIG. 17(*e*).
      iii. There is a sequence of one or more sectors containing a last entry of case 2.*c*. at the beginning and a sequence of two or more sectors containing a last entry of case 1.*a*. afterwards. See FIG. 17(*f*).
   B. Some but not all table entries that were intended to be finished were successfully written, interruption occurred before completion of all intended entries to the tables. There are the following scenarios:
      i. There is one sector that contains a last entry of case 2.*d*., there is one prior sector that contains a last entry of case 1.*c*. and all other prior sectors (if any) contain last entries of case 4.*b*. The succeeding sectors (at least one) contain last entries of case 2.*c*. See FIG. 17(*g*).
      ii. There is one sector that contains a last entry of case 2.*d*., all prior sectors (if any) contain entries of case 4.*b*. There is one succeeding sector that contains a last entry of case 1.*c*. and all other succeeding sectors (at least one) contain a last entry of case 2.*c*. See FIG. 17(*h*).
      iii. There is one sector that contains a last entry of case 4.*a*., there is one prior sector that contains a last entry of case 1.*c*. and all other prior sectors (if any) contain last entries of case 4.*b*. The succeeding sectors (if any) contain last entries of case 2.*c*. See FIG. 17(*i*).
      iv. There is one sector that contains a last entry of case 4.*a*., all prior sectors (at least one) contain entries of case 4.*b*. There is one succeeding sector that contains a last entry of case 1.*c*. and all other succeeding sectors (if any) contain a last entry of case 2.*c*. See FIG. 17(*j*).
      v. There is a sector that contains a last entry of case 1.*c*., all prior sectors (if any) contain a last entry of case 4.*b*. The succeeding sectors are a sequence of zero or more sectors containing a last entry of case 4.*b*. followed by a sequence of sectors (at least one) containing a last entry of case 2.*c*. There is at least one sector that contains a last entry of case 4.*b*. See FIG. 17(*k*).

vi. There is a sector that contains a last entry of case 1.c., all succeeding sectors (at least one) contain a last entry of case 2.c. The preceding sectors are a sequence of sectors (at least 1) containing a last entry of case 4.b. followed by a sequence of sectors (at least one) containing a last entry of case 2.c. See FIG. 17(l).
3. All but one sectors target the same sector for erase, the targeted sector targets no sector
  A. Erasing of the target sector was interrupted. The targeted sector contains a last entry of case 1.c., all other sectors contain a last entry of case 2.c. See FIG. 17(m).
  B. The targeted sector is the last sector in marking order and marking of the sector flags was interrupted. The targeted sector contains a last entry of case 1.a. or 1.c., all other sectors contain a last entry of case 2.c. See FIG. 17(n).
  C. Marking of the finished flags was interrupted before the first flag was written. The target sector contains all entries of case 1.c, all other sectors contain a last entry of case 2.c. See FIG. 17(o).
  D. Marking of the finished flags was interrupted during writing of the first flag. The target sector contains all entries of case 1.c, the first sector that is not the target sector contains a last entry of case 2.d, all other sectors contain a last entry of case 2.c. See FIG. 17(p).
4. All but one sectors target the same sector for erase, the targeted sector targets some other sector or multiple sectors
  A. Erasing of the target sector was interrupted. The targeted sector contains a last entry of case 2.b. or 3.a., all other sectors contain a last entry of case 2.c. See FIG. 17(q).
  B. Marking of the target sector was interrupted at least twice and corruption occurred during or after the last sector was marked. The last sector contains a last entry of case 2.c. or 2.d., the first sector contains a last entry of case 3.b. and all intermediate sectors contain a last entry of case 2.c. See FIG. 17(r).
  C. Marking of the first target sector was interrupted at least once, then a new erase procedure was interrupted during erase and corruption occurred during or after the erase. The first sector contains a last entry of case 3.b., the target sector contains a last entry of case 2.b., which targets the same sector as the remaining sectors, and all remaining sectors contain a last entry of case 2.c. See FIG. 17(s).
5. All sectors target the same sector for erase
  A. The targeted sector's identification table was not full before start of erase and marking of the sector flags was interrupted. The last sector contains a last entry of case 2.a. or 2.c., all other sectors contain a last entry of case 2.c. See FIG. 17(t).
  B. Erasing of the target sector was interrupted. The targeted sector contains a last entry of case 2.b. all other sectors contain a last entry of case 2.c. See FIG. 17(u).
6. One or more sectors target two or more sectors, all other sectors target no sector
  A. Setting of the sector flags was interrupted several times during writing of the first flag. The first sector contains a last entry of case 3.b., all other sectors contain entries of cases 1.a. See FIG. 17(v).
  B. Invalidation (i.e. the abort procedure) of the table entries was interrupted. There is sector that has a last entry of case 3.b. or 3.d., all previous sectors have a last entry of case 3.d and all succeeding (zero or more) sectors have a last entry of case 1.a. See FIG. 17(w).
  C. Writing of the finishing flags of a previous invalidation procedure (abort procedure) was interrupted. There is sector that has a last entry of case 3.d. or 3.e. All previous sectors (zero or more) have a last entry of case 4.b and all succeeding sectors (zero or more) have last entry of case 3.d. See FIG. 17(x).
  D. Writing of the finishing flags of a previous invalidation procedure (abort procedure) was interrupted. There is sector that has a last entry of case 4.a. or 4.b. All previous sectors (zero or more) have a last entry of case 4.b and all succeeding sectors (zero or more) have last entry of case 3.d. See FIG. 17(y).
7. One sector targets two or more sectors, one or more sectors target the same sector for erase and 2 or more sectors do not target any sector
  A. The first sector was rewritten and corruption occurred afterwards. Some but not all table entries that were intended to be set to a target sector were successfully written, interruption occurred before completion of all intended entries to the tables. There are the following scenarios:
    i. The first sector contains a last entry of case 3.b. There is one sector that contains a last entry of case 1.b., all remaining prior sectors (at least one) contain a last entry of case 2.c. and all succeeding sectors (at least one) contain a last entry of case 1.a. FIG. 17(z).
    ii. The first sector contains a last entry of case 3.b. There is one sector that contains a last entry of case 2.a., all remaining prior sectors (if any) contain a last entry of case 2.c. and all succeeding sectors (at least two) contain a last entry of case 1.a. See FIG. 17(za).
    iii. The first sector contains a last entry of case 3.b. There is a sequence of one or more sectors containing a last entry of case 2.c. starting from the second sector and a sequence of two or more sectors containing a last entry of case 1.a. afterwards. See FIG. 17(zb).
  B. The first sector was rewritten and corruption occurred afterwards. Erasing of some other sector was successfully finished and writing of the finished flag of the first sector was interrupted. The first sector is of case 3.b. or 3.c., one sector is of case 1.c., and all other sectors are of case 2.c. See FIG. 17(zc).
8. One sector targets two or more sectors, all but two sectors target the same sector for erase, the targeted sector targets no sector
  A. Erasing of the target sector was interrupted. The first sector contains a last entry of case 3.b. The targeted sector contains a last entry of case 1.c., all other sectors contain a last entry of case 2.c. See FIG. 17(zd).
  B. The targeted sector is the last sector in marking order and marking of the sector flags was interrupted. The first sector contains a last entry of case 3.b. The last sector contains a last entry of case 1.c., the last but first sector contains a last entry of case 2.a or 2.c, all other sectors contain a last entry of case 2.c. See FIG. 17(ze).
  C. Marking of the finished flags was interrupted before the first flag was written. The first sector contains a last entry of case 3.b. or 3.c., the target sector contains all entries of case 1.*c*, all other sectors contain a last entry of case 2.*c*. See FIG. 17(*zf*).

9. Two or more sectors target two or more sectors, one sector targets one sector, all other sectors target no sector
    A. Invalidation of the table entries was interrupted. There is a sector that has a last entry of case 2.*a*. or 2.*c*. All previous sectors (at least two) have a last entry of case 3.*d*. All succeeding sectors (zero or more) have a last entry of case 1.*a*. See FIG. 17(*zg*).

Action to be taken in the above 9 states will now be considered, i.e. action (e.g. recovery action) in order to continue operation on incomplete erase.

Firstly, the situation if no interruption of erase is detected will be considered. This situation corresponds to Groups A and E as described in relation to FIG. 5. State 1 can be treated as if no erase procedure was interrupted, because the sectors are in the same state as if no erase procedure was ongoing. If this situation is detected at start-up then the last finished flag of the last sector to be written to (in the order in which the sectors are written to) should be re-written to make sure that this flag does not turn back to false due to corruption (case 2.*d*.). The last sector to be written to will be the last sector in the order of sectors if any other sector has just been erased. If, however, the last sector in the order of sectors has itself just been erased, then the last sector to be written to will be the last sector but one (i.e. the sector prior to the last one) in the order of sectors.

Secondly, the situation if interruption of physical flash erase is detected will be considered. This situation corresponds to Group C as described in relation to FIG. 5. In states 3, 4, 5 and 8, the target sector that was interrupted during erase can be identified by majority decision. The erase procedure for that target sector has to be repeated before another sector can be erased. In the meantime, reading from the target sector (in the sense of reading its pages or determining its age) is not possible, because the contents are probably corrupted. Of course, reading of the identification table of the target sector is done to detect the state. All other sectors can be read.

Thirdly, the situation if interruption of the preparation phase (setting of sector flags) is detected will be considered. This situation corresponds to Group B as described in relation to FIG. 5. If setting of the sector flags was interrupted and the target sector can be clearly identified (state 2.A.), the erase procedure should repeated. This situation (state 2.A.) may be distinguished from the situation where setting of the finished flags was interrupted (state 2.B.) by looking at the last sector in the order of sectors when ignoring the target sector. The last sector in the order of sectors when ignoring the target sector will actually be the last sector in the order of sectors if any other sector is the target sector (the target sector may have just been erased in the case of state 2.B.). If the last sector in the order of sectors is the target sector, then the last sector in the order of sectors when ignoring the target sector will be the last sector but one sector (i.e. the sector prior to the last one) in the order of sectors. In the present situation (state 2.A.: setting of the sector flags was interrupted), the last sector in the order of sectors when ignoring the target sector contains a last entry that has no flag set to true. In the present situation (state 2.A.), the target sector may be identified by looking at the first sector in the order of sectors or by majority looking at those sectors that target a sector or by looking at any sector that is targeting a sector. As an aside, a relatively simple method for distinguishing state 2.A. from state 2.B. is explained below.

There is a chance that the preparation phase was interrupted several times, resulting in the situation that there is one sector targeting multiple sectors and there is either no majority for a target sector or it is not certain whether the same majority would be identified if interruption occurs during the current erase procedure (states 6.A., 7.A.). In this situation, the erase procedure has to be aborted as described above by marking those sector flags that are already marked in the first entry, which appears to have several sector flags true. Rewriting is required for the flags.

Fourthly, therefore, the situation if interruption of the abort phase (abort procedure) is detected will be considered. Although this situation does not explicitly appear in FIG. 5, it could be appreciated as being a procedure in which at least two sectors are targeted (see step S4), the erasing skipped (see step S6) and the finish flags set (see step S8). If setting of the abort flags was interrupted (states 6.B. and 9), the abort procedure should be repeated by marking those sector flags that are already marked in the first entry, which appears to have several sector flags true. Rewriting should be carried out for at least the sector that was the last to be written to before the interruption.

Fifthly, the situation if interruption of the post-processing phase (setting of finished flags) is detected will be considered. This situation corresponds to Group D as described in relation to FIG. 5. If setting of the finished flags was interrupted (states 2.B., 6.C., 6.D. or 7.B.) then setting of the finished flags should be repeated. Erasing should not be permitted in this situation. This situation (e.g. state 2.B.) can be distinguished from the situation when setting of the target flags was interrupted (state 2.A. as discussed above) by looking at the first sector in the order of sectors. In the present situation (state 2.B.: setting of the finished flags was interrupted), the first sector targets no sector (because its finished flag is true in the case that some other sector has been erased, or because the first sector itself has been erased and all of its entries are empty). All entries that target a sector and have the finished flag false should be written to finished flag true. The entry that appears to be the last that had the finished flag written before interruption has to be rewritten to make sure that its finished flag does not turn back to false due to corruption (case 2.*d*.). This entry is identified as the last entry of the last sector in the order of sectors that has a last entry that has the finished flag true.

It is noted that, in terms of follow-up states, interruption of any of the finalizing or recovery tasks described in the above five situations will again lead to one of the states 1 to 9.

Due to corruption, interruption of the abort procedure may again lead to a state that identifies one sector as target for erase. In this case, it is guaranteed that the target sector was already selected as target sector in a previous erase procedure that has been interrupted. This is because the abort procedure will attempt to write the sector flags targeting sectors that have been selected as target sector in a previously interrupted erase procedure (case 3.*b*.).

The abort procedure is triggered (only) if there were several interrupted attempts to erase different sectors. This cannot happen if the erase procedure was triggered because of a sector running short on sector identification slots. In this situation, interruption of erase will always attempt to continue the erase procedure for the same sector, i.e. each erase procedure can be interrupted and continued an unlimited number of times.

As with earlier embodiments described in connection with FIGS. 1 to 12, the present embodiment described in connection with FIGS. 13 to 17 store data within each sector in a dynamic manner.

Unlike in hardware EEPROM, in line with earlier embodiments, the emulated memory of this embodiment is not organized as a continuous range of fixed-size data words. Instead it is organized as a discontinuous range of virtual pages (each virtual page may occupy a plurality of physical pages of the flash memory). The virtual pages ("pages", for simplicity) are addressed by a unique index (a page ID), and, in this embodiment, have the same size. The page size may be scaled to an arbitrary value, for example by static configuration of supporting software. A mapping of virtual blocks of arbitrary size to an integer number of pages may be done by known means, in a higher layer.

In the present embodiment, each sector contains (i.e. is organised into) a set of page slots, for example as defined by supporting software, which can store one virtual page each. A page slot in this embodiment comprises one entry in the page association table of the sector concerned, and a block of memory that is big enough to store the virtual data of that page.

The dynamic-allocation methodology explained above in connection with FIG. 6 is also employed in the present embodiment, and is thus not repeated here. That is, the relationship between entries in a page association table and page slots in the corresponding page slots region is as before. In this embodiment, the relationship is static so that a particular entry in a page association table corresponds to a particular predetermined page slot in the corresponding page slots region.

Each entry in a page association table denotes the state of the corresponding page slot. The states "free", "allocated", "valid", and "invalid" are also as before.

Figure 18:
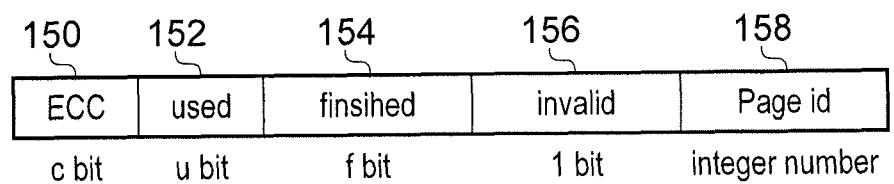
FIG. 18 is a schematic diagram useful for understanding entries in an association table (page association table) of the FIG. 14 flash memory.

FIG. 18 is a schematic diagram useful for understanding entries in a page association table according to the present embodiment. Although similar to those discussed above in connection with FIG. 7, it will be noted that there are differences.

FIG. 18 is representative of a single such entry, and is useful for understanding the component parts of each entry. Each entry is made up of an ECC (Error correcting or correction code) portion 150, a used flag 152, a finished flag 154, an invalid flag 156, and a page ID 158. Naturally, as with the other layouts indicated herein, the order of items in FIG. 18 may differ from that of a corresponding physical implementation. The physical implementation may have additional (e.g. reserved) bits.

The ECC portion 150 is for redundancy bits that can be used to increase the hamming distance of all completely written and corruption-free entries. The size (c bits) is dependent on the algorithm used for error detection and/or error correction, and may therefore vary from implementation to implementation. The protection by this algorithm may be given when the table entry is erased. The error correction/detection algorithm may protect all bits of the table entry including the ECC bits.

The used flag 152 is a multi-bit flag of size u bits, indicating if the page slot is free or not, with an erased state (false) in this embodiment indicating that the page slot is free. One or more bits in written state (true) mean used in this embodiment. Re-writing of the used flag is possible in this embodiment.

The invalid flag 156 is a 1-bit flag indicating whether the page slot (i.e. whether the page, i.e. the data for a page identified by a page ID) is valid or invalid, with an erased state (false) in this embodiment indicating that the page slot is valid.

The finished flag 154 is a multi-bit flag of size f bits indicating whether the page slot is allocated or not, with all bits in the written state (true) in this embodiment meaning valid or invalid. One or more bits in the erased state (false) means allocated or free in this embodiment. Re-writing of the finished flag is possible.

The page ID 158 is an integer number being an index that uniquely identifies the virtual page that is stored in the page slot.

Generation and evaluation of ECC may be transparent to the software if the hardware provides that: (a) the used flag and finished flag can be read without error correction; (b) the used flag and finished flag can be written without writing ECC; and (c) the ECC can be generated and written without writing the data that was the source for generating the ECC.

The methodology set out in connection with FIGS. 6 to 12 applies similarly here. In the present embodiment, a modified (or new) page is always written to the first free page slot, with a corresponding entry into the relevant part of the page association table concerned. Thus, the ID of the page is stored to the relevant entry in the page association table, and the virtual data is stored to the page slots region in the corresponding page slot.

For each page, only the last (most recent) occurrence in a page slot (i.e. in the newest page slot of those for that page) that is either valid or invalid represents the current state and content of that page. Older versions of a page (i.e. in an older page slot) are implicitly ignored. Hence it is advantageously not needed to invalidate old page slots if the same page is valid or invalid in a newer slot.

A page that is not referenced in any page slot is considered non-existent in the virtual memory. A read attempt may lead to an error or will return default values, depending on the error notification paradigm adopted (for example by the supporting software).

An invalid state of a page slot denotes that the page concerned was virtually erased, i.e. the page was reverted to a non-existent state. An invalidated page may be excluded from copy when the sector needs to be erased, hence it can reduce memory consumption in the future.

The fact that pages can be added or removed during runtime, without the need to reconfigure the software makes this method dynamically scalable.

The procedure by way of which data is stored in the sectors in this embodiment will now be considered, and it will be appreciated that this is closely similar to the corresponding procedure considered earlier herein.

When a page is to be written to a sector the following sequence is executed.

The first free page slot is allocated by writing all bits of the used flag 152 (i.e. to true) in the corresponding entry of the corresponding page association table. Other bits are not written.

The page ID is then written to the same entry (slot) in the page association table in an intermediate (i.e. neither the first or last) write access.

Optionally the invalid flag is then written in an intermediate (i.e. neither the first or last) write access. This step is needed (only) if the page is to be invalidated. If the page is to be overwritten, the step can be skipped.

ECC is then written in an intermediate (i.e. neither the first or last) write access. The redundancy bits are generated over the final state of the table entry, although the remaining items of the table entry are not written yet. That is, in the present embodiment the redundancy bits are calculated for all used bits written, all finished bits written, the page ID written and optionally the valid flag written.

The content of the virtual page is then written to the contents area of the page slot in intermediate (i.e. neither the first or last) write accesses. This data should be protected by additional ECC, for example also located in the contents area. The writing order may vary from implementation to implementation.

Then, the page slot is marked valid/invalid by writing all bits of the finished flag to the page association table entry in a final write access.

The intermediate write accesses may be in any order and may be combined to fewer accesses if possible.

As with the other procedures described herein, it is possible that the data storage procedures could be interrupted by an interruption event such as a power off.

Such interruption could result in the page slot, and corresponding entry, being left in one of a number of different states.

The page slot could be "free" (finished flag false, used flag false). Interruption may have occurred before all bits of the used flag could be written, but the number of written bits plus the number of corrupted bits may be small enough to be corrected by the ECC based correction. This can be detected by reading the used flag with ECC based correction.

The page slot could be "allocated" (used flag true, finished flag false). Interruption may have occurred during writing of the used flag and the number of written bits including corrupted bits may be too large to be corrected by the ECC based correction. Interruption may have occurred after writing of the used flag but before writing of the finished flag. Interruption may have occurred during writing of the finished flag and the number of written bits including corrupted bits may not be large enough to be corrected by the ECC based correction.

The page slot could be "finished" (finished flag written). Interruption may have occurred before all bits of the finished flag could be written, but the number of written bits minus the number of corrupted bits may be large enough to be corrected by the ECC based correction. This can be detected by reading the finished flag with ECC based correction.

In the first case ("free"), all bits that have been possibly written may be re-written in a succeeding write attempt. Therefore the page slot may be reused; i.e. it can be safely considered free.

In the second case ("allocated"), some but not all bits of the page slot have been written. The page slot may neither be reused nor read. The page slot should be ignored.

In the third case ("finished"), it is uncertain whether writing was incomplete or all bits have been written, but some of them were corrupted. Therefore the finished flag of table entries of this kind should be re-written. Afterwards, it is certain that all bits have been written and the ECC based correction can be trusted. This step should be done only at start-up and only for the last entry and all further read and write attempts should wait until re-writing has finished. In this case it is made sure that all previous entries have been completely written.

The storage procedure and methodology for dealing with interruption (and an algorithm or algorithms therefor) will never identify a page as valid that is incompletely written, because the first and second cases ("free" and "allocated") can be identified and the third case ("finished") is made sure to be completely written. Such an The algorithm will never attempt to write to memory that was completely or incompletely written (second and third cases), except where the same bits are re-written again (first case).

Further the algorithm will never identify an outdated version of a page as the current version, because the implicit invalidation of all older versions is indicated by the same condition that indicates the validity of the newer data.

All data, including flags and ECC bits, are protected to error correction and/or error detection by the used error correction/detection algorithm once incomplete write has been ruled out.

Note that consecutive interruption of the write procedure might fill up all tables with allocated page slots. As a consequence the virtual memory might enter a state where it is impossible to write further data. This state is safely detected in the present embodiment and none of the constraints for safety against power off (as discussed earlier) is violated.

In an adaptation of the present embodiment, hardware support is provided in order to speed up evaluation of the association tables.

Figure 19:
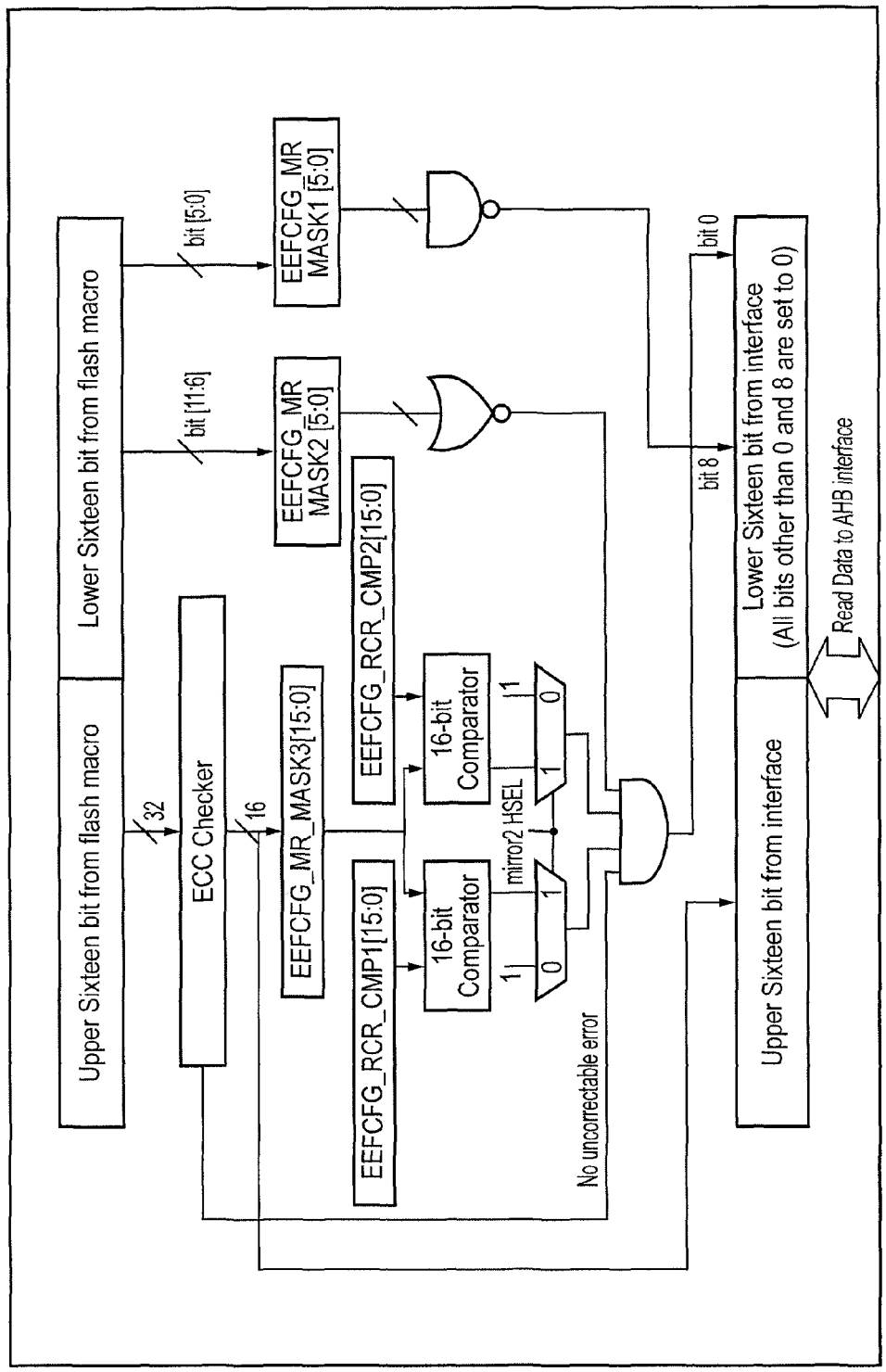
FIG. 19 is a schematic diagram of data manipulation hardware suitable to provide hardware support in order to speed up evaluation of the association tables.

Reference is made to FIG. 19, which is a schematic diagram of data manipulation hardware suitable to provide the support. There is provided a hardware unit located in the flash hardware interface. The hardware unit evaluates a given table entry and retrieves the status of the page slot. This is done by manipulation of the read-out data from flash, which is then presented on an additional address mirror.

The schematic overview in FIG. 19 of such a hardware extension assumes 32 bit table slots and 1 bit error correction+2 bit error detection per 32 bit word.

The hardware unit provides registers to select a range of page IDs given by the smallest and the largest ID in range.

The hardware unit provides the following interface for read on the data manipulation mirror:

1. used status (1 byte):
   0 if the table slot is free,
   1 if the table slot is not free.
   The used status is shown on bit 8 of the AHB (Advanced High-performance Bus) interface in FIG. 19. It is calculated from the used flag (as explained above), which is located on flash macro bits 0 to 5 in the FIG. 19 example.

2. Relevant status (1 byte):
   1 if the table slot's finished flag is set and ECC detected no error and the page ID is in range. 1 indicates that the page was completely written, is not corrupted and lies in the selected range. Page slots that have relevant status 1 are valid or invalid and lie within the specified search range.
   0 else. Relevant status 0 indicates that the page slot does not contain a valid page within the specified search range. Such page slots can be ignored.
   The "relevant status" is shown on bit 0 of the AHB interface in FIG. 19. It is calculated from the finished flag (as explained above), which is located on flash macro bits 6 to 11 in the same Figure, the outcome of the ECC check for the whole page slot and the range check.

3. Page ID and valid flag (2 bytes):
   A copy of the page ID and valid flag
   The page ID and valid flag are shown on bits 16 to 31 of the AHB interface in FIG. 19. They are calculated by the error correction from the page id and valid flag, which is located on flash macro bits 16 to 31 in the same Figure.

The evaluation logic implemented by the data manipulation mirror allows supporting to be simpler and thus reduces the number of instructions (masking, shifting, comparing)

needed to evaluate each table slot. The implementation as an address mirror minimizes the number of bus transactions needed to trigger the calculation. This results in a significant speed-up in table evaluation.

The present disclosure is considered to extend to the following points.

1. The invention extends to the mechanism for dynamic allocation of sectors, i.e. the order in which data is stored to different sectors is calculated during run time depending on the amount of legal data stored on the sectors. The order is neither bound to virtual addresses nor is it known a priori. This is done to reduce the amount of memory that is needed to be copied from one sector to another in order to be able to erase the one sector.

2. The invention extends to the mechanism for safety against power off during erase procedure by the use of tables located on other sectors than the sector that is being erased. And all of the sectors used can be safely erased by the same mechanism. And the erase procedure can be interrupted an unlimited number of times without preventing the mechanism from being able to be continued. That is, there is no need for additional non-volatile memory, nor is there a risk of loosing or corrupting virtual data by a power off, nor can the mechanism be dead-locked by any number of interruptions by power off.

3. The invention extends to the combination of the dynamic allocation of sectors as in point 1 above with a dynamic allocation within a sector by means of association tables. This combination results in a full dynamic allocation.

4. The invention extends to the combination of the mechanism as in point 2 above with methods for writing data within one sector in a safe way that is based on flags located on the same sector and a special execution sequence. The combination results in a memory emulation that is safe against power off, and grants write access where the sum of written and rewritten data is greater than the sum of available memory. That is, by use of erase, a sector can be rewritten again and again, resulting in more data being written and re-written than the size of the sector.

5. The invention extends to the mechanism for data lookup by construction of a lookup table for a predefined virtual address range from the association tables in flash. The association tables in flash need to be evaluated only once for the range, resulting in reduced latency for consecutive read access of virtual memory within the range.

6. The invention extends to the mechanism for safety against power off during erase procedure by the use of tables located on other sectors than the sector that is being erased. And all of the sectors used can be safely erased by the same mechanism. And the erase procedure can be interrupted an unlimited number of times without preventing the mechanism from being able to be continued. And the mechanism tolerates a limited number of bits per table entry to be corrupted. That is, there is no need for additional non-volatile memory, nor is there a risk of loosing or corrupting virtual data by a power off nor can the mechanism be dead-locked by any number of interruptions by power off nor is the functionality of the mechanism negatively affected by few corrupted bits.

7. The invention extends to the combination of mechanism of point 6 above with methods for writing data within one sector in a safe way that is based on flags located on the same sector and a special execution sequence and the combination with error detecting/correcting codes. The combination results in a memory emulation that is safe against power off, and grants write access where the sum of written and rewritten data is greater than the sum of available memory, and all data including administrative data and redundancy data is protected against a limit number of corrupted bits per data word.

8. The invention extends to the integration of a data manipulation mirror into the flash hardware interface that reduces the number of CPU instructions needed to evaluate each table entry.

The "age" of a particular sector is equivalent to the number of times other sectors have been erased since the particular sector has been erased. The acronym "EEPROM" refers to electronically erasable programmable ROM. The acronym "ECC" refers to error correcting code, or error correction code. The acronym "ROM" refers to read only memory. The term "flash" (memory) refers to a particular kind of EEPROM that restricts erasing to relatively large sectors. A "sector" refers to the smallest logical group of flash memory pages that can be individually erased. The phrase "erased state" refers to the state or value of memory after it was erased. The phrase "written state" refers to the inverted state of erased state. A "watchdog" may be considered to be hardware that has to be triggered periodically to prevent a reset. "Power off" in the context of this disclosure may be a disconnection from a power source, such as a voltage source. A "flash write" refers to changing the state of a flash memory page to a given value by changing some of the bits from an erased to written state and leaving the other bits in an erased state. A "flash erase" refers to changing the state of a memory sector to an erased value by changing all of the bits to an erased state. "Virtual memory" refers to logical non-volatile memory; the emulation of virtual memory is a focus in this disclosure. A "virtual address" may be considered to be a reference to a page in the virtual memory. The term "valid" is a predicate that attributes data or pages as being part of the virtual memory. The term "invalid" is a predicate that attributes data or pages as being excluded from the virtual memory, i.e. invalid data either never existed or was removed from the virtual memory. "Legal" is a predicate that attributes data as relevant for the virtual memory, i.e. valid data or invalidated data that cannot be removed for some reason (as discussed above). "Over erasing" refers to erasing a memory cell in a way that it cannot be written anymore. This can happen when erasing is performed for too long a time or at too high a voltage.

In any of the above aspects, the various features may be implemented in hardware, or as software modules running on one or more processors. Features of one aspect may be applied to any of the other aspects.

The invention also provides a computer program or a computer program product for carrying out any of the methods described herein, and a computer readable medium having stored thereon a program for carrying out any of the methods described herein.

A computer program embodying the invention may be stored on a computer-readable medium, or it could, for example, be in the form of a signal such as a downloadable data signal provided from an Internet website, or it could be in any other form.

The present disclosure is considered to extend to the following statements:

A1. Electronic apparatus, comprising:
non-volatile memory configured to be written to or read from in memory portions which are erased a sector at a time, each said sector comprising a plurality of said portions, and the memory having at least three said sectors each of which is adapted to be erased independently of the others; and control means operable to control erasing of the sectors, wherein:

the control means is configured to store in a plurality of the sectors other than a target said sector erasure information concerning an erasure procedure, the erasure procedure involving erasing the target sector, so that such information in the sectors may be inspected (is inspectable) to establish a suitable recovery procedure following an interruption event (occurring during the erasure procedure).

A2. Electronic apparatus according to statement A1, wherein the memory is flash memory.

A3. Electronic apparatus according to statement A1 or A2, wherein said plurality of sectors constitutes a majority of the sectors.

A4. Electronic apparatus according to any of the preceding statements, wherein the plurality of sectors constitutes all of the sectors other than the target sector.

A5. Electronic apparatus according to any of the preceding statements, wherein the memory has at least four said sectors.

A6. Electronic apparatus according to any of the preceding statements, wherein the control means is operable, for said erasure procedure, to store the erasure information in all of the sectors.

A7. Electronic apparatus according to any of the preceding statements, wherein the control means is operable, for said erasure procedure, to store the erasure information to the sectors concerned in a given order.

A8. Electronic apparatus according to statement A7, wherein the control means is configured to store the erasure information to the sectors concerned in the same order for each erasure procedure.

A9. Electronic apparatus according to any of the preceding statements, wherein the control means is operable, for said erasure procedure, to store the same erasure information in the sectors concerned.

A10. Electronic apparatus according to any of the preceding statements, wherein the erasure information identifies the target sector.

A11. Electronic apparatus according to any of the preceding statements, wherein the erasure information indicates a status of the erasure procedure.

A12. Electronic apparatus according to any of the preceding statements, wherein the control means is operable to store such erasure information before carrying out said erasing, that erasure information indicating that the erasing is yet to be carried out.

A13. Electronic apparatus according to any of the preceding statements, wherein the control means is operable to store such erasure information after carrying out said erasing, that erasure information indicating that the erasing has been carried out.

A14. Electronic apparatus according to statement A12, wherein the control means is operable, following the erasing, to update the erasure information stored in sectors other than the target sector before carrying out said erasing to indicate that the erasing has been carried out.

A15. Electronic apparatus according to any of the preceding statements, wherein the control means is configured, in storing such erasure information before carrying out said erasing, to identify the target sector through storage of an n-bit targeting pattern of information in a specific area of each of the sectors concerned, those areas being associated with the target sector.

A16. Electronic apparatus according to any of the preceding statements, wherein the control means is configured, in storing such erasure information before carrying out said erasing, to identify a particular sector as being a sector other than the target sector through storage of an n-bit non-targeting pattern of information in a specific area of each of the sectors concerned, those areas being associated with the particular sector.

A17. Electronic apparatus according to any of the preceding statements, wherein the control means is configured, in storing such erasure information before carrying out said erasing, to indicate that the target sector has not yet been erased through storage of an n-bit unfinished pattern of information in a specific area of each of the sectors concerned, those areas being for indicating whether or not the erasing has been carried out.

A18. Electronic apparatus according to any of the preceding statements, wherein the control means is configured, in storing such erasure information after carrying out said erasing, to indicate that the target sector has been erased through storage of an n-bit finished pattern of information in a specific area of each of the sectors concerned, those areas being for indicating whether or not the erasing has been carried out.

A19. Electronic apparatus according to any of statements A15 to A18, wherein n is equal to 1.

A20. Electronic apparatus according to any of statements A15 to A18, wherein n is greater than 1, and optionally greater than or equal to 2m+1, where m is a positive integer (natural number), and wherein the control means is configured to treat a said n-bit pattern read from the memory as being a targeting pattern if a majority of the bits concerned match the targeting pattern, or as being a non-targeting pattern if a majority of those bits match the non-targeting pattern, or as being an unfinished pattern if a majority of those bits match the unfinished pattern, or as being a finished pattern if a majority of those bits match the finished pattern.

A21. Electronic apparatus according to statement A20, wherein n has the same value for each said pattern.

A22. Electronic apparatus according to any of the preceding statements, wherein said storing comprises writing to the memory.

A23. Electronic apparatus according to any of the preceding statements, wherein the control means is operable to cause the target sector to be completely erased during said erasure procedure.

A24. Electronic apparatus according to any of the preceding statements, wherein the erasing comprises writing all of the bits of the target sector to a written state before erasing them (the all of the bits) to an erased state.

A25. Electronic apparatus according to any of the preceding statements, wherein the erasure procedure comprises targeting a sector for erasure, storing such erasure information identifying the target sector, erasing the target sector, and (then) storing in sectors other than the target sector such erasure information indicating that the erasing has been carried out.

A26. Electronic apparatus according to any of the preceding statements, wherein the control means is operable before the erasure procedure to copy any needed information from the target sector to another said sector.

A27. Electronic apparatus according to any of the preceding statements, wherein the control means is operable to access the erasure information stored in the sectors following a said interruption event, and to establish a suitable recovery procedure following the interruption event in dependence upon that accessed information.

A28. Electronic apparatus according to statement A27, wherein the control means is configured to abort the erasure procedure following a said interruption event if the accessed information indicates that two or more of the sectors are the target sector.

A29. Electronic apparatus according to statement A27 or A28, wherein the control means is operable, in dependence upon the access, to determine that no recovery procedure is required when none of the sectors stores erasure information identifying a particular sector as the target sector for erasing (Groups A, E).

A30. Electronic apparatus according to any of statements A27 to A29, wherein the control means is operable, in dependence upon the access, to determine that part or all of the erasure procedure is to be repeated as the recovery procedure when the accessed erasure information of at least one of the sectors identifies a particular sector as the target sector for erasing and at least two of the sectors do not store erasure information identifying a particular sector as the target sector for erasing (Groups B, D).

A31. Electronic apparatus according to statement A30, wherein the control means is operable to determine that at least the erasing of the erasure procedure is to be repeated as the recovery procedure when an access of the target sector reveals that it is not in a fully erased state. (Group B).

A32. Electronic apparatus according to statement A30 or A31, wherein the control means is operable to determine that the erasure information stored in the sectors is to be updated as the recovery procedure to indicate that the erasing has been carried out when an access of the target sector reveals that it is in a fully erased state. (Group D).

A33. Electronic apparatus according to any of statements A27 to A32, wherein the control means is operable, in dependence upon the access, to determine that at least the erasing of the erasure procedure is to be repeated as the recovery procedure when the accessed erasure information of at least said plurality of the sectors other than the target sector identifies a particular sector as the target sector for erasing (Group C).

A34. Electronic apparatus according to any of the preceding statements, wherein the control means is operable, when writing desired data to one of the sectors as part of a write procedure, to mark that sector to indicate that the write procedure has begun, to write the desired data to that sector, and then to mark that sector to indicate that the write procedure has been finished.

A35. Electronic apparatus according to any of the preceding statements, being a microcontroller.

A36. An automobile comprising electronic apparatus according to any of the preceding statements, the apparatus being configured to control a system of the automobile.

A37. A method of controlling electronic apparatus, the apparatus comprising non-volatile memory configured to be written to or read from in memory portions which are erased a sector at a time, each said sector comprising a plurality of said portions, and the memory having at least three said sectors each of which is adapted to be erased independently of the others, the method comprising:
 storing in a plurality of the sectors other than a target said sector erasure information concerning an erasure procedure, the erasure procedure involving erasing the target sector, so that such information in the sectors may be (are) inspected to establish a suitable recovery procedure following an interruption event.

A38. A program which when executed on a processor of electronic apparatus controls the apparatus according to a control method, the apparatus comprising non-volatile memory configured to be written to or read from in memory portions which are erased a sector at a time, each said sector comprising a plurality of said portions, and the memory having at least three said sectors each of which is adapted to be erased independently of the others, the method comprising:
 storing in a plurality of the sectors other than a target said sector erasure information concerning an erasure procedure, the erasure procedure involving erasing the target sector, so that such information in the sectors may be inspected to establish a suitable recovery procedure following an interruption event.

B1. Electronic apparatus, comprising:
 memory configured to be written to or read from in memory portions which are erased a sector at a time, the or each said sector comprising a plurality of said portions, each said sector having a plurality of page slots made up of one or more of said portions, and each page slot being for storing a page of data; and
 control means operable to monitor the or each said sector and to store, on the fly in dependence upon such monitoring, the next page of data for storage to the next available page slot.

B2. Electronic apparatus according to statement B1, wherein the memory is non-volatile memory.

B3. Electronic apparatus according to statement B2, wherein the memory is flash memory.

B4. Electronic apparatus according to any of statements B1 to B3, wherein the memory is arranged to have a plurality of said sectors.

B5. Electronic apparatus according to any of statements B1 to B4, wherein the control means is operable to monitor the statuses of data pages stored in the page slots.

B6. Electronic apparatus according to statement B5, wherein the statuses comprise whether the data pages stored in the page slots are valid or invalid.

B7. Electronic apparatus according to statement B5 or B6, wherein the memory comprises a plurality of said sectors, and wherein the control means is operable to monitor the ages of the sectors, the age of a particular said sector being equal to the number of times the other or other said sectors have been erased since the particular said sector was last erased.

B8. Electronic apparatus according to statement B7, wherein the control means is operable to store an identification table in each of said sectors, each said identification table including an erasure-information entry per erasure procedure erasing another said sector, and wherein the control means is operable to determine the ages of the sectors based upon the number of entries in their respective identification tables.

B9. Electronic apparatus according to statement B7 or B8, wherein the control means is operable on the fly to write data pages to the sectors and to target a sector for an erasure procedure when one or more given conditions are met.

B10. Electronic apparatus according to statement B9 when read as appended to statement B8, wherein one said given condition for targeting a particular sector is that its identification table has a shortage of free entries.

B11. Electronic apparatus according to statement B10, wherein the identification table of a particular sector has a shortage of free entries when the number of free entries is less than or equal to the number of other said sectors that are older than the particular sector.

B12. Electronic apparatus according to any of statements B9 to B11, wherein one said given condition for targeting a particular sector is that the memory has a shortage of free page slots and the particular sector has less than a given number of needed data pages stored therein.

B13. Electronic apparatus according to any of statements B9 to B12, wherein one said given condition for targeting a particular sector is that the memory has a shortage of free page slots and the particular sector has the least number of needed data pages stored therein.

B14. Electronic apparatus according to any of statements B9 to B13, wherein the control means is operable, if more than one said sector meets a said given condition, to target the oldest one of those sectors for an erasure procedure.

B15. Electronic apparatus according to any of statements B9 to B14, wherein the control means is operable before each said erasure procedure to copy any needed data pages from the target sector concerned to another said sector.

B16. Electronic apparatus according to any of statements B1 to B15 when read as appended to statement B7, wherein the control means is operable to store new data pages to the oldest said sector which has sufficient free capacity.

B17. Electronic apparatus according to any of statements B1 to B16, wherein, for the or each said sector, the control means is operable to cause successive data pages for storage in the sector concerned to be stored in its page slots in a given order.

B18. Electronic apparatus according to any of statements B1 to B17, wherein the control means is operable to store a data structure (e.g. a look-up table) outside of said memory detailing data pages stored in the or each sector, and to employ the data structure when determining to which page slot the next page of data for storage is to be stored.

B19. Electronic apparatus according to any of statements B1 to B18, wherein the control means is operable to store an association table in the or each said sector, the or each said association table detailing pages stored in its sector.

B20. Electronic apparatus according to statement B19, wherein the control means is operable to employ the association table or tables when determining to which page slot the next page of data for storage is to be stored.

B21. Electronic apparatus according to statement B19 or B20, wherein the or each said association table details which pages of data are stored in which page slots of its sector.

B22. Electronic apparatus according to any of statements B19 to B21, wherein the control means is operable to update the association table concerned as new data pages are stored.

B23. Electronic apparatus according to any of statements B19 to B22, wherein the or each association table comprises an entry per occupied page slot, the or each entry corresponding to a particular page slot and identifying the data page stored in that page slot.

B24. Electronic apparatus according to statements B23, wherein the control means is operable to add a new entry for each newly-stored data page to the association table concerned to form a list of entries or to extend an existing list of entries.

B25. Electronic apparatus according to any of statements B19 to B24, comprising a hardware unit operable to evaluate the or each said association table and to indicate, for one or more said page slots, at least one of:
  (a) whether or not the page slot is free;
  (b) whether the page slot has been completely written with a corresponding page of data;
  (c) whether the page slot contains an invalid page of data and should be ignored;
  (d) an identification code for the page of data stored in the page slot;
  (e) whether the identification code for the page of data stored in the page slot is within a given range of page identification codes; and
  (f) whether the page slot contains a valid page of data.

B26. Electronic apparatus according to any of statements B1 to B25, wherein the control means is operable to take into account the number of needed pages stored in the or each sector when determining to which page slot the next page of data for storage is to be stored.

B27. Electronic apparatus according to any of statements B1 to B26, being a microcontroller.

B28. An automobile comprising electronic apparatus according to any of statements B1 to B27, the apparatus being configured to control a system of the automobile.

B29. A method of controlling electronic apparatus, the electronic apparatus comprising memory configured to be written to or read from in memory portions which are erased a sector at a time, the or each said sector comprising a plurality of said portions, each said sector having a plurality of page slots made up of one or more of said portions, and each page slot being for storing a page of data, the method comprising:
  monitoring the or each said sector; and
  storing, on the fly in dependence upon such monitoring, the next page of data for storage to the next available page slot.

B30. A program which when executed on a processor of electronic apparatus controls the apparatus according to a control method, the electronic apparatus comprising memory configured to be written to or read from in memory portions which are erased a sector at a time, the or each said sector comprising a plurality of said portions, each said sector having a plurality of page slots made up of one or more of said portions, and each page slot being for storing a page of data, the method comprising:
  monitoring the or each said sector; and
  storing, on the fly in dependence upon such monitoring, the next page of data for storage to the next available page slot.

C1. Electronic apparatus, comprising:
  first memory;
  second memory being non-volatile memory configured to be written to or read from in memory portions which are erased a sector at a time, the or each said sector comprising a plurality of said portions and being for storing a plurality of pages of data each being identified by a corresponding page-identification code; and
  control means operable to store a data structure (e.g. a look-up table) in the first memory including information of (detailing) data pages stored in the or each sector, the data structure being organised based on a property of the data pages.

C2. Electronic apparatus according to statement C1, wherein the pages of data are each identified by a corresponding page-identification code, and wherein the data structure is organised by page-identification code.

C3. Electronic apparatus according to statement C1 or C2, wherein the first memory is random-access memory.

C4. Electronic apparatus according to any of statements C1 to C3, wherein the first memory is volatile memory.

C5. Electronic apparatus according to any of statements C1 to C4, wherein the second memory is flash memory.

C6. Electronic apparatus according to any of statements C1 to C5, wherein the second memory is arranged to have a plurality of said sectors.

C7. Electronic apparatus according to any of statements C1 to C6, wherein the data structure includes information of the locations of the data pages stored in the or each sector.

C8. Electronic apparatus according to any of statements C1 to C7, wherein the data structure includes information of the statuses of data pages stored in the or each sector.

C9. Electronic apparatus according to any of statements C1 to C8, wherein entries in the data structure corresponding to said data pages are ordered by page-identification code.

C10. Electronic apparatus according to any of statements C1 to C9, wherein the control means is operable to store successive data pages for storage in page slots of the sector or sectors in a given order so that the order in which pages are arranged in the sector or sectors is dependent on (corresponds to, follows, depends only on) the order in which those pages were stored.

C11. Electronic apparatus according to any of statements C1 to C10, wherein the control means is operable to store said data structure in respect of pages having page-identification codes within a predefined range, that range being smaller than a range covering all possible data pages.

C12. Electronic apparatus according to any of statements C1 to C11, wherein the control means is operable to control accesses to the or each sector based on the data structure.

C13. Electronic apparatus according to any of statements C1 to C12, wherein the control means is operable to generate the data structure during an initialization phase and, following the initialization phase, to update the contents of the data structure on the fly to mirror changes in the or each sector.

C14. Electronic apparatus according to statement C13, wherein the control means is operable to store an association table in the or each said sector, the or each said association table detailing pages stored in its sector, and wherein the control means is operable to employ the or each association table to generate contents of the data structure during the initialization phase.

C15. Electronic apparatus according to statement C14, wherein the control means is operable to update the contents of the or each association table on the fly to mirror changes in the or each corresponding sector.

C16. Electronic apparatus according to statement C14 or C15, wherein the control means is operable, following an interruption event, to employ the or each association table in a further initialization phase to store a new data structure.

C17. Electronic apparatus according to any of statements C14 to C16, comprising a hardware unit operable to evaluate the or each said association table and to indicate, for one or more said page slots, at least one of:
(a) whether or not the page slot is free;
(b) whether the page slot has been completely written with a corresponding page of data;
(c) whether the page slot contains an invalid page of data and should be ignored;
(d) an identification code for the page of data stored in the page slot;
(e) whether the identification code for the page of data stored in the page slot is within a given range of page identification codes; and
(f) whether the page slot contains a valid page of data.

C18. Electronic apparatus according to any of statements C1 to C17, wherein the or each said sector has a plurality of page slots, each page slot being for storing a said page of data.

C19. Electronic apparatus according to any of statements C1 to C18, wherein the data structure is a look-up table.

C20. Electronic apparatus according to any of statements C1 to C19 when read as appended to statement C2, wherein the page-identification codes are page-identification numbers.

C21. Electronic apparatus according to any of statements C1 to C20, being a microcontroller.

C22. An automobile comprising electronic apparatus according to any of statements C1 to C21, the apparatus being configured to control a system of the automobile.

C23. A method of controlling electronic apparatus, the electronic apparatus comprising first memory, and comprising second memory being non-volatile memory configured to be written to or read from in memory portions which are erased a sector at a time, the or each said sector comprising a plurality of said portions and being for storing a plurality of pages of data, the method comprising:
storing a data structure in the first memory including information of data pages stored in the or each sector, the data structure being organised based on a property of the data pages.

C24. A program which when executed on a processor of electronic apparatus controls the apparatus according to a control method, the electronic apparatus comprising first memory, and comprising second memory being non-volatile memory configured to be written to or read from in memory portions which are erased a sector at a time, the or each said sector comprising a plurality of said portions and being for storing a plurality of pages of data, the method comprising:
storing a data structure in the first memory including information of data pages stored in the or each sector, the data structure being organised based on a property of the data pages.

The present disclosure is also considered to extend to statements combining statements from any of the above groups (A, B, C) with statements from one or more of the other groups (A, B, C), for example as in statement D1 below.

D1. Electronic apparatus, comprising:
non-volatile memory configured to be written to or read from in memory portions which are erased a sector at a time, each said sector comprising a plurality of said portions, the memory having at least three said sectors each of which is adapted to be erased independently of the others, and each said sector optionally having a plurality of page slots made up of one or more of said portions, each page slot being for storing a page of data;
an optional further memory; and
control means operable to control erasing of the sectors, wherein:
the control means is configured to store in a plurality of the sectors other than a target said sector erasure information concerning an erasure procedure, the erasure procedure involving erasing the target sector, so that such information in the sectors may be inspected to establish a suitable recovery procedure following an interruption event;
the control means is optionally operable to monitor the or each said sector and to store, on the fly in dependence upon such monitoring, the next page of data for storage to the next available page slot; and
the control means is optionally operable to store a data structure (e.g. a look-up table) in the further memory detailing data pages stored in the or each sector, the data structure being organised based on a property of the data pages.

The statements in groups A, B and C above will therefore be understood accordingly.

The invention claimed is:
1. An electronic apparatus, comprising:
non-volatile memory having at least three sectors and being configured to be written to or read from in memory portions that are erased a sector at a time, each sector comprising a plurality of said memory portions and each sector being adapted to be erased independently of other of the at least three sectors; and control means operable to control erasing of the sectors and to store in a plurality of the sectors, other than a target sector, erasure information concerning an erasure procedure involving erasing the target sector, so that the erasure information in the plurality of sectors may be inspected to establish a recovery procedure following an interruption event, wherein the erasure information includes at least one of an identification of the target sector and an indication of a status of the erasure procedure.

2. The electronic apparatus as claimed in claim 1, wherein the plurality of sectors constitutes all of the sectors other than the target sector.

3. The electronic apparatus according to claim 1, wherein the memory has at least four said sectors.

4. The electronic apparatus according to claim 1, wherein the control means is operable, for said erasure procedure, to store the erasure information in all of the plurality of sectors.

5. The electronic apparatus according to claim 1, wherein the control means is operable, for said erasure procedure, to store the erasure information to the plurality of sectors in a given order.

6. The electronic apparatus according to claim 5, wherein the control means is further configured to store the erasure information to the plurality of sectors in a same order for each erasure procedure.

7. The electronic apparatus according to claim 1, wherein the control means is operable to store the erasure information before erasing the target sector, wherein the erasure information indicates the target sector has not been erased.

8. The electronic apparatus as claimed in claim 1, wherein the control means is operable to store the erasure information after erasing the target sector, wherein the erasure information indicates the target sector has been erased.

9. The electronic apparatus according to claim 7, wherein the control means is operable, following the erasing, to update the erasure information stored in the plurality of sectors, other than the target sector, before erasing other sectors to indicate that the target sector has been erased.

10. The electronic apparatus according to claim 1, wherein the control means is configured, in storing the erasure information, to identify the target sector through storage of an n-bit targeting pattern of information in a specific area of each of the sectors concerned, wherein the specific area of each of the sectors concerned is associated with the target sector.

11. The electronic apparatus according to claim 1, wherein the control means is configured, in storing the erasure information, to identify a particular sector as being a sector other than the target sector through storage of an n-bit non-targeting pattern of information in a specific area of each of the sectors concerned, wherein the specific area of each of the sectors concerned is associated with the particular sector.

12. The electronic apparatus according to claim 1, wherein the control means is configured, in storing the erasure information, to indicate that the target sector has not yet been erased through storage of an n-bit unfinished pattern of information in a specific area of each of the sectors concerned, wherein the specific area of each of the sectors concerned indicates whether or not the erasing has been carried out.

13. The electronic apparatus according to claim 1, wherein the control means is configured, in storing the erasure information, to indicate that the target sector has been erased through storage of an n-bit finished pattern of information in a specific area of each of the sectors concerned, wherein the specific area of each of the sectors concerned indicates whether or not the erasing has been carried out.

14. The electronic apparatus according to claim 10, wherein n is greater than 1, and optionally greater than or equal to 2m+1, where m is a positive integer, and wherein the control means is configured to treat a said n-bit pattern read from the memory as being a targeting pattern if a majority of the bits concerned match the targeting pattern, or as being a non-targeting pattern if a majority of those bits match the non-targeting pattern, or as being an unfinished pattern if a majority of those bits match the unfinished pattern, or as being a finished pattern if a majority of those bits match the finished pattern.

15. The electronic apparatus as claimed in claim 1, wherein the erasure procedure comprises targeting a sector of the at least three sectors for erasure, storing the erasure information identifying the target sector, erasing the target sector, and storing in the plurality of sectors, other than the target sector, the erasure information indicating that the target sector has been erased.

16. The electronic apparatus as claimed in claim 1, wherein the control means is operable before erasing the target sector, to copy required information from the target sector to another said sector of the plurality of sectors.

17. The electronic apparatus as claimed in claim 1, wherein the control means is operable to access the erasure information stored in the plurality of sectors following the interruption event, and to establish the recovery procedure following the interruption event in dependence upon that accessed erasure information.

18. The electronic apparatus according to claim 17, wherein the control means is configured to abort the erasure procedure following the interruption event if the accessed erasure information indicates that two or more of the plurality of sectors are the target sector.

19. The electronic apparatus as claimed in claim 17, wherein the control means is operable, in dependence upon the access, to determine that no recovery procedure is required when none of the plurality of sectors stores erasure information identifying a particular sector as the target sector for erasing.

20. The electronic apparatus as claimed in claim 17, wherein the control means is operable, in dependence upon the access, to determine that part or all of the erasure procedure is to be repeated as the recovery procedure when the accessed erasure information of at least one of the plurality of sectors identifies a particular sector as the target sector for erasing and at least two of the plurality of sectors do not store erasure information identifying a particular sector as the target sector for erasing.

21. The electronic apparatus as claimed in claim 20, wherein the control means is operable to determine that at least the erasing of the erasure procedure is to be repeated as the recovery procedure when an access of the target sector reveals that the target sector is not in a fully erased state.

22. The electronic apparatus as claimed in claim 20, wherein the control means is operable to determine that the erasure information stored in the plurality of sectors is to be updated as the recovery procedure to indicate that the target sector has been erased when an access of the target sector reveals that it is in a fully erased state.

23. The electronic apparatus as claimed in claim 17, wherein the control means is operable, in dependence upon the access, to determine that at least the erasing of the erasure procedure is to be repeated as the recovery procedure when the accessed erasure information of at least said plurality of the sectors other than the target sector identifies a particular sector as the target sector for erasing.

24. A method of controlling an electronic apparatus, the apparatus comprising non-volatile memory having at least three sectors and being configured to be written to or read from in memory portions that are erased a sector at a time, each sector comprising a plurality of said memory portions and each sector being adapted to be erased independently of other of the at least three sectors, the method comprising:
storing in a plurality of the sectors, other than a target sector, erasure information concerning an erasure procedure involving erasing the target sector, so that the erasure information in the plurality of sectors may be inspected to establish a recovery procedure following an interruption event,
wherein the erasure information includes at least one of an identification of the target sector and an indication of a status of the erasure procedure.

25. A program that, when executed on a processor of an electronic apparatus, controls the apparatus according to a control method, the apparatus comprising non-volatile memory having at least three sectors and being configured to be written to or read from in memory portions that are erased a sector at a time, each sector comprising a plurality of said memory portions and each sector being adapted to be erased independently of other of the at least three sectors, the control method comprising:
storing in a plurality of the sectors, other than a target sector, erasure information concerning an erasure procedure involving erasing the target sector, so that the erasure information in the plurality of sectors may be inspected to establish a recovery procedure following an interruption event,
wherein the erasure information includes at least one of an identification of the target sector and an indication of a status of the erasure procedure.

26. An electronic apparatus, comprising:
non-volatile memory having a plurality of sectors and being configured to be written to or read from in memory portions that are erased a sector at a time, each said sector comprising a plurality of said memory portions, each said sector having a plurality of page slots comprising one or more of said memory portions, and each page slot being for storing a page of data; and
control means operable to:
monitor each sector and to store, dependent upon such monitoring, a next page of data for storage to a next available page slot so that an order in which pages are arranged in the sector is dependent on an order in which the pages are stored,
store an association table in each sector, each association table detailing pages stored in the respective sector and comprising an entry per occupied page slot, with each entry corresponding to a particular page slot, denoting a state of that page slot and identifying the data page stored in the respective page slot;
add a new entry for each newly-stored data page to the respective association table, as each new data page is stored, to form a list of entries or to extend an existing list of entries; and
when a given page is to be written to a given page slot, (a) denote the given page slot as having an allocated state by writing to a corresponding association-table entry, (b) write the given page to the given page slot, and (c) denote the given page slot as having a valid state by further writing to the corresponding association-table entry.

27. The electronic apparatus according to claim 26, comprising a hardware unit operable to evaluate each association table and to indicate, for at least one page slot, at least one of:
(a) whether or not the at least one page slot is free;
(b) whether the at least one page slot has been completely written with a corresponding page of data;
(c) whether the at least one page slot contains an invalid page of data and should be ignored;
(d) an identification code for the page of data stored in the at least one page slot;
(e) whether the identification code for the page of data stored in the at least one page slot is within a given range of page identification codes; and
(f) whether the at least one page slot contains a valid page of data.

28. A method of controlling an electronic apparatus, the electronic apparatus comprising non-volatile memory having a plurality of sectors and being configured to be written to or read from in memory portions that are erased a sector at a time, each said sector comprising a plurality of said memory portions, each said sector having a plurality of page slots comprising one or more of said memory portions, and each page slot being for storing a page of data, the method comprising:
monitoring each sector;
storing, dependent upon such monitoring, a next page of data for storage to a next available page slot so that an order in which pages are arranged in the sector is dependent on an order in which the pages are stored;
storing an association table in each sector, each association table detailing pages stored in the respective sector and comprising an entry per occupied page slot, with each entry corresponding to a particular page slot, denoting a state of that page slot and identifying the data page stored in the respective page slot;
adding a new entry for each newly-stored data page to the respective association table to form a list of entries or to extend an existing list of entries; and
when a given page is to be written to a given page slot, (a) denoting the given page slot as having an allocated state by writing to a corresponding association-table entry, (b) writing the given page to the given page slot, and (c) denoting the given page slot as having a valid state by further writing to the corresponding association-table entry.

29. A program which when executed on a processor of an electronic apparatus controls the apparatus according to a control method, the electronic apparatus comprising non-volatile memory having a plurality of sectors and being configured to be written to or read from in memory portions that are erased a sector at a time, each said sector comprising a plurality of said memory portions, each said sector having a plurality of page slots comprising one or more of said memory portions, and each page slot being for storing a page of data, the control method comprising:
monitoring each sector;
storing, dependent upon such monitoring, a next page of data for storage to a next available page slot so that an order in which pages are arranged in the sector is dependent on an order in which the pages are stored;
storing an association table in each sector, each association table detailing pages stored in the respective sector and comprising an entry per occupied page slot, with each entry corresponding to a particular page slot, denoting a state of that page slot and identifying the data page stored in the respective page slot;

adding a new entry for each newly-stored data page to the respective association table to form a list of entries or to extend an existing list of entries; and when a given page is to be written to a given page slot, (a) denoting the given page slot as having an allocated state by writing to a corresponding association-table entry, (b) writing the given page to the given page slot, and (c) denoting the given page slot as having a valid state by further writing to the corresponding association-table entry.

\* \* \* \* \*